(12) United States Patent
Gaide et al.

(10) Patent No.: US 7,746,112 B1
(45) Date of Patent: Jun. 29, 2010

(54) OUTPUT STRUCTURE WITH CASCADED CONTROL SIGNALS FOR LOGIC BLOCKS IN INTEGRATED CIRCUITS, AND METHODS OF USING THE SAME

(75) Inventors: Brian C. Gaide, Glassboro, NJ (US); Steven P. Young, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/417,043

(22) Filed: Apr. 2, 2009

(51) Int. Cl.
*H03K 19/177* (2006.01)

(52) U.S. Cl. .......................................... 326/41; 326/38

(58) Field of Classification Search ............... 326/37–41
See application file for complete search history.

(56) References Cited

U.S. PATENT DOCUMENTS

| | | | |
|---|---|---|---|
| 5,126,975 A * | 6/1992 | Handy et al. ........... | 365/189.14 |
| 5,208,491 A | 5/1993 | Ebeling et al. | |
| 5,367,209 A | 11/1994 | Hauck et al. | |
| 6,150,838 A | 11/2000 | Wittig et al. | |
| 6,184,712 B1 | 2/2001 | Wittig et al. | |
| 6,208,163 B1 | 3/2001 | Wittig et al. | |
| 6,486,709 B2 | 11/2002 | Sutherland et al. | |
| 6,522,170 B1 | 2/2003 | Durham et al. | |
| 6,590,424 B2 | 7/2003 | Singh et al. | |
| 6,708,193 B1 | 3/2004 | Zeng | |
| 6,958,627 B2 | 10/2005 | Singh et al. | |
| 7,157,934 B2 | 1/2007 | Teifel et al. | |
| 7,196,543 B1 | 3/2007 | Young et al. | |
| 7,202,698 B1 | 4/2007 | Bauer et al. | |
| 7,274,211 B1 | 9/2007 | Simkins et al. | |
| 7,467,175 B2 | 12/2008 | Simkins et al. | |
| 7,467,177 B2 | 12/2008 | Simkins et al. | |
| 7,472,155 B2 | 12/2008 | Simkins et al. | |
| 7,480,690 B2 | 1/2009 | Simkins et al. | |
| 7,504,851 B2 | 3/2009 | Manohar et al. | |
| 7,505,304 B2 | 3/2009 | Manohar et al. | |
| 2005/0142210 A1 | 6/2005 | Simkins et al. | |
| 2006/0190516 A1 | 8/2006 | Simkins et al. | |
| 2006/0195496 A1 | 8/2006 | Vadi et al. | |

(Continued)

OTHER PUBLICATIONS

U.S. Appl. No. 12/417,007, filed Apr. 2, 2009, Young et al.

(Continued)

*Primary Examiner*—Don P Le
(74) *Attorney, Agent, or Firm*—Lois D. Cartier

(57) ABSTRACT

A cascading output structure for logic blocks in an integrated circuit. An exemplary integrated circuit includes an array of interconnected logic blocks, each including a logic circuit, an output multiplexer, and a select multiplexer. The logic circuit has an input coupled to a logic block input. The output multiplexer has first and second data inputs respectively coupled to first and second outputs of the logic circuit, a select input, and an output coupled to a logic block output. The select multiplexer has a first data input coupled to a cascade select input of the logic block, a second data input, and an output coupled to the select input of the output multiplexer. The output of the select multiplexer is also coupled to a cascade select output of the logic block. The cascade select input of the logic block is coupled to the cascade select output of an adjacent logic block.

20 Claims, 51 Drawing Sheets

U.S. PATENT DOCUMENTS

| | | | |
|---|---|---|---|
| 2006/0206557 | A1 | 9/2006 | Wong et al. |
| 2006/0212499 | A1 | 9/2006 | New et al. |
| 2006/0230092 | A1 | 10/2006 | Ching et al. |
| 2006/0230093 | A1 | 10/2006 | New et al. |
| 2006/0230094 | A1 | 10/2006 | Simkins et al. |
| 2006/0230095 | A1 | 10/2006 | Simkins et al. |
| 2006/0230096 | A1 | 10/2006 | Thendean et al. |
| 2006/0288069 | A1 | 12/2006 | Simkins et al. |
| 2006/0288070 | A1 | 12/2006 | Vadi et al. |
| 2006/0291302 | A1* | 12/2006 | Seto et al. ............... 365/193 |
| 2007/0256038 | A1 | 11/2007 | Manohar |
| 2008/0168407 | A1 | 7/2008 | Manohar |

OTHER PUBLICATIONS

U.S. Appl. No. 12/417,010, filed Apr. 2, 2009, Young.
U.S. Appl. No. 12/417,012, filed Apr. 2, 2009, Young.
U.S. Appl. No. 12/417,013, filed Apr. 2, 2009, Young et al.
U.S. Appl. No. 12/417,015, filed Apr. 2, 2009, Young.
U.S. Appl. No. 12/417,018, filed Apr. 2, 2009, Young et al.
U.S. Appl. No. 12/417,020, filed Apr. 2, 2009, Gaide et al.
U.S. Appl. No. 12/417,023, filed Apr. 2, 2009, Gaide et al.
U.S. Appl. No. 12/417,024, filed Apr. 2, 2009, Gaide et al.
U.S. Appl. No. 12/417,033, filed Apr. 2, 2009, Gaide et al.
U.S. Appl. No. 12/417,036, filed Apr. 2, 2009, Gaide et al.
U.S. Appl. No. 12/417,040, filed Apr. 2, 2009, Gaide et al.
U.S. Appl. No. 12/417,046, filed Apr. 2, 2009, Young et al.
U.S. Appl. No. 12/417,048, filed Apr. 2, 2009, Young et al.
U.S. Appl. No. 12/417,051, filed Apr. 2, 2009, Young et al.
U.S. Appl. No. 12/417,054, filed Apr. 2, 2009, Young et al.
U.S. Appl. No. 12/417,057, filed Apr. 2, 2009, Young et al.
U.S. Appl. No. 12/174,905, filed Jul. 17, 2008, Young.
U.S. Appl. No. 12/174,926, filed Jul. 17, 2008, Young.
U.S. Appl. No. 12/174,945, filed Jul. 17, 2008, Young.
U.S. Appl. No. 12/174,956, filed Jul. 17, 2008, Young.
U.S. Appl. No. 12/174,972, filed Jul. 17, 2008, Young et al.
Achronix Semiconductor Corp., *Introduction to Achronix FPGAs*, WP001 Rev. 1.6, Aug. 7, 2008, pp. 1-7, available from Achronix Semiconductor Corp., San Jose, California, USA.
Achronix Semiconductor Corp., *Speedster FPGA Family*, PB001 v3.5, copyright 2008, pp. 1-2, available from Achronix Semiconductor Corp., San Jose, California, USA.
Asato, Creighton et al., "A Data-Path Multiplier with Automatic Insertion of Pipeline Stages," *IEEE Journal of Solid-State Circuits*, Apr. 1990, pp. 383-387, vol. 25, No. 2.
Borriello, F. et al., "The Triptych FPGA Architecture," *IEEE Transactions on Very Large Scale Integration (VLSI) Systems*, Dec. 1990, pp. 491-501, vol. 3, No. 4.
Callaway, Thomas K., "Optimizing Arithmetic Elements for Signal Processing," *Proc. of the 1992 Workshop on VLSI Signal Processing*, Oct. 28-30, 1992, vol. V, pp. 99-100, Napa Valley, California, USA.
Habibi, I. et al., "Fast Multipliers," *IEEE Transactions on Computers*, Feb. 1970, pp. 153-157, vol. C-19, Issue 2.
Halfhill, Tom, "Ambric's New Parallel Processor," *Microprocessor Report*, Oct. 10, 2006, pp. 1-9, available from In-Stat, 2055 Gateway Place, San Jose, California, USA, or http://www.mpronline.com.
Hauck, Scott et al., "Montage: An FPGA for Synchronous and Asynchronous Circuits," *Field-Programmable Gate Arrays: Architecture and Tools for Rapid Prototyping*, 1999, pp. 44-51, publ. by Springer Verlag, Berlin, Germany.
Hauck, Scott et al., "An FPGA for Implementing Asynchronous Circuits," *IEEE Design and Test of Computers*, Fall 1994, pp. 60-69, vol. 11, No. 3.
Hauck, Scott, "Asynchronous Design Methodologies: An Overview," *Proc. of the IEEE*, Jan. 1995, pp. 69-93, vol. 83, No. 1.
Hauser, John, *The Garp Architecture*, Oct. 1997, pp. 1-56, University of California at Berkeley, USA.
Huang, Randy, *Hardware-Assisted Fast Routing for Runtime Reconfigurable Computing*, Fall 2004, pp. 1-43, dissertation submitted to University of California at Berkeley, USA.
Jain, Surendra K. et al., "Efficient Semisystolic Architectures for Finite-Field Arithmetic," *IEEE Transactions on Very Large Scale Integration (VLSI) Systems*, Mar. 1998, pp. 101-113, vol. 6, No. 1.
Maden, B. et al., "Parallel Architectures for High Speed Multipliers," *Proc. of the 1989 IEEE International Symposium on Circuits and Systems*, May 8-11, 1989, pp. 142-145, Portland, Oregon.
Martin, Alain et al., "The Design of an Asynchronous Microprocessor," *Proc. Decennial Caltech Conference on VLSI*, Mar. 20-22, 1989, pp. 1-23.
Meier, Pascal C. H. et al., "Exploring Multiplier Architecture and Layout for Low Power," *Proc. of the 1996 IEEE Custom Integrated Circuits Conference*, May 5-8, 1996, pp. 513-516.
Muhammad, Khurram et al., "Switching Characteristics of Generalized Array Multiplier Architectures and their Applications to Low Power Design," *Proc. of the 1999 IEEE International Conference on Computer Design*, Oct. 10-13, 1999, pp. 230-235, Austin, Texas, USA.
Panato, Alex et al., "Design of Very Deep Pipelined Multipliers for FPGAs," *Proc. of the Design, Automation and Test in Europe Conference and Exhibition Designers' Forum*, Feb. 16-20, 2004, pp. 52-57, vol. 3, Paris, France.
Payne, R., "Asynchronous FPGA Architecture," *IEE Proc.-Comput. Digit. Tech.*, Sep. 1996, pp. 282-286, vol. 143, No. 5.
Sparso, J., *Asynchronous Circuit Design—A Tutorial*, copyright 2006, pp. 1-179, available from the Technical University of Denmark, Kgs. Lyngby, Denmark.
Teifel, John et al., "Highly Pipelined Asynchronous FPGAs," *Proc. of the 2004 ACM-SIGDA International Symposium on Field Programmable Gate Arrays*, Feb. 22-24, 2004, pp. 133-142, Monterey, California, USA.
Tsu, William et al., "High-Speed, Hierarchical Synchronous Reconfigurable Array," *Proc. of the 1999 ACM/SIGDA $7^{th}$ International Symposium on Field Programmable Gate Arrays*, Feb. 21-23, 1999, pp. 125-134, Monterey, California, USA.
Wikipedia, "C-element," downloaded Jul. 17, 2008 from http://en.wikipedia.org/C-element, pp. 1-2.
Xilinx, Inc., "XtremeDSP Design Considerations," *DSP: Designing for Optimal Results*, Chapter 2, Mar. 2005, Edition 1.0, pp. 5-52 (50 pages total), available from Xilinx, Inc., San Jose, California, USA.
Xilinx, Inc., "DSP48 Slice Math Functions," *DSP: Designing for Optimal Results*, Chapter 3, Mar. 2005, Edition 1.0, pp. 53-62 (12 pages total), available from Xilinx, Inc., San Jose, California, USA.
Xilinx, Inc., "DSP48E Description and Specifics," *Virtex-5 FPGA XtremeDSP Design Considerations*, Chapter 1, UG193 (v3.3), rev. Jan. 12, 2009, first release Apr. 14, 2006, pp. 15-47 (36 pages total), available from Xilinx, Inc., San Jose, California, USA.
Ye, A. et al., "Measuring and utilising the correlation between signal connectivity and signal positioning for FPGAs containing multi-bit building blocks," *IEE Proc.-Comput. Digit. Tech.*, May 2006, pp. 146-156, vol. 153, No. 3.
Ye, Andy et al., "Using Bus-Based Connections to Improve Field-Programmable Gate-Array Density for Implementing Datapath Circuits," *IEEE Transactions on Very Large Scale Integrations (VLSI) Systems*, May 2006, pp. 462-473, vol. 14, No. 5.

* cited by examiner

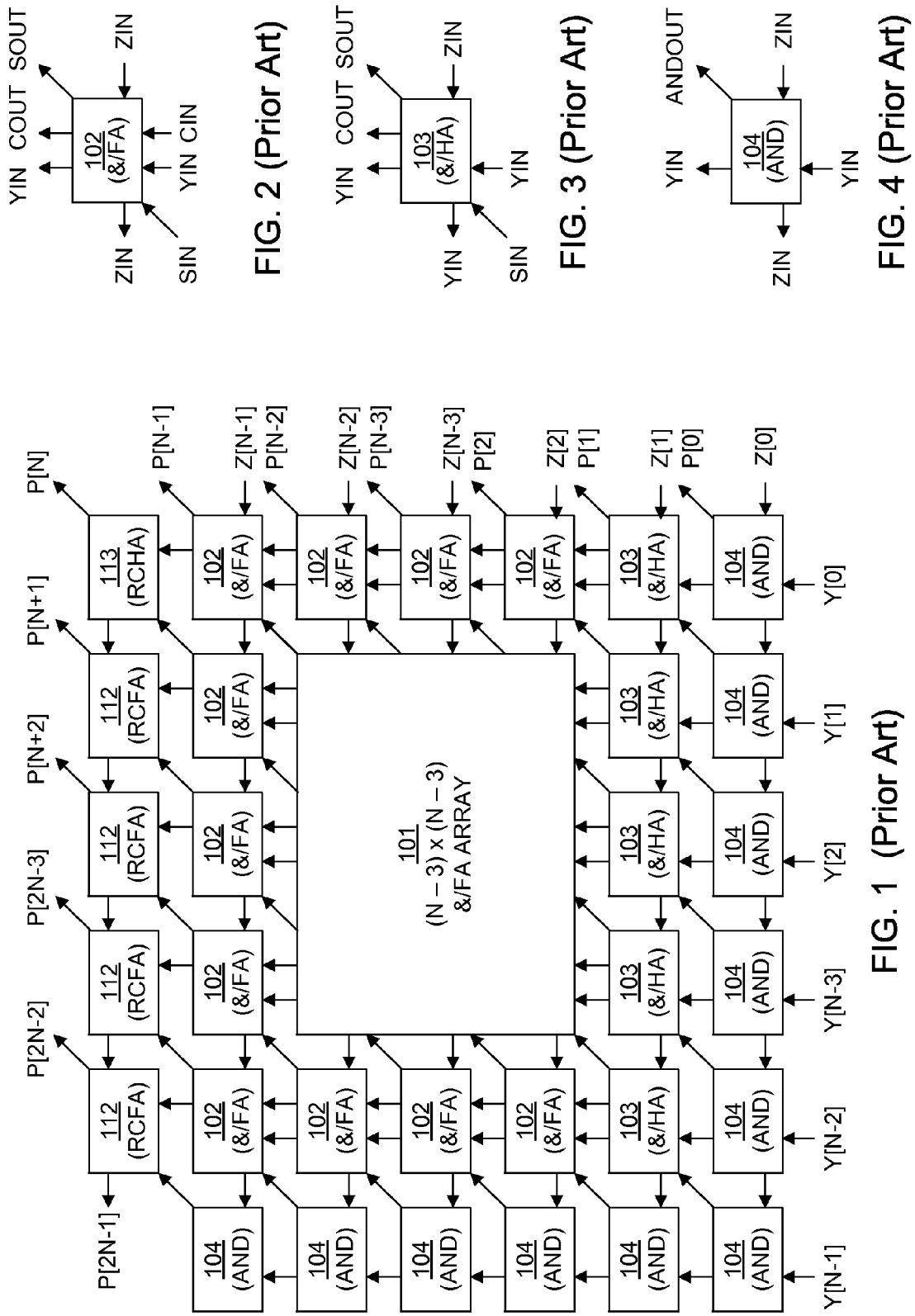

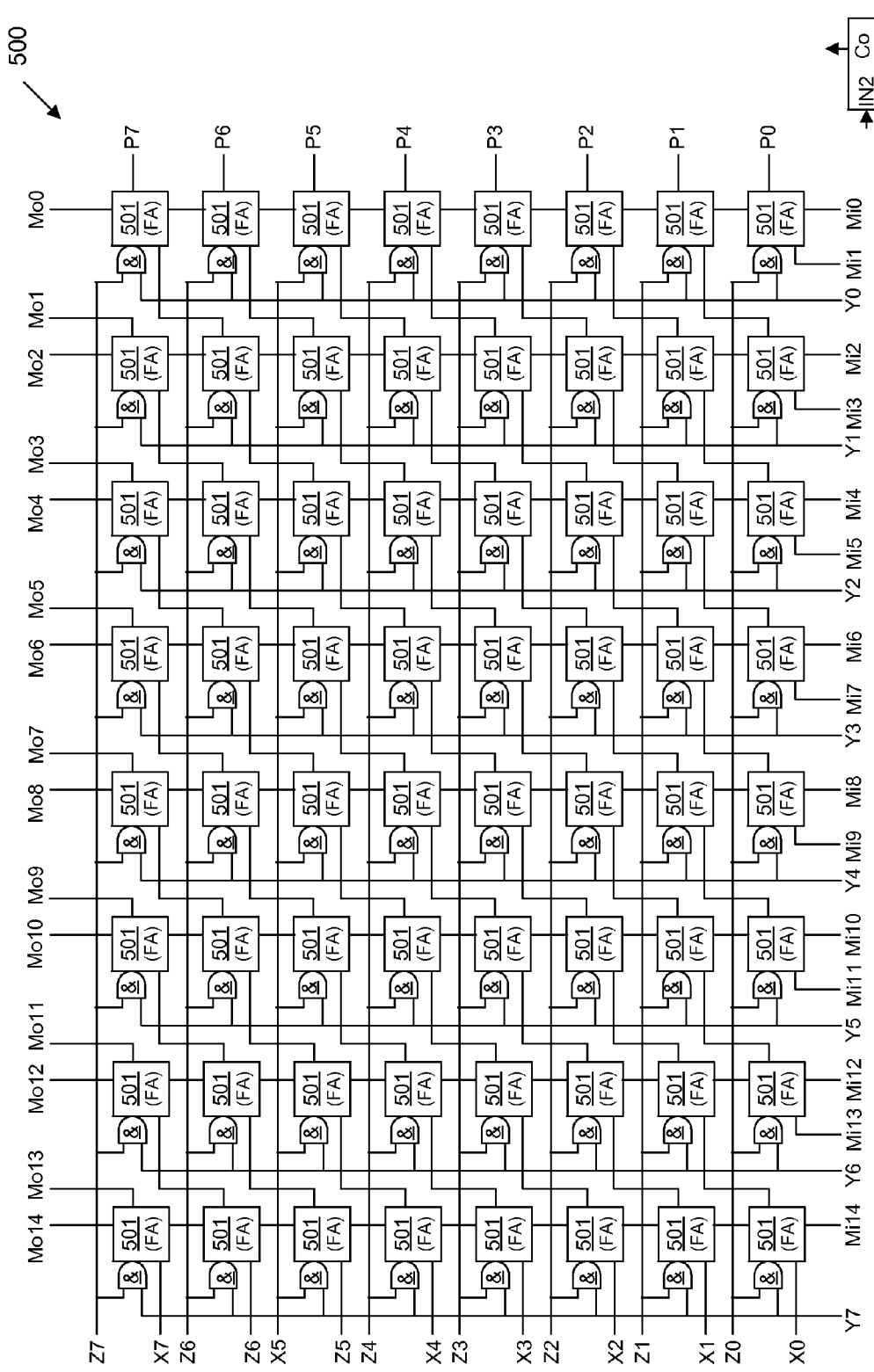
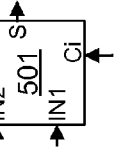
FIG. 5
FIG. 6

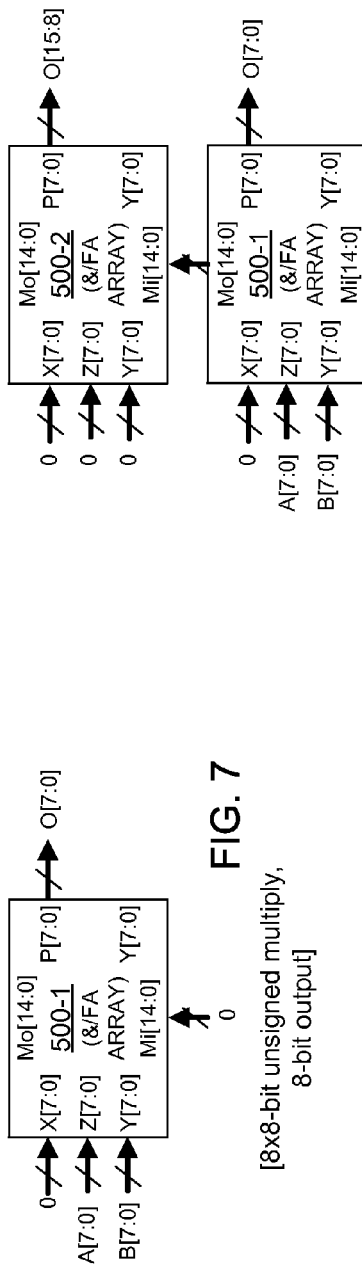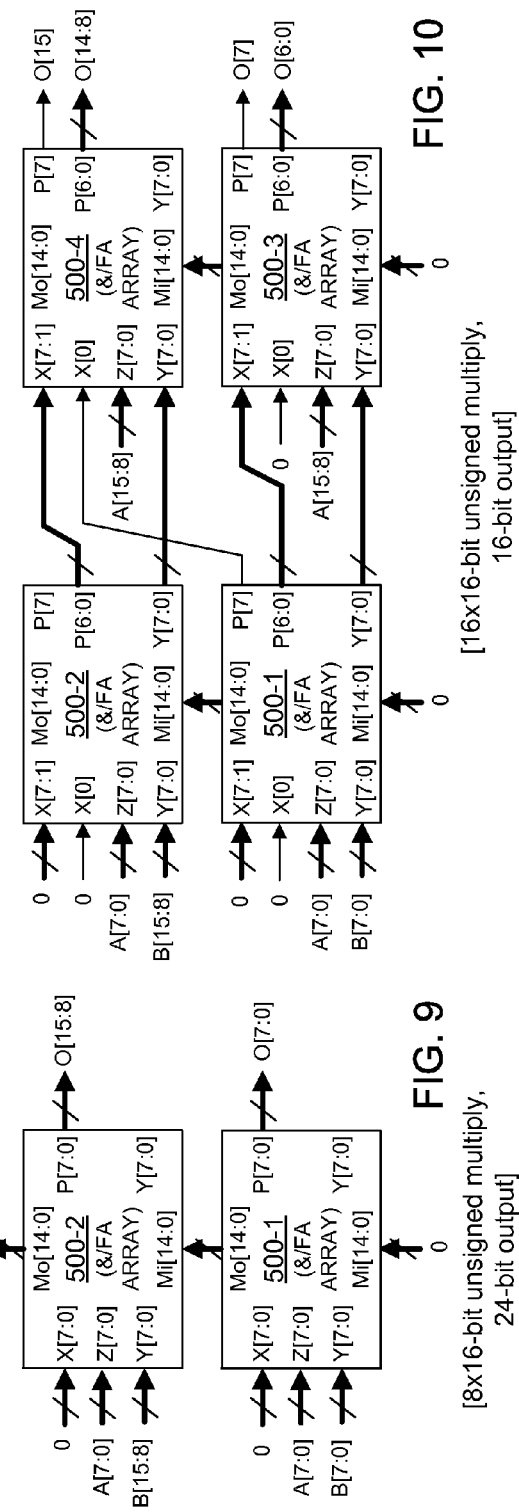

[16x16-bit unsigned multiply, 32-bit output]

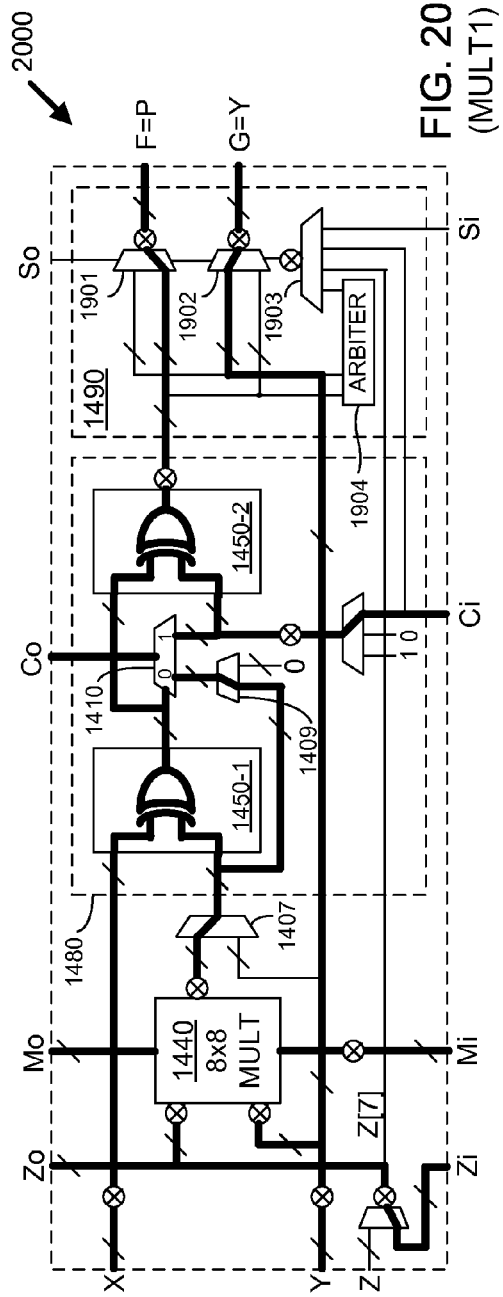
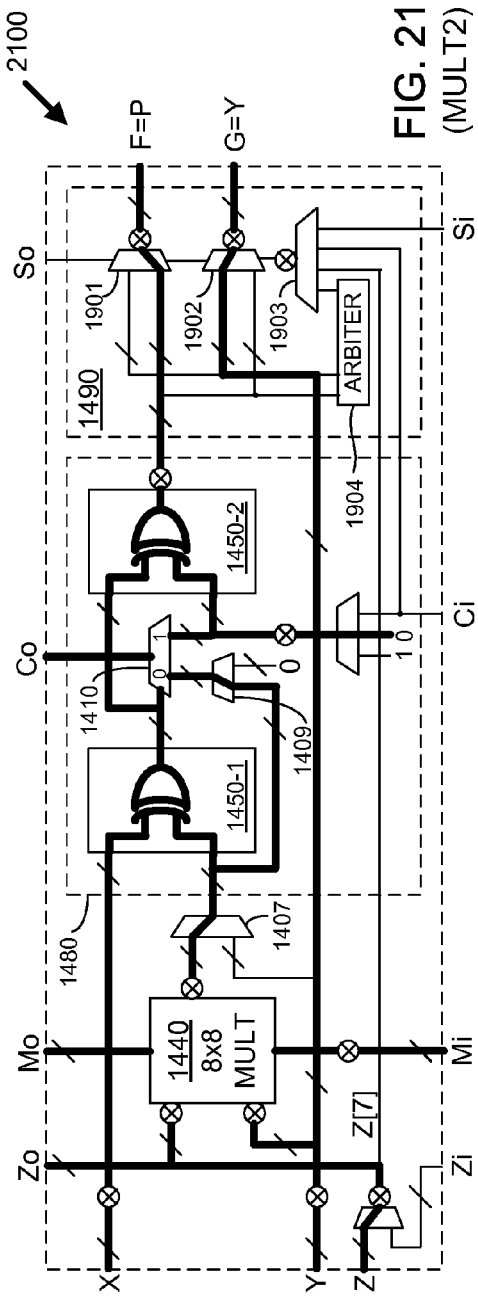
FIG. 20 (MULT1)
FIG. 21 (MULT2)

[16x16-bit unsigned multiply, 16-bit output]

[16x16-bit unsigned multiply, 32-bit output]

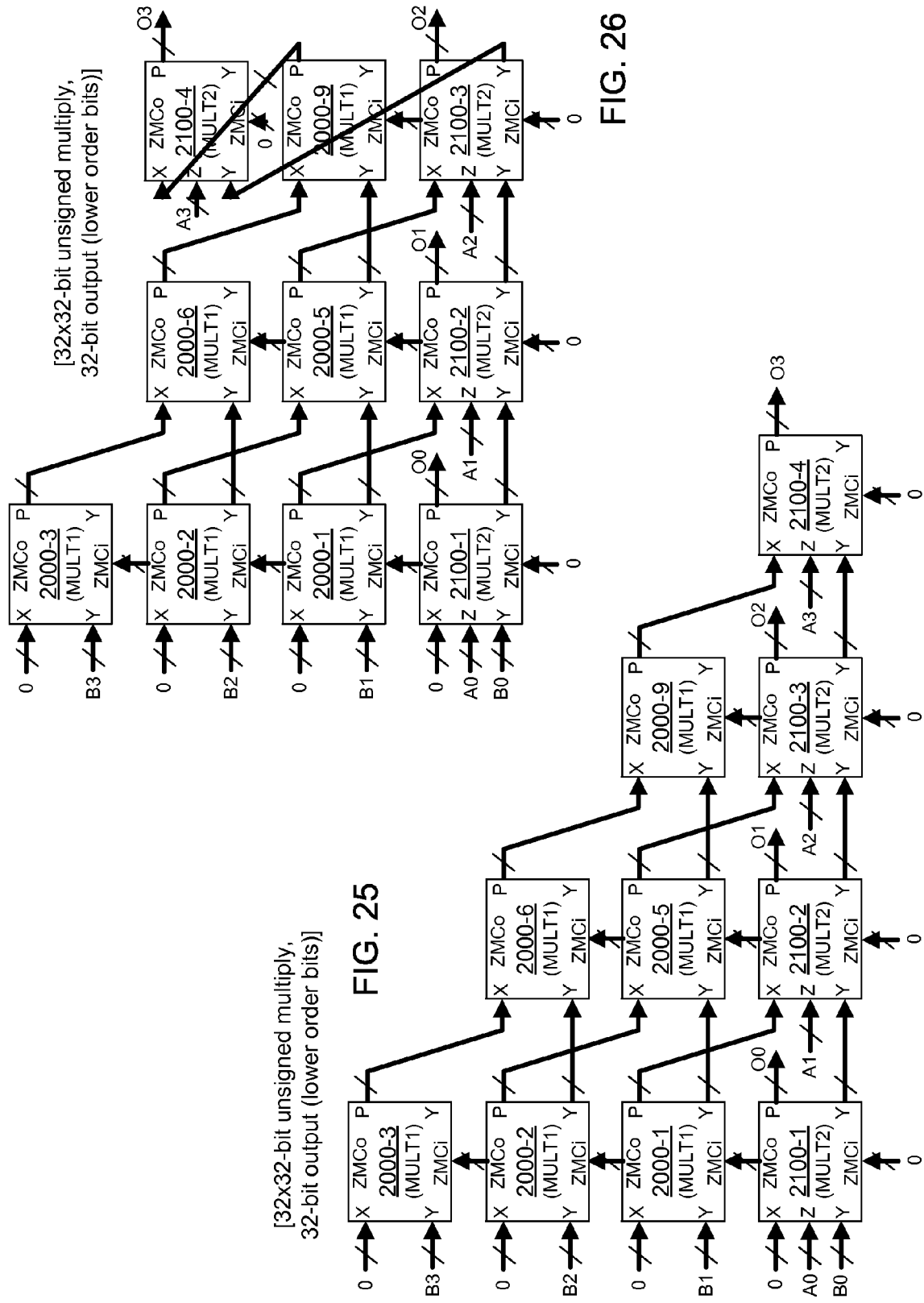

[32x32-bit unsigned multiply,
32-bit output (higher order bits)]

[32x32-bit unsigned multiply, 32-bit output (higher order bits)]

[16x32-bit unsigned multiply, 48-bit output]

[16x16-bit signed multiply, 32-bit output]
[Sign Extension method]

[16x16-bit signed multiply, 32-bit output]
[Combination method]

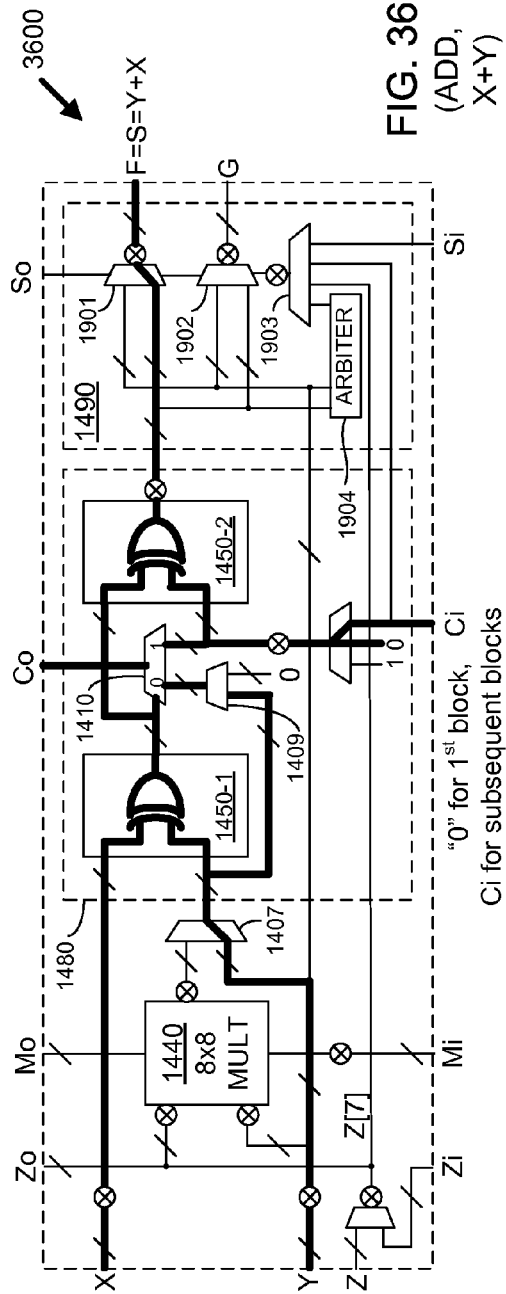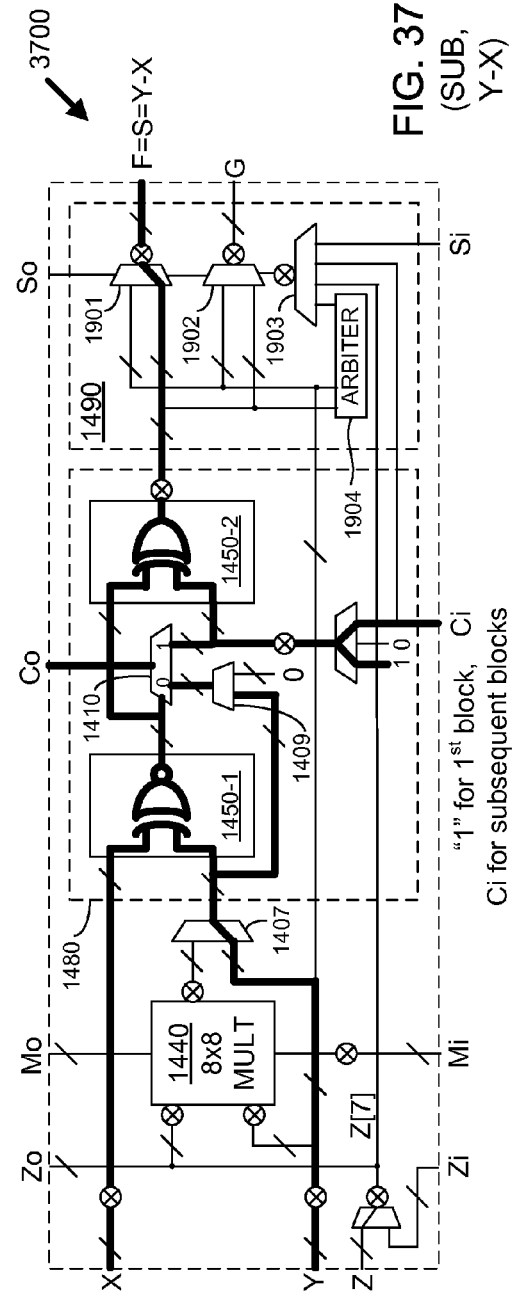

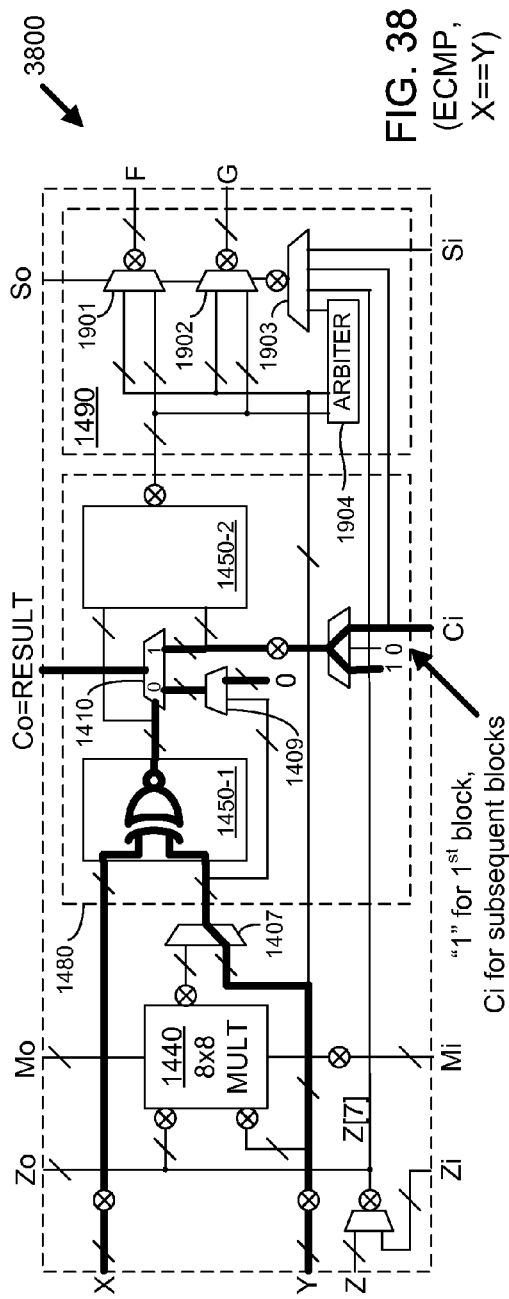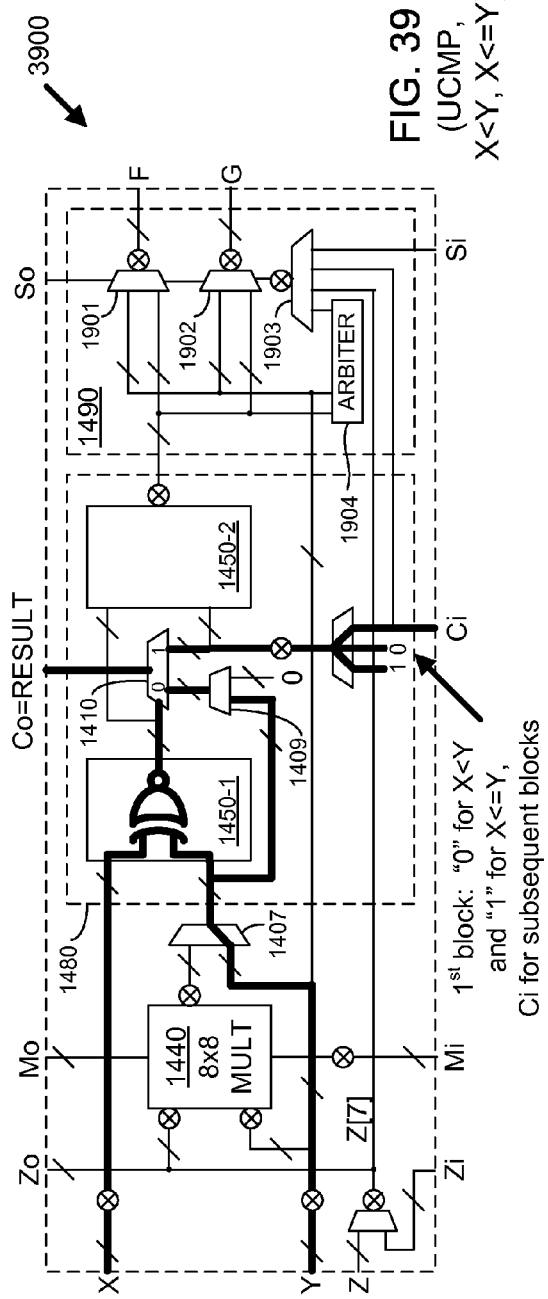
FIG. 38 (ECMP, X==Y)
FIG. 39 (UCMP, X<Y, X<=Y)

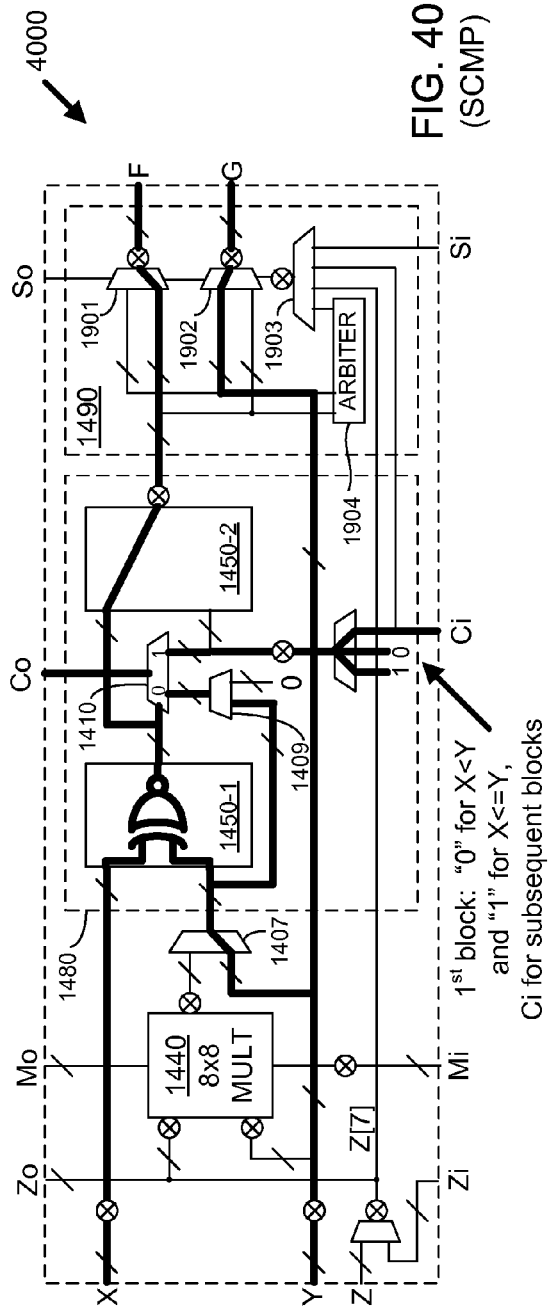
FIG. 40 (SCMP)
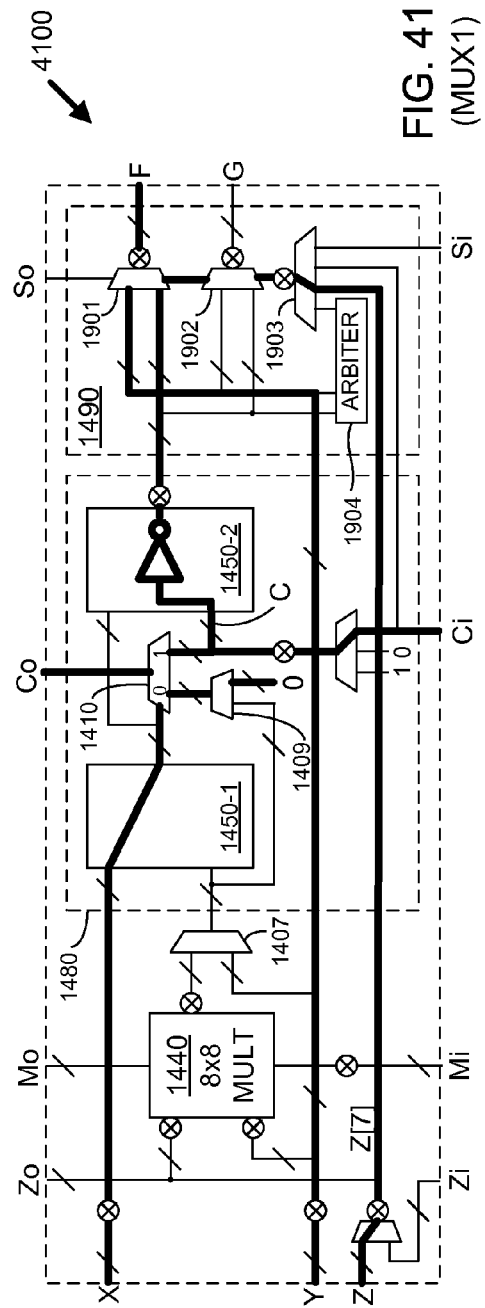
FIG. 41 (MUX1)

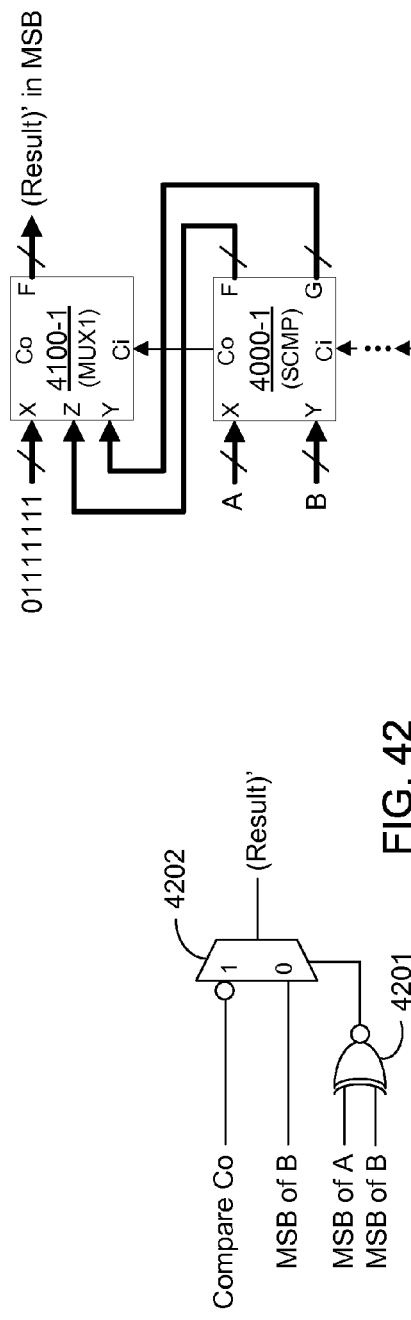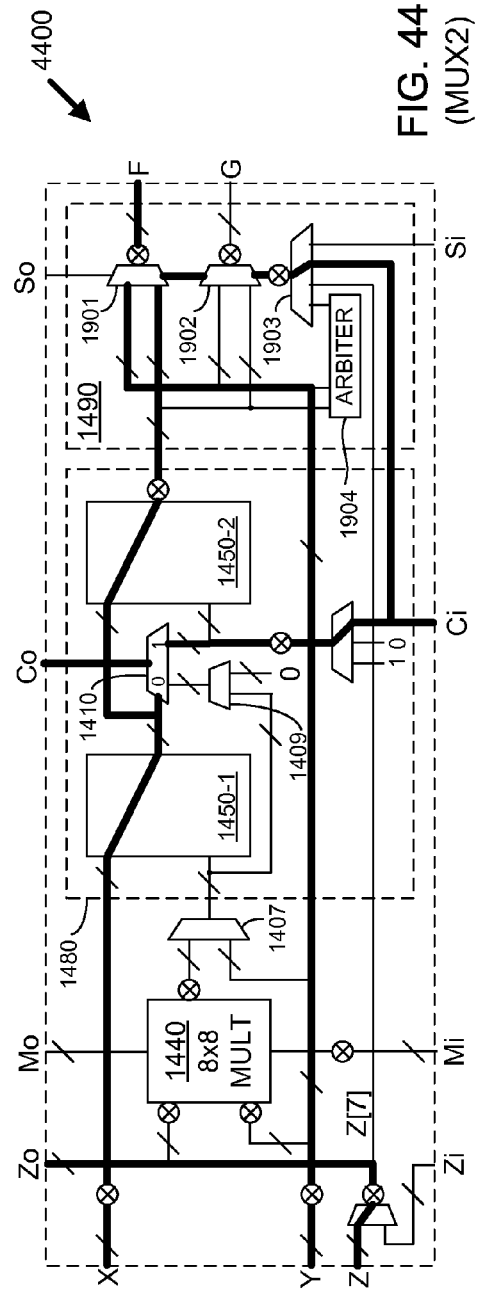

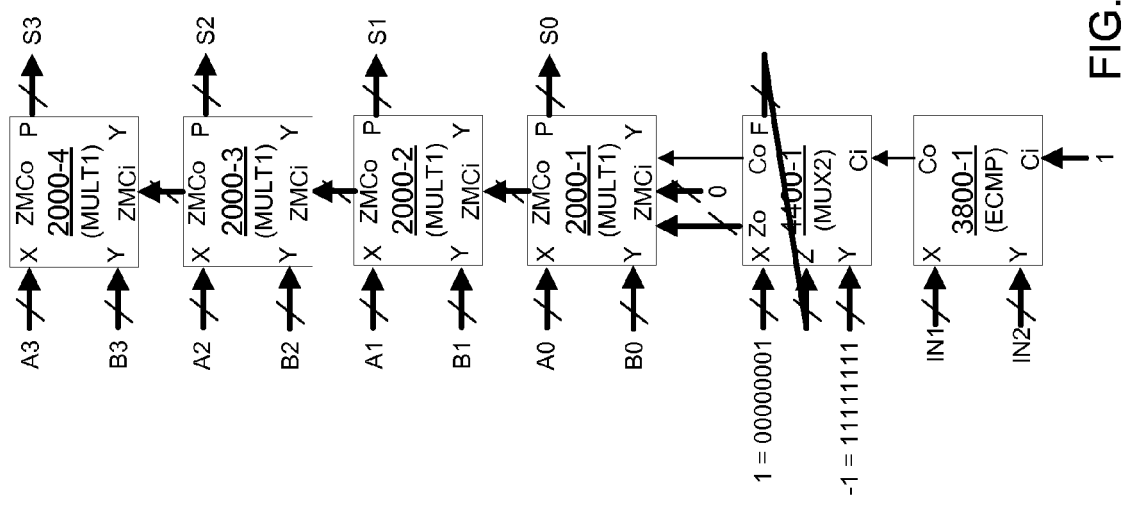

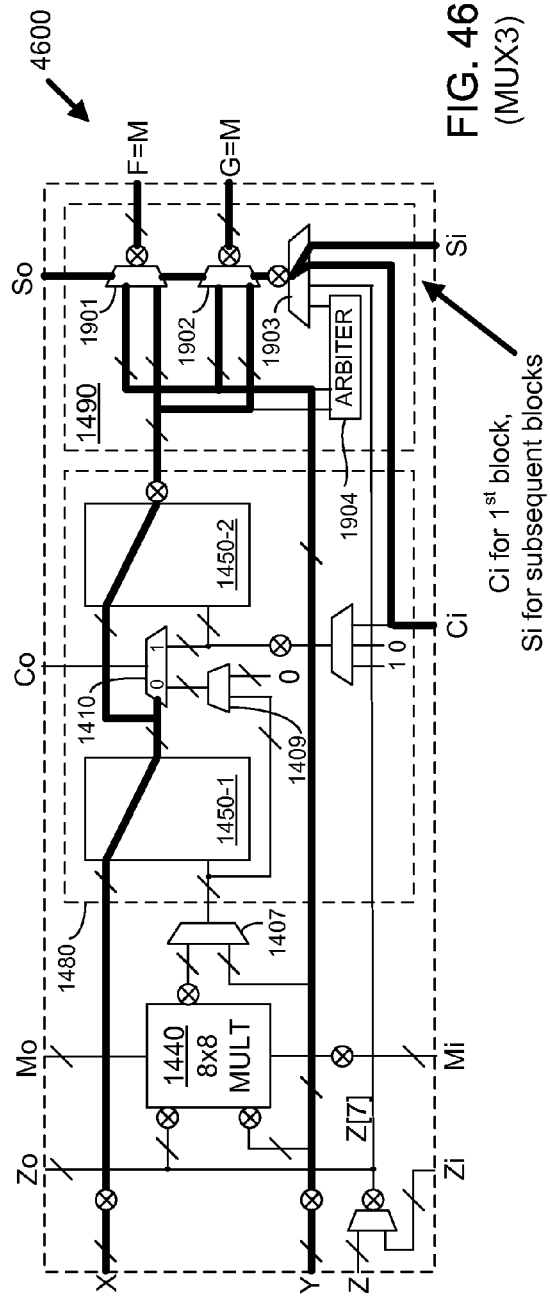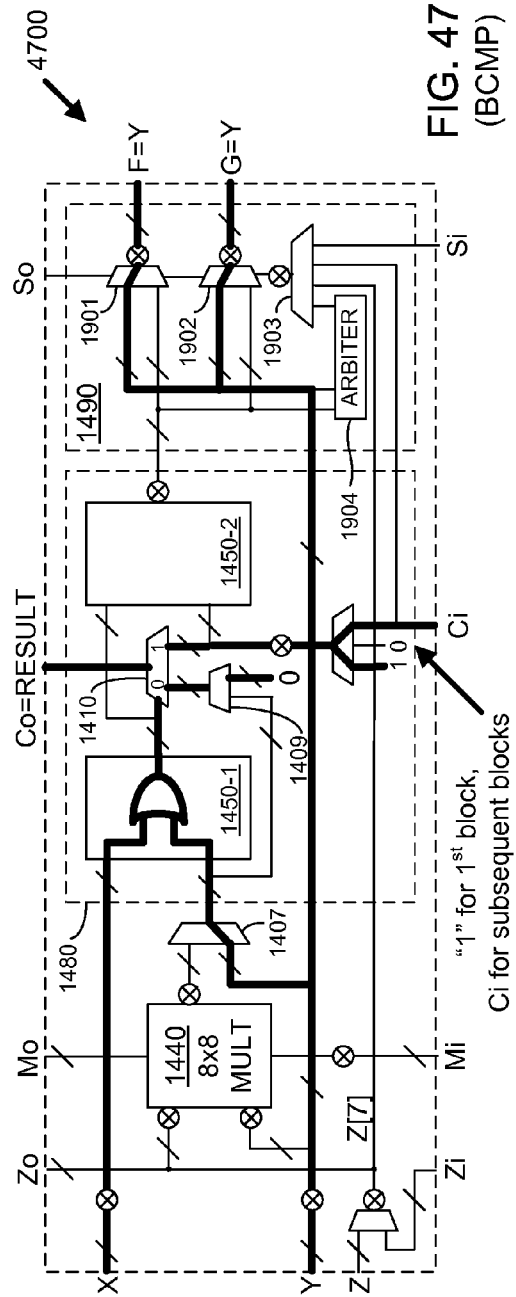

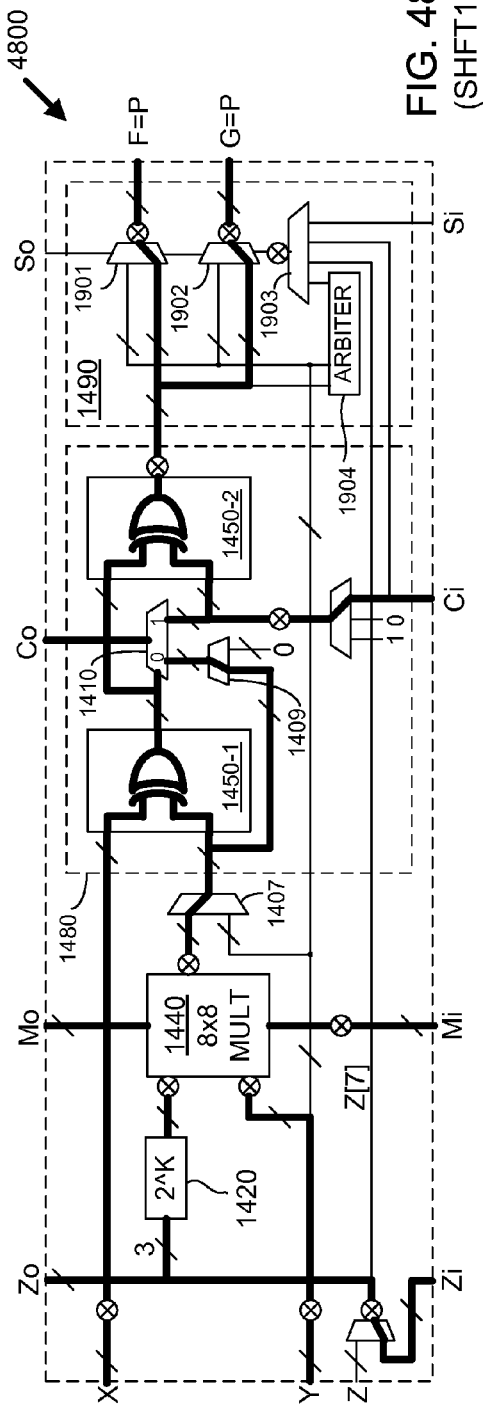
FIG. 48 (SHFT1)
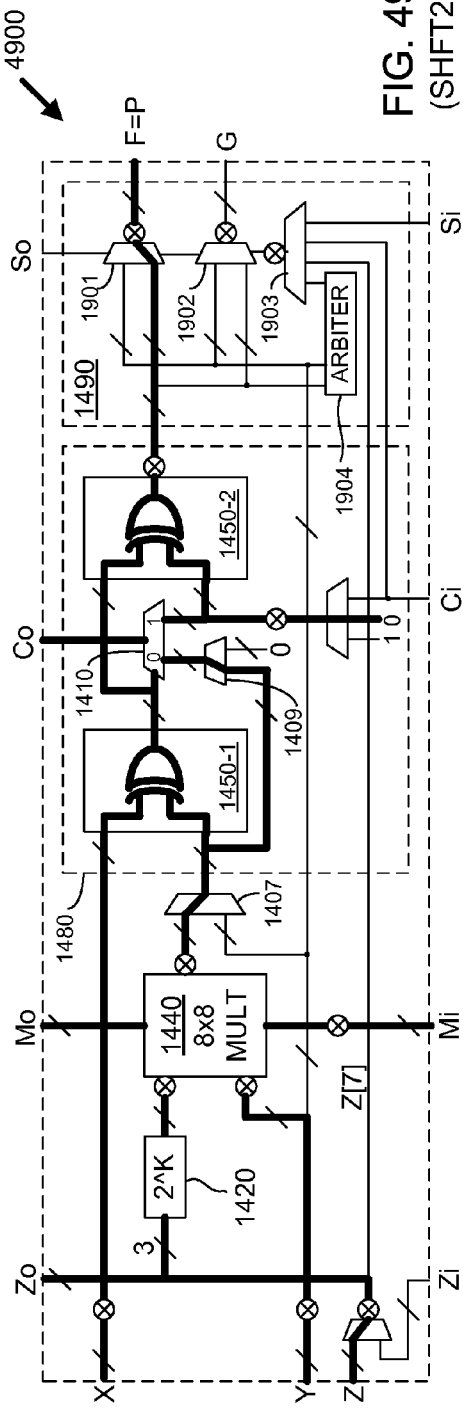
FIG. 49 (SHFT2)

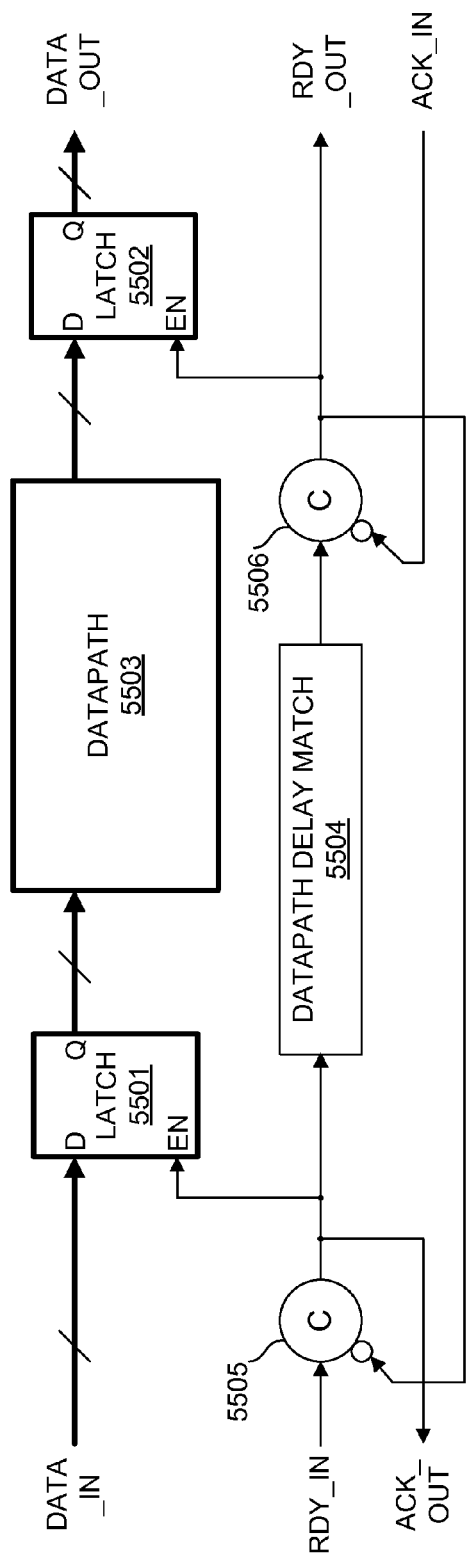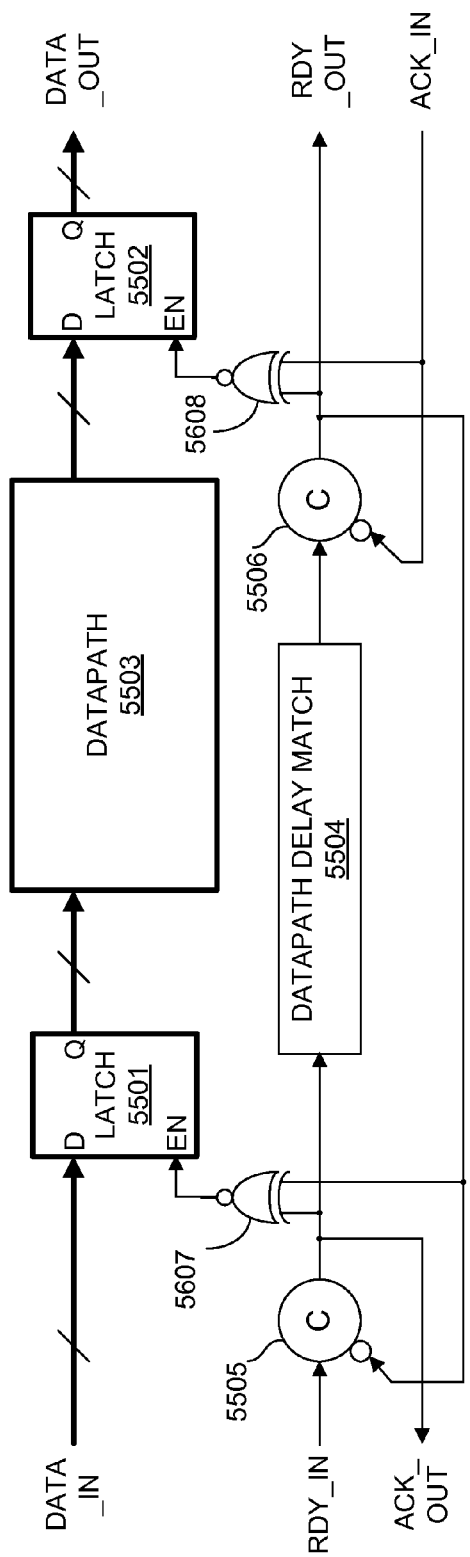
FIG. 55 (4-phase)
FIG. 56 (2-phase)

| MODE | FEEDTHRU | | MUX | | GATE | | MERGE | | FEEDBACK | |
|---|---|---|---|---|---|---|---|---|---|---|
| SUB-MODE | LO->F | Y->F | LO,Y->F | Y,LO->F | LO->F | Y->F | LO,Y->F | Y,LO->F | LO,Y->F | Y,LO->F |
| MUX 5901 | 1 | 0 | 1 | SoB | So | 0 | So | SoB | So | SoB |
| MUX 5902 | 0 | 1 | SoB | So | 0 | So | SoB | So | SoB | So |
| EQUIVALENT CIRCUIT | LO—F | Y—F | (mux: LO=1,Y=0 → So) SoB = Select LO; So = Select Y | (mux: LO=0,Y=1 → So) So = Select Y; SoB = Select LO | (gate: So/LO →F) So = Select LO; SoB = Don't Select LO | (gate: So/Y →F) So = Select Y; SoB = Don't Select Y | (mux: LO=1,Y=0 → So) So = Select LO; SoB = Select Y | (mux: LO=0,Y=1 → So) So = Select Y; SoB = Select LO | (feedback mux: LO=1,Y=0 → So) So = Select LO; SoB = Select Y | (feedback mux: LO=0,Y=1 → So) So = Select Y; SoB = Select LO |
| | So = not used | So = not used | | | | | | | | |
| TOKENS | Consume LO token, & Y if present | Consume Y token, & LO if present | Consume LO, Y, & So tokens (including unselected token) | | Consume LO & So tokens, & Y if present | Consume Y & So tokens, & LO if present | Consume selected token & So, store unselected token | | Initial: consume Y & So tokens Subsequent: consume LO & So, & Y if selected | |

(if/else)

(looping)

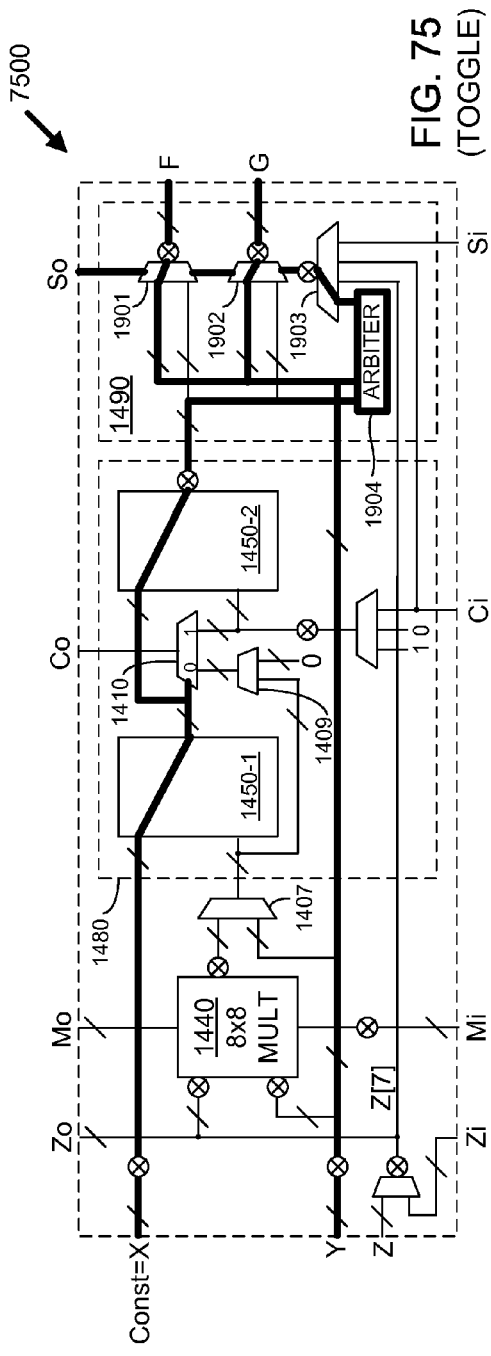
FIG. 75 (TOGGLE)
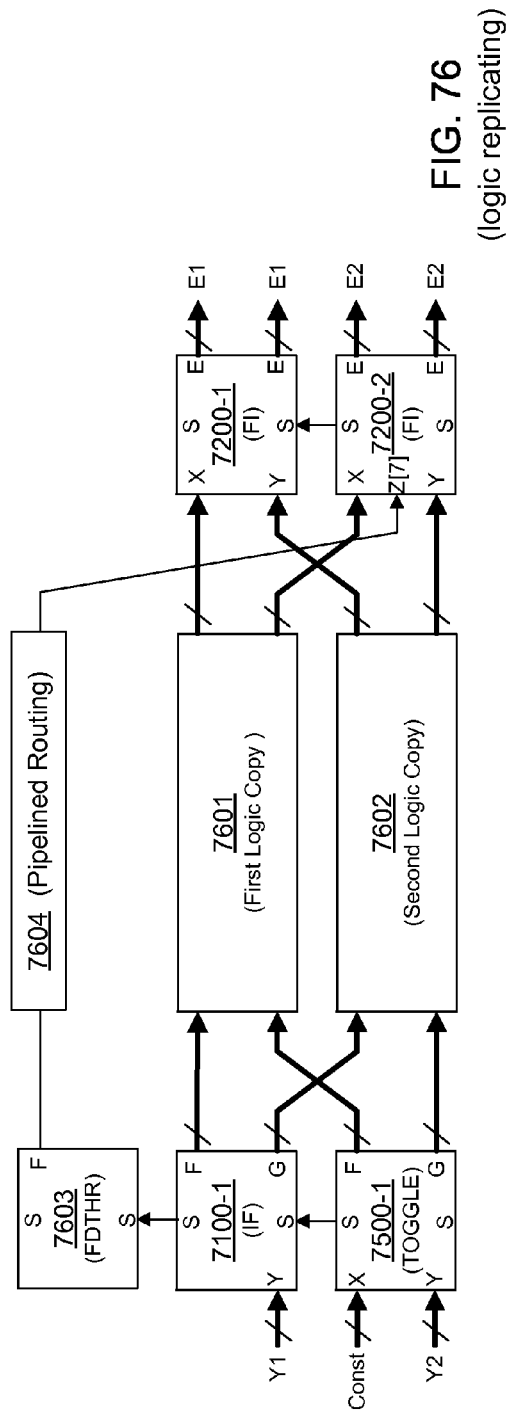
FIG. 76 (logic replicating)

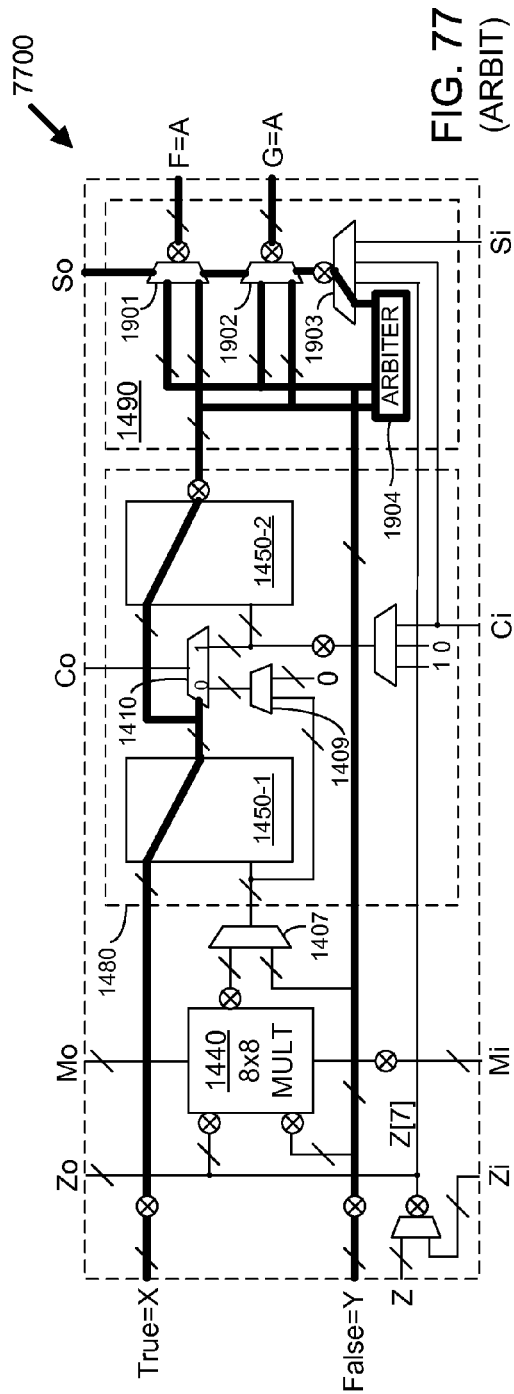
FIG. 77 (ARBIT)
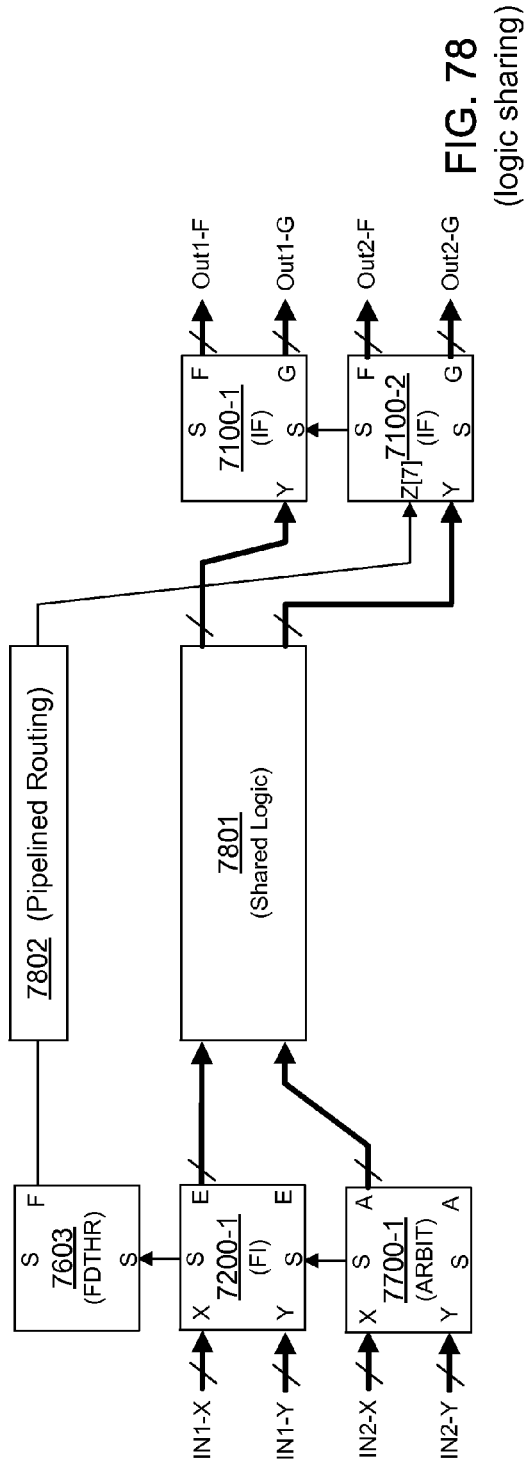
FIG. 78 (logic sharing)

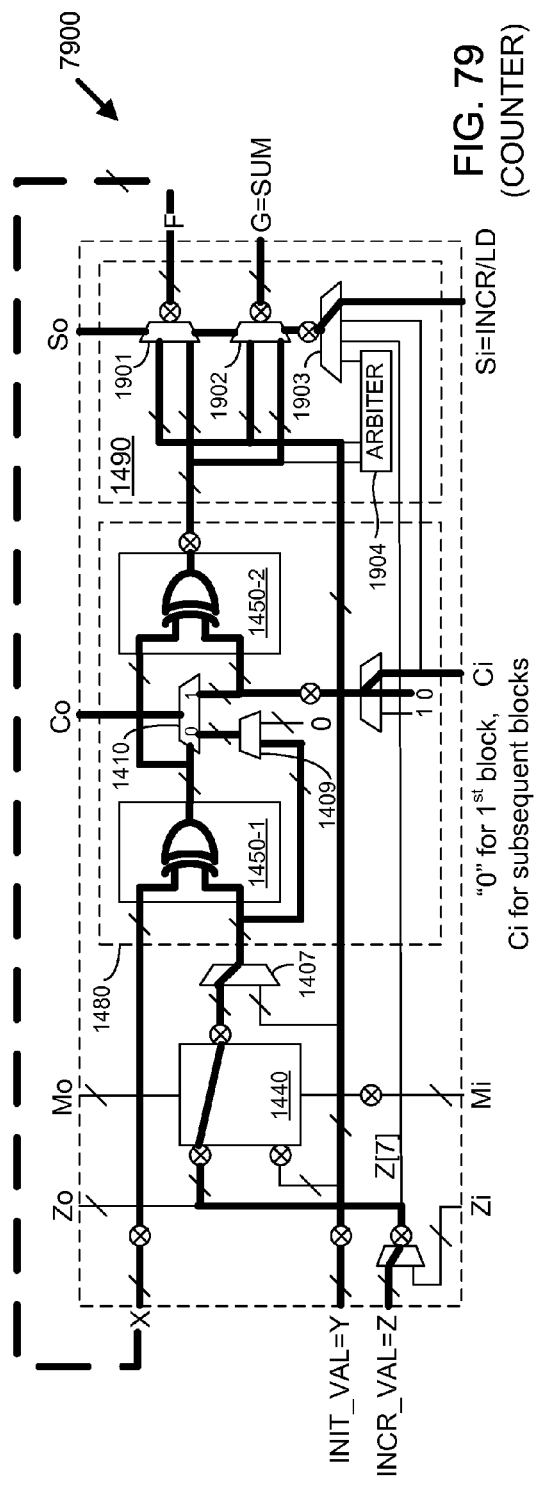
FIG. 79 (COUNTER)
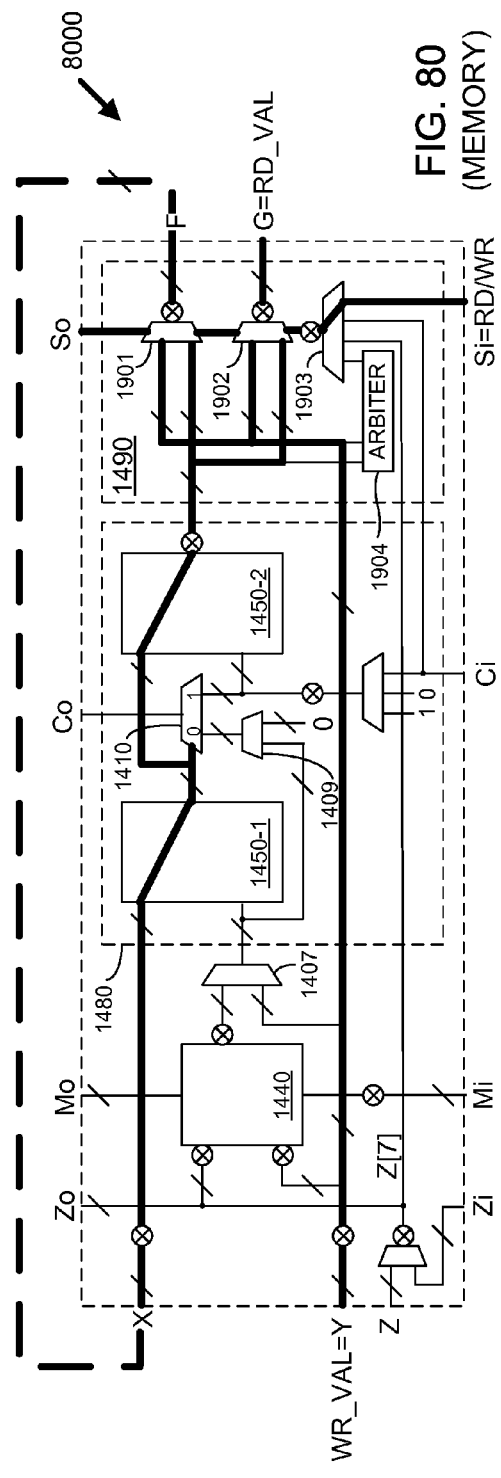
FIG. 80 (MEMORY)

OUTPUT STRUCTURE WITH CASCADED CONTROL SIGNALS FOR LOGIC BLOCKS IN INTEGRATED CIRCUITS, AND METHODS OF USING THE SAME

FIELD OF THE INVENTION

The invention relates to logic blocks in integrated circuits. More particularly, the invention relates to an output structure having cascaded control signals for logic blocks in an integrated circuit, and methods of using the same.

BACKGROUND

Multiplier circuits are common in many types of systems, such as DSP (digital systems processing) systems. Therefore, several different types of multiplier circuits have been devised. One such type is the array multiplier circuit, in which a matrix of partial products is derived in parallel, and then a 2-dimensional array of full adders is used to sum the rows of partial products. The matrix of partial products is naturally trapezoidal in shape. However, the trapezoid can be skewed into a rectangle with the sum or carry bits being propagated diagonally. The rectangular array multiplier is regular in structure, and each cell in the rectangle is coupled only to the neighboring cells. Therefore, this architecture is suitable for implementation in an integrated circuit (IC).

FIG. 1 illustrates a well-known array multiplier circuit. The illustrated array multiplier circuit includes an N×N (N by N) array of cells (101, 102, 103, 104) including full adders plus adjacent half adders and AND gates, with a ripple carry adder (112, 113) added at the top of the array to provide the upper N bits of the final sum. In the circuit of FIG. 1, the two N-bit inputs to the multiplier circuit are X[N−1:0] and Y[N−1:0], and the 2N-bit product output of the multiplier circuit is P[2N−1:0]. Each &/FA sub-circuit 102 (see FIG. 2) includes a full adder and a logical AND gate coupled to one of the full adder inputs. The &/FA cell 102 provides the partial product bit SOUT and the carry out signal COUT from the carry input CIN, the two bit inputs YIN and ZIN, and the partial product input bit SIN. Each &/HA sub-circuit 103 (see FIG. 3) includes a half adder and a logical AND gate coupled to one of the half adder inputs. Each &/HA cell 103 provides the partial product bit SOUT and the carry out signal COUT from the carry input CIN, the two bit inputs YIN and ZIN, and the partial product input bit SIN. Each AND sub-circuit 104 (see FIG. 4) includes a logical AND gate driven by the corresponding YIN and ZIN inputs and providing the AND output signal ANDOUT. The N×N array provides the lower N bits of the product P[N−1:0].

The ripple carry adder at the top of the array includes full adder sub-circuits (RCFA 112) and a half adder sub-circuit (RCHA 113), with the ripple carry chain going from right to left as shown in FIG. 1. The ripple carry adder performs the final summation of the partial products and provides the upper N bits of the product P[2N−1:P[N]).

Thus, a standard array multiplier circuit can have a rectangular aspect well suited for implementation in an integrated circuit. However, a typical multiplier circuit includes several types of cells and thus is not completely regular in design.

Other multiplier architectures in common use utilize "Wallace trees". These architectures use carry propagate adders instead of the long carry chains required by an array multiplexer. For sufficiently large values of N, these architectures have improved multiplier performance compared to the structure of FIG. 1, but at the price of having a much less regular structure. Thus, multipliers utilizing Wallace trees and similar methods may be less suited for implementation in array-type integrated circuits, e.g., in many programmable integrated circuits.

Programmable integrated circuits (ICs) are a well-known type of arrayed IC that can be programmed to perform specified logic functions. An exemplary type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These ICs are known as mask programmable ICs. Programmable ICs can also be implemented in other ways, e.g., using fuse or antifuse technology. The terms "programmable integrated circuit" and "programmable IC" include but are not limited to these exemplary devices, as well as encompassing devices that are only partially programmable. For example, one type of programmable IC includes a combination of hard-coded transistor logic and a programmable switch fabric that programmably interconnects the hard-coded transistor logic.

Traditionally, programmable ICs include one or more extensive dedicated clock networks, as well as clock management blocks that provide clock signals for distribution to all portions of the IC via the dedicated clock networks. These clock management blocks can be quite complicated, encompassing, for example, digital locked loops (DLLs), phase locked loops (PLLs), and so forth. For example, the Virtex®-4 series of FPGAs from Xilinx, Inc. includes up to 20 clock management blocks, each providing individual clock deskewing, frequency synthesis, phase shifting, and/or dynamic reconfiguration for a portion of the IC. Thus, a significant amount of design and testing time is required to provide these features in the device, and their use also requires time and effort on the part of the system designer. Additionally, because a global clock signal may be needed at virtually any position in a programmable IC, a global clock network is very extensive and consumes large amounts of power when in use.

A large IC design typically has a large number of timing requirements. For example, a clock signal must reach the destination within a certain window within which the data being provided to the destination is valid. Meeting these timing requirements for every logic block in a large IC can present a significant challenge, particularly when complicated by issues such as multiple clock domains, skew, jitter, and process, voltage, and temperature variability. Thus, the well-known timing requirements known as the "setup time" for data (the amount of time by which the data signal must precede the active edge of the clock signal at the input terminals of the logic block) and the "hold time" for the data (the amount of time the data signal must remain at the data input terminal after the arrival of the active edge of the clock signal) are vital to the success of a clocked design, and must be met for every clocked element, or the logic cannot be expected to operate properly.

Therefore, it is clear that the design of reliable clock networks for a large programmable IC with multiple clock domains may consume a large amount of engineering resources and may adversely impact the design cycle of the programmable IC.

Programmable ICs are typically designed to be useful in a large variety of customer applications. Therefore, they tend to include a large number of substantially similar logic blocks that are designed with flexibility in mind. To improve the efficiency of certain target applications, including compute-intensive applications such as digital signal processing (DSP), specialized blocks may be included as well as the array(s) of highly flexible logic blocks. However, to achieve the optimum mix of flexibility and efficiency, it may be desirable to provide a programmable IC in which the logic blocks are optimized, in themselves, for compute-intensive applications.

SUMMARY

The invention provides an output structure having cascaded control signals for logic blocks in an integrated circuit, and methods of using the same. According to a first embodiment, an integrated circuit includes an array of interconnected logic blocks. Each of the logic blocks includes a logic circuit, a first output multiplexer, and a select multiplexer. The logic circuit has at least one input coupled to an input of the logic block, and first and second outputs. The first output multiplexer has first and second data inputs respectively coupled to the first and second outputs of the logic circuit, a select input, and an output coupled to a first output of the logic block. The select multiplexer has a first data input coupled to a cascade select input of the logic block, a second data input, and an output coupled to the select input of the first output multiplexer. The output of the select multiplexer is also coupled to a cascade select output of the logic block. The cascade select input of the logic block is coupled to the cascade select output of an adjacent logic block in the array.

In some embodiments, each logic block includes an arbiter having inputs coupled to receive ready signals provided with the first and second outputs of the logic circuit, the arbiter further having an output coupled to the second data input of the select multiplexer. In some embodiments, each logic block includes a memory element (e.g., a latch) coupled between the output of the select multiplexer and the select input of the first output multiplexer, and further coupled between the output of the select multiplexer and the cascade select output of the logic block.

In some embodiments, each logic block also includes a second output multiplexer having first and second data inputs respectively coupled to the first and second outputs of the logic circuit, a select input coupled to the output of the select multiplexer, and an output coupled to a second output of the logic block.

In some embodiments, in each logic block the select multiplexer is programmable to select the cascade select input of the logic block as the output of the select multiplexer, wherein a cascade chain is formed such that a select signal applied to the first output multiplexer in a first of the logic blocks is cascaded through a column of the first output multiplexers in a subsequent plurality of the logic blocks.

In some embodiments, the logic blocks in the array are substantially similar one to another. In some embodiments, the integrated circuit is a programmable integrated circuit such as a programmable logic device (PLD).

According to another embodiment, an integrated circuit includes an interconnect structure, a plurality of substantially similar logic circuits arrayed to form a column of the logic circuits, and a vertical cascade chain. Each of the logic circuits has at least one input coupled to the interconnect structure and further has first and second outputs. The vertical cascade chain has a plurality of first inputs coupled to the first outputs of the logic circuits, a plurality of second inputs coupled to the second outputs of the logic circuits, and a plurality of outputs coupled to the interconnect structure. In some embodiments, the integrated circuit is a programmable integrated circuit such as a programmable logic device (PLD).

In some embodiments, the cascade chain includes a plurality of select multiplexers and a plurality of first output multiplexers. Each of the select multiplexers has first and second inputs and an output coupled to an input of a subsequent select multiplexer in the vertical cascade chain. Each of the first output multiplexers has a first input coupled to one of the first inputs of the vertical cascade chain, a second input coupled to one of the second inputs of the vertical cascade chain, a select input coupled to the output of an associated one of the select multiplexers, and an output coupled to one of the outputs of the vertical cascade chain. Each of the select multiplexers may be programmable to select one of an output from a preceding first select multiplexer or another input to place onto the cascade chain.

In some embodiments, the cascade chain further includes a plurality of second output multiplexers. Each of the second output multiplexers has a first input coupled to one of the first inputs of the vertical cascade chain, a second input coupled to one of the second inputs of the vertical cascade chain, a select input coupled to the output of a corresponding one of the select multiplexers, and an output coupled to one of the outputs of the vertical cascade chain.

According to another embodiment, a method of placing data from a plurality of logic circuits onto an interconnect structure in a programmable integrated circuit includes: programming each of the logic circuits to apply the data from the logic circuit to a corresponding data input of a corresponding first output multiplexer; programmably coupling an initial select line to a data input of a first select multiplexer in a cascade chain of select multiplexers, each of the select multiplexers driving a select input of an associated first output multiplexer having an output coupled to the interconnect structure; programmably coupling an initial select line to a data input of a first select multiplexer in a cascade chain of select multiplexers, each of the select multiplexers driving a select input of an associated first output multiplexer having an output coupled to the interconnect structure; programming the first select multiplexer to pass a value on the initial select line to an output of the first select multiplexer; and programming subsequent select multiplexers in the cascade chain to pass values received from preceding select multiplexers in the cascade chain to the outputs of the subsequent select multiplexers.

In some embodiments, each of the select multiplexers in the cascade chain further drives a select input of an associated second output multiplexer having an output coupled to the interconnect structure. The method can also include programming each of the first output multiplexers to select a polarity for each of the first output multiplexers, e.g., by storing configuration data into configuration memory cells coupled to the first output multiplexers.

BRIEF DESCRIPTION OF THE DRAWINGS

The present invention is illustrated by way of example, and not by way of limitation, in the following figures.

FIG. 1 is a block diagram of a known array multiplier circuit.

FIG. 2 illustrates the input and output signals of an full adder circuit in the multiplier circuit of FIG. 1.

FIG. 3 illustrates the input and output signals of a half adder circuit in the multiplier circuit of FIG. 1.

FIG. 4 illustrates the input and output signals of an AND circuit in the multiplier circuit of FIG. 1.

FIG. 5 illustrates a multiplier circuit comprising a uniform array of sub-circuits.

FIG. 6 illustrates the input and output signals of a full adder circuit in the multiplier circuit of FIG. 5.

FIG. 7 illustrates how an 8×8-bit (8-bit by 8-bit) unsigned multiplier with an 8-bit output can be implemented using the uniform array multiplier circuit of FIG. 5.

FIG. 8 illustrates how an 8×8-bit unsigned multiplier with a 16-bit output can be implemented using the uniform array multiplier circuit of FIG. 5.

FIG. 9 illustrates how an 8×16-bit unsigned multiplier with a 24-bit output can be implemented using the uniform array multiplier circuit of FIG. 5.

FIG. 10 illustrates how a 16×16-bit unsigned multiplier with a 16-bit output can be implemented using the uniform array multiplier circuit of FIG. 5.

FIG. 20 illustrates how the logic block of FIGS. 14 and 19 can be used to implement a first multiplier function, MULT1.

FIG. 21 illustrates how the logic block of FIGS. 14 and 19 can be used to implement a second multiplier function, MULT2.

FIG. 25 illustrates how a 32×32-bit unsigned multiplier with a 32-bit output (lower order bits) can be implemented using the logic block of FIGS. 20-21.

FIG. 26 illustrates how the multiplier of FIG. 25 can be "folded" to produce a more rectangular design.

FIG. 36 illustrates how the logic block of FIGS. 14 and 19 can be used to implement an addition function, ADD.

FIG. 37 illustrates how the logic block of FIGS. 14 and 19 can be used to implement a subtraction function, SUB.

FIG. 38 illustrates how the logic block of FIGS. 14 and 19 can be used to implement a signed or unsigned equal compare function, ECMP.

FIG. 39 illustrates how the logic block of FIGS. 14 and 19 can be used to implement an unsigned unequal compare function, UCMP.

FIG. 40 illustrates how the logic block of FIGS. 14 and 19 can be used to implement a function, SCMP, that can be used to implement a signed unequal compare.

FIG. 41 illustrates how the logic block of FIGS. 14 and 19 can be used to implement a first multiplexer function, MUX1.

FIG. 42 provides a logical view of a signed unequal compare function.

FIG. 43 illustrates how the signed unequal compare function of FIG. 42 can be implemented using the logic blocks of FIGS. 39-41.

FIG. 44 illustrates how the logic block of FIGS. 14 and 19 can be used to implement a second multiplexer function, MUX2.

FIG. 45 illustrates an exemplary adder/subtractor that can be implemented using the logic blocks of FIGS. 20, 38, and 44.

FIG. 46 illustrates how the logic block of FIGS. 14 and 19 can be used to implement a third multiplexer function, MUX3.

FIG. 47 illustrates how the logic block of FIGS. 14 and 19 can be used to implement a bitwise compare function, BCMP.

FIG. 48 illustrates how the logic block of FIGS. 14 and 19 can be used to implement a first bitwise shift function, SHFT1.

FIG. 49 illustrates how the logic block of FIGS. 14 and 19 can be used to implement a second bitwise shift function, SHFT2.

FIG. 55 illustrates a second implementation of the storage logic in the logic block of FIG. 14, in which the storage elements are implemented as latches controlled using 4-phase handshaking.

FIG. 56 illustrates a third implementation of the storage logic in the logic block of FIG. 14, in which the storage elements are implemented as latches controlled using 2-phase handshaking.

FIG. 70 illustrates in tabular format the five modes of the output multiplexer circuit of FIGS. 58-69.

FIG. 75 illustrates how the logic block of FIGS. 14 and 19 can be used to implement a TOGGLE function using Gate mode and the arbiter circuit.

FIG. 76 provides an example of how the IF, FI, and TOGGLE functions can be used to replicate logic.

FIG. 77 illustrates how the logic block of FIGS. 14 and 19 can be used to implement an ARBIT (arbitration) function using Merge mode and the arbiter circuit.

FIG. 78 provides an example of how the ARBIT function can be used to share logic between two data paths.

FIG. 79 illustrates how the logic block of FIGS. 14 and 19 can be used to implement a COUNTER function using Feedback mode.

FIG. 80 illustrates how the logic block of FIGS. 14 and 19 can be used to implement a MEMORY function using Feedback mode.

DETAILED DESCRIPTION

Figure 11:
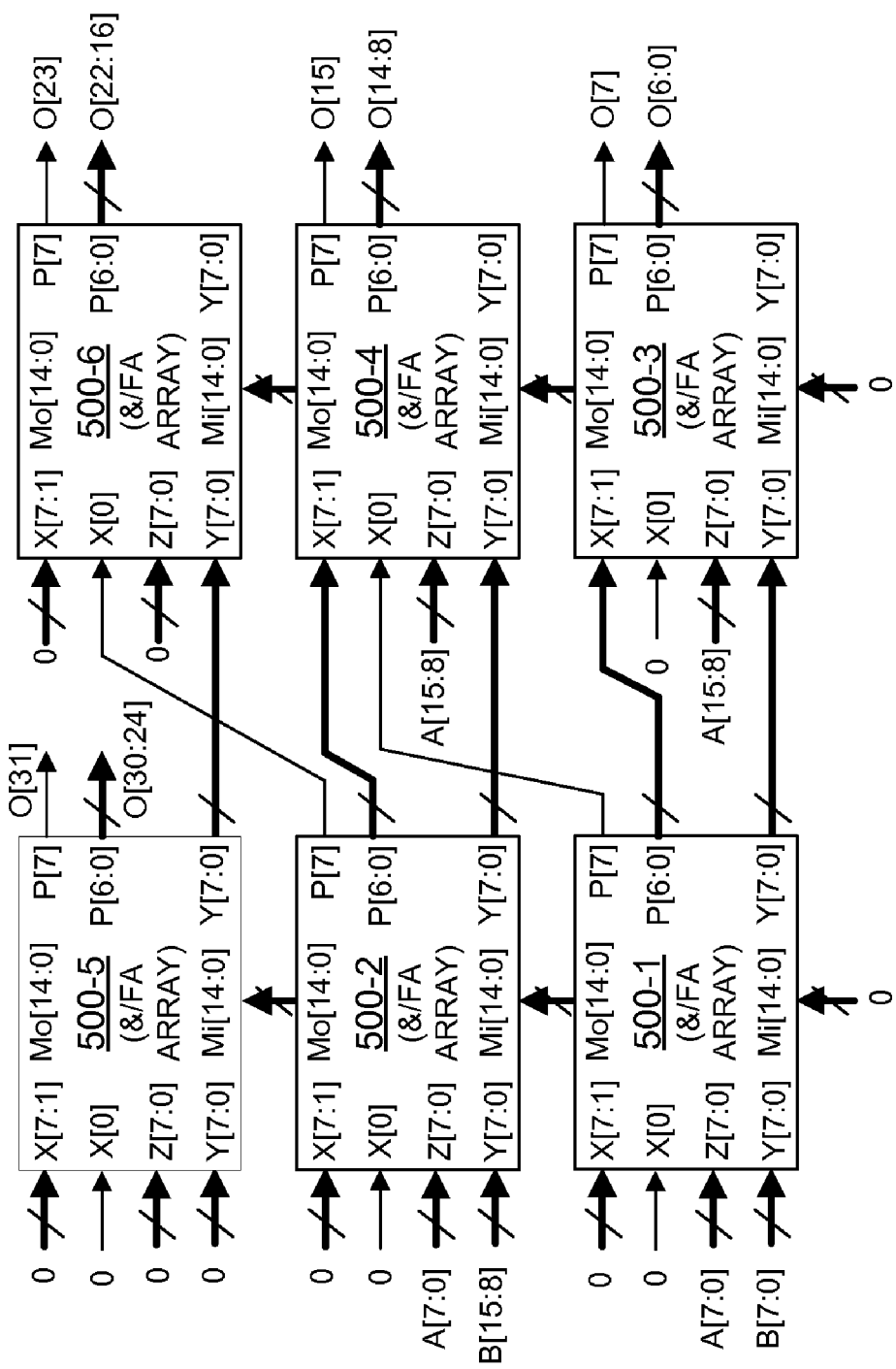
FIG. 11 illustrates how a 16×16-bit unsigned multiplier with a 32-bit output can be implemented using the uniform array multiplier circuit of FIG. 5.

The present invention is applicable to a variety of integrated circuits (ICs). An appreciation of the present invention is presented by way of specific examples utilizing programmable ICs such as programmable logic devices (PLDs). However, the present invention is not limited by these examples.

Further, in the following description, numerous specific details are set forth to provide a more thorough understanding of the present invention. However, it will be apparent to one skilled in the art that the present invention can be practiced without these specific details. In other instances, well known features have not been described in detail, so as not to obscure the invention. For ease of illustration, the same numerical labels may be used in different diagrams to refer to the same items. However, in alternative embodiments the items may be different.

FIGS. 5-11 illustrate a first multiplier circuit (multiply block) 500 and provide several examples of how an array of multiplier circuits 500 can be combined to create larger multiplexers of different sizes. As shown in FIG. 5, multiplier circuit 500 includes a uniform array of sub-circuits, each of which includes a logical AND gate (labeled "&") and a full adder circuit 501 (FA). The inputs and outputs of each full adder circuit 501 are shown in FIG. 6, with IN1 and IN2 being the inputs, Ci being the carry input, Co being the carry output, and S being the sum output. The uniformity of the array structure may make this embodiment particularly well-suited to implementation in a programmable IC comprising an array of substantially similar logic blocks.

Note that in the present specification, the term "substantially similar" is understood to mean similar to the extent that each substantially similar element includes the same internal elements, e.g., sub-circuits, adder circuits, logical AND gates, multiply block, lookup table, storage elements, and so forth. When substantially similar elements are programmable, they are programmed in the same fashion (e.g., using the same programming interface), but may be programmed to perform different tasks. Substantially similar elements may have a single layout, stepped and repeated, but this is not always the case. Further, the addition of smaller elements (e.g., buffers, capacitors, etc.) to one or more otherwise similar blocks and/or structures does not prevent the blocks and/or structures from being considered "substantially similar".

The multiplier circuit of FIG. 5 implements the arithmetic function:

$$(Y[7:0]*Z[7:0])+X[7:0]=P[7:0]$$

where the output P[7:0] comprises the lower eight bits of the output of the function. Multiple copies of multiplier circuit 500 can be combined to implement larger multipliers, as will now be described.

FIG. 7 illustrates how a single instance of the multiplier circuit of FIG. 5 can be used to implement an 8×8-bit (8-bit by 8-bit) unsigned multiplier having inputs A[7:0] and B[7:0] and 8-bit output O[7:0]. A[7:0] and B[7:0] drive the two multi-bit inputs Z[7:0] and Y[7:0] of the multiplier circuit 500-1 (&/FA ARRAY). All eight bits of the third multi-bit input X[7:0] are tied to ground ("0"). The output P[7:0] of the multiplier circuit 500-1 provides the lower eight bits of the multiplier output O[7:0]. Note that the "slash" across an arrow or signal line in all figures herein indicates a multi-bit signal, or bus. In FIGS. 7-11 and many of the other figures herein, a bold arrow or line is also used to indicate a bus. However, in some figures a bold arrow or line is used for some other purpose, as is described in connection with these figures.

The M-bus input along the bottom of the array (the "partial product bus") is the method by which partial products are passed from one multiplier circuit 500 to another, as shown in FIGS. 9-11. In the exemplary multiplier of FIG. 7, all 15 bits of the M-bus input Mi[14:0] are tied to ground, as only one instance of multiplier circuit 500 is used.

FIG. 8 illustrates how two instances of multiplier circuit 500 can be combined to create an 8×8-bit unsigned multiplier with a 16-bit output O[15:0]. The lower eight bits of the output, O[7:0], are provided by instance 500-1, as in the embodiment of FIG. 7. The partial product bits are passed on the M-bus from instance 500-1 to instance 500-2, which produces and provides the upper eight bits of the output, O[15:8].

FIG. 9 illustrates how three instances of multiplier circuit 500 can be combined to create an 8×8-bit unsigned multiplier with a 24-bit output O[23:0]. The lower 16 bits of the output, O[15:0], are provided by instances 500-1 and 500-2, as in the embodiment of FIG. 7. The partial product bits are passed on the M-bus from instance 500-1 to instance 500-2, and from instance 500-2 to instance 500-3. Instance 500-3 produces and provides the upper eight bits of the output, O[23:16].

FIG. 10 illustrates how four instances of multiplier circuit 500 can be combined to create a 16×16-bit unsigned multiplier with a 16-bit output O[15:0]. In this embodiment, instances 500-1 and 500-2 are similar to the like-named instances in FIG. 9, and instances 500-3 and 500-4 are added. The lower eight bits of input A (A[7:0]) are routed to each instance in the left-hand column. The higher eight bits of input A (A[15:8]) are routed to each instance in the right-hand column. The lower eight bits of input B (B[7:0]) are routed to each instance in the bottom row. The higher eight bits of input B (B[15:8]) are routed to each instance in the top row. However, the internal connections in the construct are less regular in nature than the previous examples, as shown in FIG. 10. For example, the most significant bit of the output bus P[7:0] of instance 500-1 must be separately routed from the lower seven bits P[6:0] of the bus. The most significant bit, P[7], is routed to the X[0] input of instance 500-4, while the lower seven bits P[6:0] are routed to the X[7:1] bits of instance 500-3. In other words, these internal connections are offset by one bit.

It will be understood that the terms "above" and "below", "horizontal" and "vertical", "top" and "bottom", and so forth as used herein are relative to one another and to the conventions followed in the figures and specification, and are not indicative of any particular orientation of or on an integrated circuit or physical die. Further, the terms "column" and "row" are used to designate direction with respect to the figures herein, and a "column" in one embodiment can be a "row" in another embodiment.

FIG. 11 illustrates how six instances of multiplier circuit 500 can be combined to create a 16×16-bit unsigned multiplier with a 32-bit output. In this embodiment, instances 500-1 through 500-4 are similar to the like-named instances in FIG. 10, and instances 500-5 and 500-6 are added. Inputs X[7:0], Y[7:0], and Z[7:0] of instance 500-5 are all tied to ground. Output P[7:0] of instance 500-5 provides the most significant eight bits O[31:24] of the 32-bit output O[31:0]. Inputs X[7:1], Y[7:0], and Z[7:0] of instance 500-6 are all tied to ground. Input X[0] of instance 500-6 is provided by output P[7] of instance 500-2. Output P[7:0] of instance 500-6 provides bits O[23:16] of the 32-bit output O[31:0].

Figure 12:
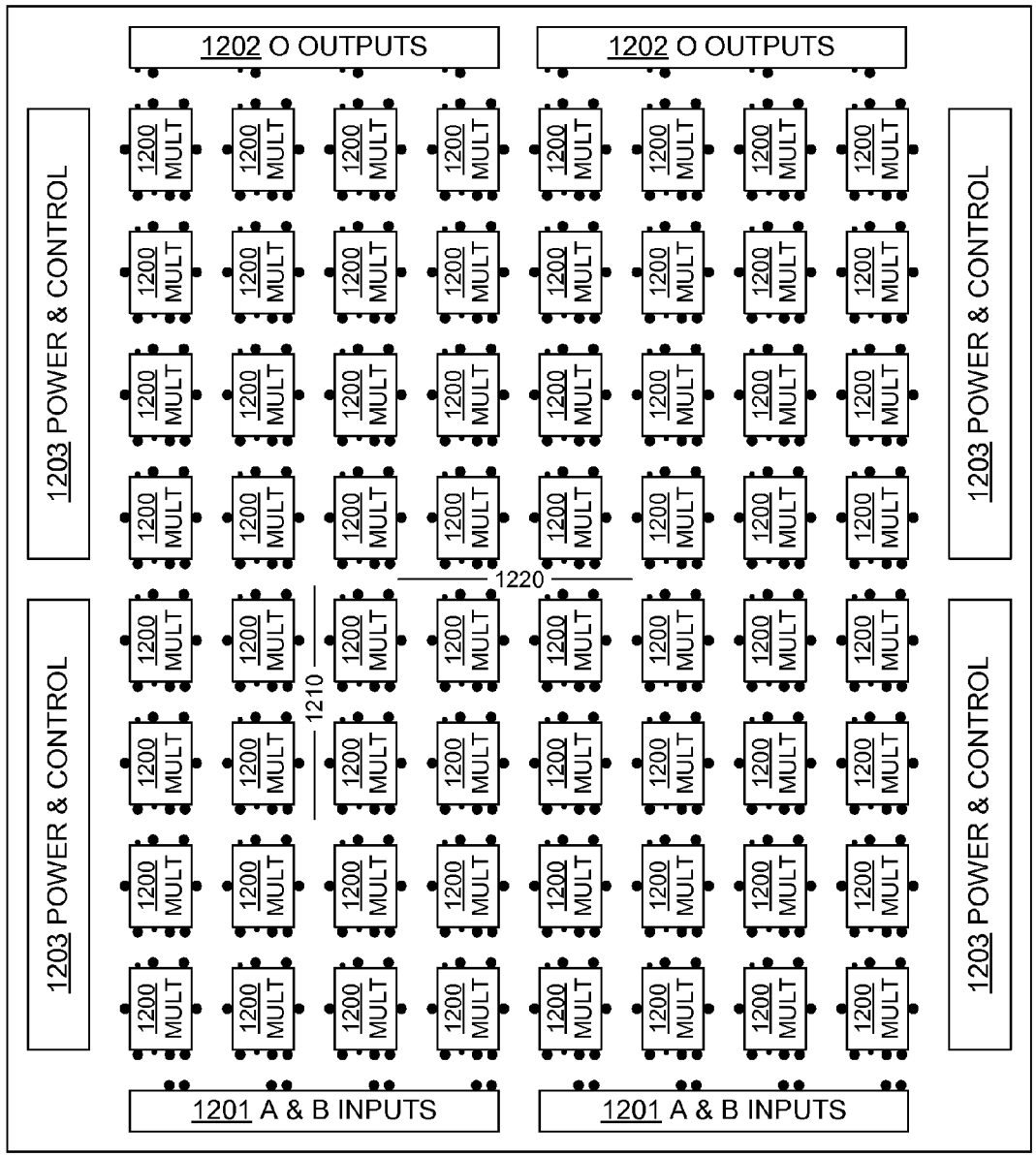
FIG. 12 illustrates an integrated circuit (IC) that can be implemented using the uniform array multiplier circuit of FIG. 5.

As previously noted, the uniformity of the array structure may make this embodiment particularly well-suited to implementation in a programmable IC comprising an array of substantially similar logic blocks. For example, FIG. 12 illustrates an exemplary IC that can be constructed from multiple instances of a multiplier circuit 1200. Multiplier circuit 1200 may be similar, for example, to multiplier circuit 500 of FIG. 5. The IC of FIG. 12 can be a mask programmable IC, for example, where the multiplier circuits 1200 are placed in a regular array, but are not interconnected until a customer defines a desired multiplier or other arithmetic circuit to be constructed by interconnecting the multiplier circuits, e.g., with metallic wires. In some embodiments, the IC of FIG. 12 is field programmable. In other words, rather than being programmed by adding metal interconnect as a final step in the manufacturing process, the interconnect wires are already present on the unprogrammed IC. However, the interconnections among the wires and the multiplier blocks are programmed by storing data in memory cells (e.g., configuration memory cells) included in the IC. Such programmable interconnections are well known, and are commonly used, for example, in programmable logic devices (PLDs) such as CPLDs and FPGAs. In other embodiments, the IC of FIG. 12 can be an application specific IC (ASIC) that is manufactured in one or more different sizes to accommodate the needs of a particular system or type of system.

The exemplary IC of FIG. 12 includes an 8×8 array of multiplier circuits, with A & B input pads arranged in banks 1201 at the left edge of the multiplier array, O output pads arranged in banks 1202 at the right edge of the multiplier array, and power and control pads arranged in banks 1203 at the top and bottom edges of the array. Horizontal routing channels 1210 and vertical routing channels 1220 provide the space necessary to interconnect the multiplier blocks, e.g., in a fashion similar to the examples shown in FIGS. 8-11.

Figure 13:
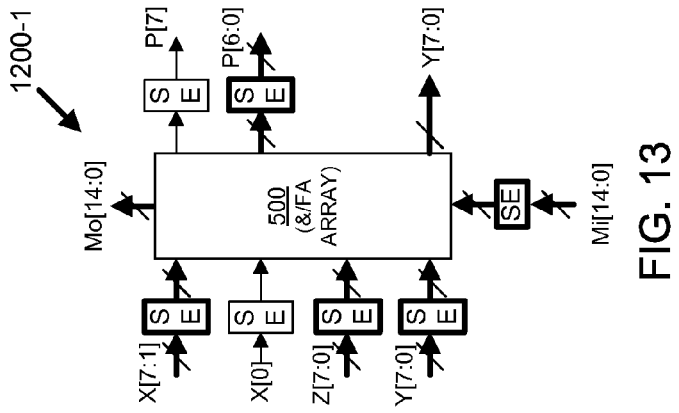
FIG. 13 illustrates how storage elements may optionally be added to the uniform array multiplier circuit of FIG. 5 prior to inclusion in the programmable IC of FIG. 12.

In some embodiments, it may be desirable to pipeline the multiplier circuits. This can be accomplished, for example, by adding storage elements SE to the X, Y, and Z inputs, the M-bus, and the P output, as shown in FIG. 13. Thus, FIG. 13 provides an alternative implementation 1200-1 of multiplier circuit 1200 that can be used in the programmable IC of FIG. 12. The storage elements SE can be, for example, clocked flip-flops or latches. In some embodiments (not shown), the multiplier is internally pipelined, in addition or as an alternative to adding the illustrated storage elements SE. In some embodiments, storage elements are added to some, but not all, of the inputs and outputs described above. It will be clear to those of skill in the art that pipelining can be added to, or removed from, various places in the pictured circuits without departing from the spirit and scope of the present invention.

Note that in the embodiment of FIG. 13, the least significant bit X[0] of input X is separately stored and routed, as is the most significant bit P[7] of output P. This accommodation is made to allow the implementation of wide arrays as shown, for example, in FIGS. 10 and 11. A second embodiment, which is now to be described, allows all data busses to be routed as a unit. In the second embodiment, all bits of each data bus can be collectively stored and routed.

Figure 14:
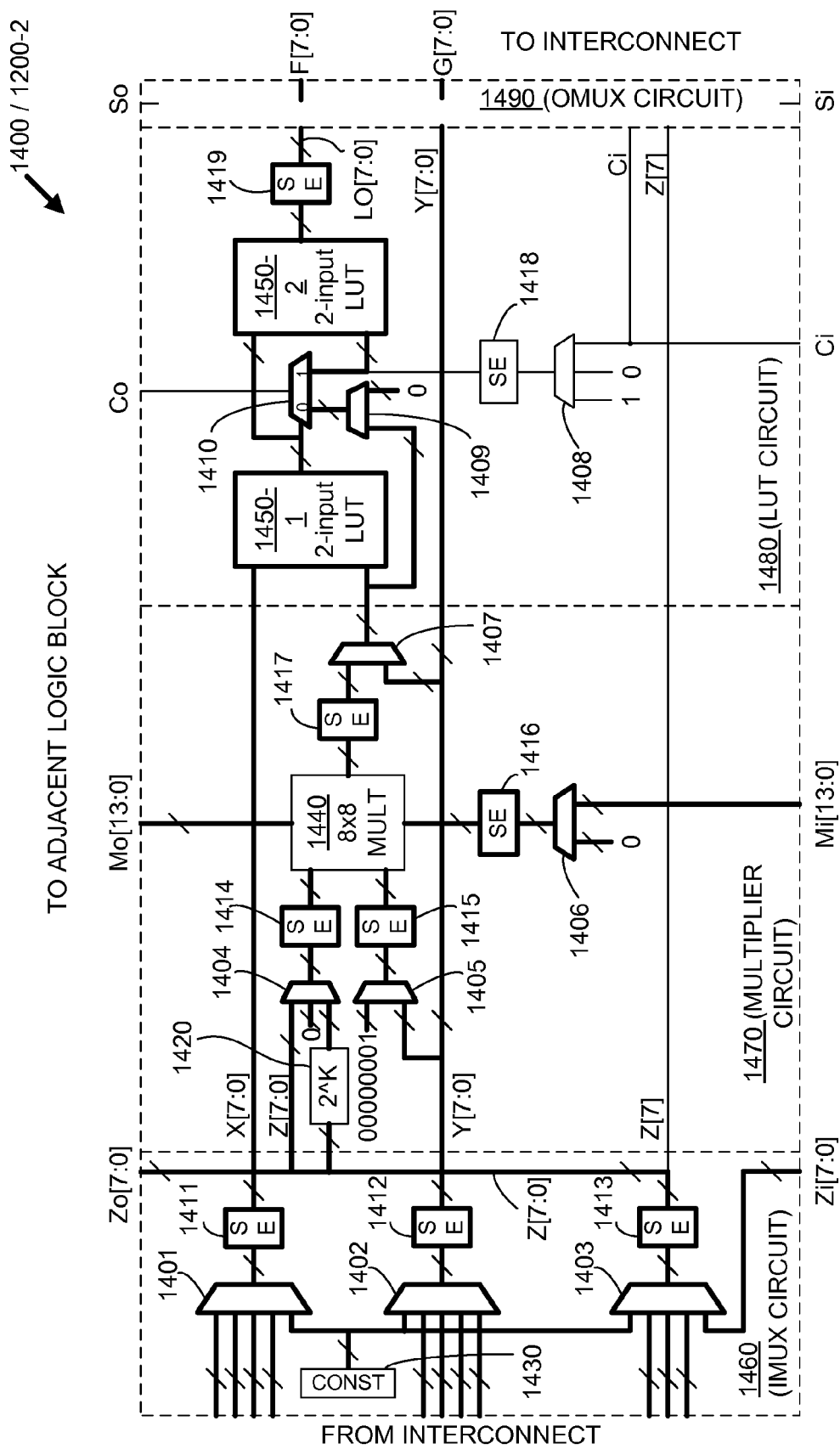
FIG. 14 illustrates a bus-based logic block that can be used to build a programmable IC having highly flexible multiplier capability.

FIG. 14 illustrates a bus-based logic block that can be used to build a programmable IC having highly flexible multiplier capability. The logic block 1400/1200-2 of FIG. 14 can be used, for example, as another embodiment of multiplier block 1200 in the programmable IC of FIG. 12. As was previously described, multiplier circuit 500 (see FIG. 5) actually implements a "multiply plus add" function, where P[7:0]=(Y[7:0]*Z[7:0])+X[7:0]. In the embodiment of FIG. 14, the two functions, multiplication and addition, are implemented in two different portions of the logic block. The multiplication function Y[7:0]*Z[7:0] is performed in the multiplication block 1470, and the subsequent addition (Y[7:0]*Z[7:0])+X[7:0] is performed in a lookup table circuit 1480. Thus, the vertical M-bus interconnecting the multiplier blocks does not include the full partial products, but an intermediate sum of partial products. However, this bus is still referred to herein as a "partial product bus".

The embodiment of FIG. 14 has many advantages. While this structure can be used to perform the same tasks as the embodiment of FIG. 5, many other arithmetic functions can also be easily implemented using logic block 1400. Further, many functions in computer software, such as constructs often used in the C and C++ languages, can also be easily implemented. Thus, the embodiment of FIG. 14 is particularly well suited for the implementation of user designs in a programmable IC, where the user designs are specified using a high-level computer language such as C or C++. Software that can be used for this purpose has been described, for example, by David W. Bennett in U.S. Pat. No. 7,315,991 entitled "Compiling HLL into Massively Pipelined Systems", issued Jan. 1, 2008.

Many examples of how to implement various arithmetic functions and computer constructs using the embodiment of FIG. 14 are provided in subsequent figures, and are described below. However, these examples are not to be interpreted as limiting. Logic block 1400 is highly flexible in nature, and those of skill in the art will be able to derive many other applications of the structure upon reading and study of the present description and the accompanying drawings.

An important advantage of logic block 1400, and an advantage that contributes significantly to the flexibility of the resulting integrated circuit, is that multipliers of any size (that is, any integral multiple of the size of the multiply block) can be constructed using this logic block. In other words, a two-dimensional array of any size can be used to implement a multiplier. (The term "two-dimensional array" as used herein refers to an array of more than one column and more than one row.) Previously known multiplier blocks, such as the DSP48 blocks in the Virtex®-4 and Virtex-5 FPGAs from Xilinx, Inc., can be cascaded in only one dimension, and require external logic to implement larger multiplier functions.

Figure 15:
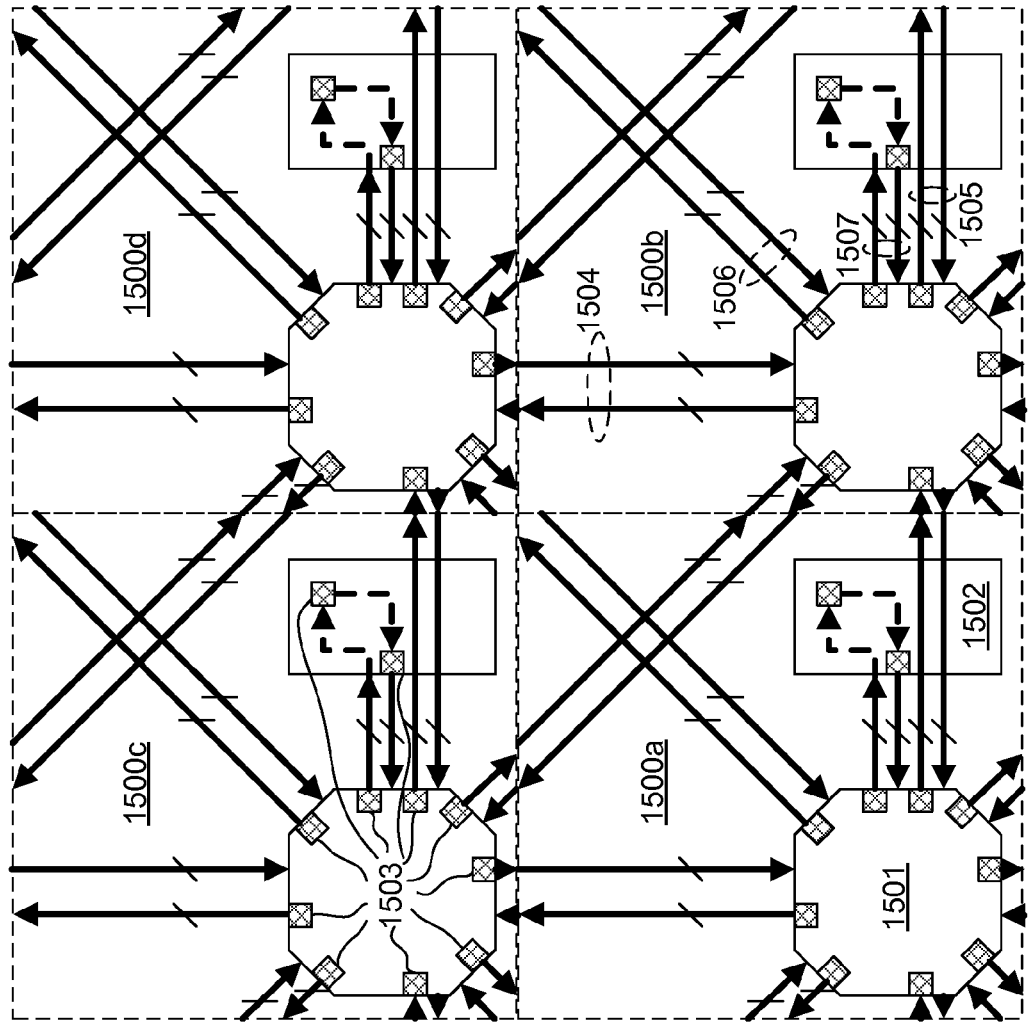
FIG. 15 illustrates an exemplary IC that can be built using the logic block of FIG. 14.

As was previously described, logic block 1400 can be used, for example, in an IC such as that illustrated in FIG. 12. However, many other ICs can be built using logic block 1400. For example, FIG. 15 illustrates an exemplary field programmable IC that can be implemented using logic block 1400. FIG. 15 illustrates four tiles 1500a-1500d of an exemplary arrayed programmable IC. The substantially similar logic blocks 1502 are implemented using logic block 1400. A programmable routing structure interconnecting logic blocks 1502 includes vertical lines 1504, horizontal lines 1505 and 1507, diagonal lines 1506, and programmable switch matrices 1501.

In the illustrated embodiment, logic blocks 1502 and programmable switch matrices 1501 are pipelined, i.e., storage elements are included at various points along each interconnect and data line. The storage elements can be clocked flip-flops or latches, for example, and are denoted in FIG. 15 as cross-hatched boxes 1503. Further, the interconnect lines in the illustrated embodiment are bus-based. In other words, each arrow in FIG. 15 denotes a set of related interconnect lines, e.g., eight bits of a data bus that are routed together as a single unit. An exemplary interconnect structure suitable for use with the embodiment of FIG. 15 is described by Steve P. Young in co-pending, commonly assigned U.S. patent application Ser. No. 12/174,926, entitled "Integrated Circuits with Bus-Based Programmable Interconnect Structures", filed Jul. 17, 2008, which is incorporated herein by reference.

In FIG. 14, multi-bit busses are denoted by both a bold signal line, and a slash across the signal line. A bold line around a structure (e.g., a multiplexer symbol or a rectangular box) also denotes a structure that is duplicated to accommodate a multi-bit bus. Thus, as a general example, a multiplexer symbol drawn with a bold line indicates that there is one multiplexer for each bit in the bus, and that all of the multiplexers denoted by that symbol are commonly controlled. The carry chain including multiplexers 1409 and 1410 is a special case, as shown in FIG. 16.

Figure 16:
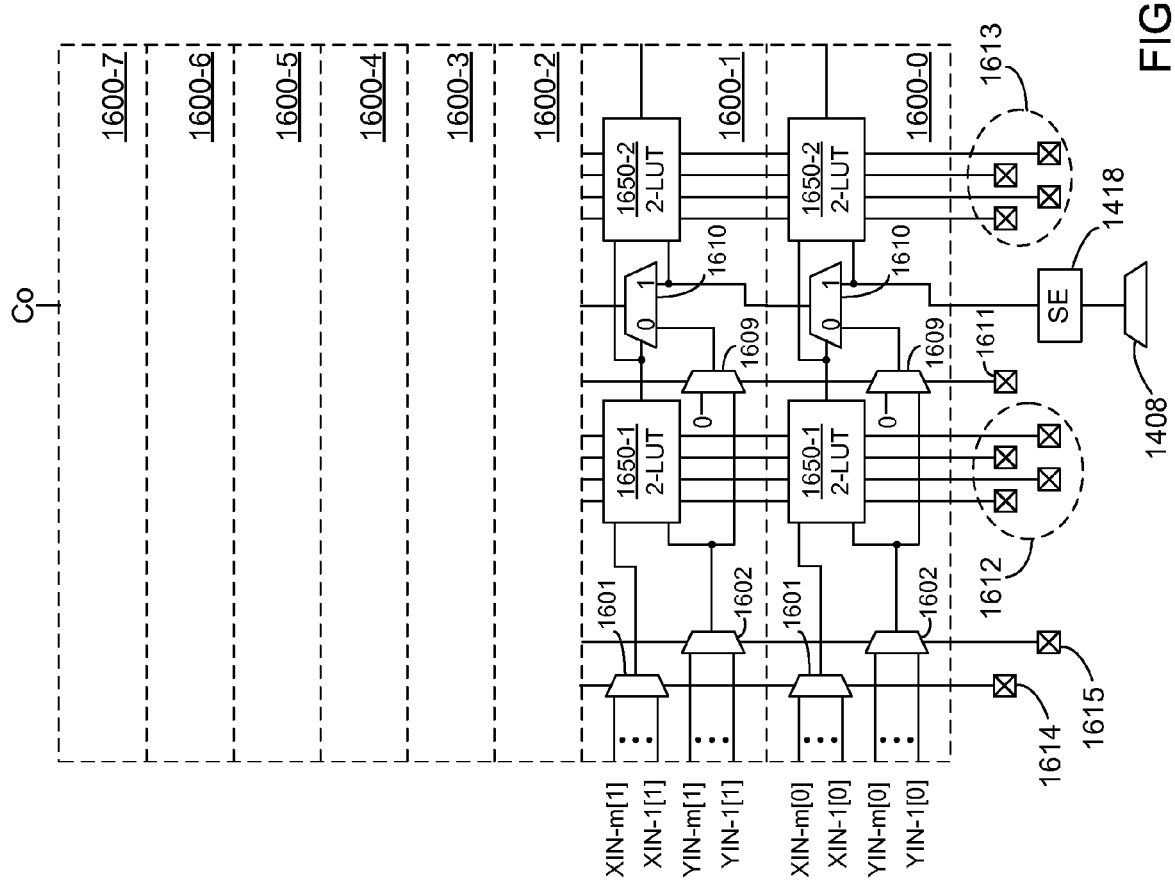
FIG. 16 illustrates how the various elements are controlled by common memory cells in the bus-based logic block of FIG. 14.

FIG. 16 is a bitwise view of logic block 1400 of FIG. 14. The illustrated logic block includes eight copies 1600-0 through 1600-7 of a sub-circuit that includes the logic for one bit of the implemented function. Each sub-circuit in the simplified drawing includes four multiplexers, each representing one bit of a multi-bit multiplexer from FIG. 14: input multiplexer 1601 corresponding to multiplexer 1401; input multiplexer 1602 corresponding to multiplexer 1402; carry multiplexer 1610 corresponding to multiplexer 1410; and multiplexer 1609 corresponding to multiplexer 1409. Each lookup table 1650-1 corresponds to one bit of multi-bit lookup table 1450-1 of FIG. 14. Similarly, each lookup table 1650-2 corresponds to one bit of multi-bit lookup table 1450-2.

As shown in FIG. 16, all input multiplexers 1601 are controlled by the same memory cell 1614, all input multiplexers 1602 are controlled by the same memory cell 1615, and all multiplexers 1609 are controlled by the same memory cell 1611. Similarly, all lookup tables 1650-1 are controlled by the same memory cells 1612, and all lookup tables 1650-2 are controlled by the same memory cells 1613. The eight bits of these elements can be said to be coupled in parallel. As previously noted, the carry multiplexers 1610 are a special case, in that they are coupled in series with one another to implement the carry chain. Also, the carry multiplexers 1610 are not commonly controlled, because the select input of each carry multiplexer is coupled to the output of the corresponding lookup table 1650-1.

Note that the number of memory cells coupled to each multiplexer and lookup table in FIG. 16 is purely exemplary. For example, in some embodiments each multiplexer input is controlled by a separate memory cell, e.g., all inputs XIN–1[N–1:0] are commonly controlled by a first memory cell, all inputs XIN–2[N–1:0] are commonly controlled by a second memory cell, and so forth.

The memory cells can be, for example, FLASH memory cells, configuration memory cells in a field programmable IC, and so forth. In a mask programmable embodiment, the memory cells can be omitted, and the programming is performed by permanently coupling the control/select inputs to power high or ground nodes of the IC by the addition of a metal line. In an ASIC embodiment, the memory cells are also omitted, and the programming is performed by permanently coupling the control/select inputs to power high or ground nodes of the IC as part of the overall design. In another ASIC embodiment, the programming is performed by absorbing the fixed values of the control/select inputs into the fixed logic of the logic block, e.g., a NAND gate having a power high control/select input is replaced by an inverter, an N-channel transistor gated by power high is replaced by a short, and so forth. It will be clear to those of skill in the art that the present invention encompasses these and other architectural variations.

Returning now to FIG. 14, it can be seen that some elements of logic block 1400 appear only once in the logic block, rather than N times. For example, multiply block 1440 occurs only once. However, multiply block 1440 has two 8-bit data or multiplicand inputs (Z[7:0] and Y[7:0]), a 14-bit partial product bus input (Mi[13:0]) and output (Mo[13:0]), and an 8-bit product output. Constant generator circuit 1430 (CONST) and one-hot circuit 1420 (2^K) also occur only once, as do multiplexer 1408 and storage element 1418 on the carry chain input. These elements and their functions are described later in the present specification.

Logic block 1400 can be functionally divided into four circuits: input multiplexer (IMUX) circuit 1460; multiplier circuit 1470; lookup table circuit 1480; and output multiplexer (OMUX) circuit 1490.

Input multiplexer circuit 1460 includes three multi-bit multiplexers 1401-1403, three multi-bit storage elements (SEs) 1411-1413 coupled to store the outputs of the three multiplexers, and a constant generator circuit 1430, coupled together as shown in FIG. 14. The output of constant generator circuit 1430 is a multi-bit value that can be passed to any of the three outputs of the input multiplexer circuit, X[7:0], Y[7:0], and Z[7:0] via input multiplexers 1401-1403 and storage elements 1411-1413. Note that in the pictured embodiment, all data busses are 8-bit busses. However, it will be clear to those of skill in the art that busses of any width can be similarly accommodated, in the embodiment of FIG. 14 and in the other embodiments described herein. Also, the number of external inputs to multiplexers 1401-1403 may be other than those shown, and so forth. It will be apparent to one skilled in the art after reading this specification that the present invention can be practiced within these and other architectural variations.

Constant generator circuit 1430 serves an interesting purpose that may not be immediately apparent. Because logic block 1400 is bus-based, the circuitry controlling each of the bits is commonly controlled throughout the logic block. For example, each bit of a multi-bit input multiplexer selects the corresponding bit of the same input bus, 2-input lookup tables 1450-1 and 1450-2 are programmed to perform the same function on the respective two input bits, and so forth. Therefore, it can be difficult to place any value other than 00000000 or 11111111 onto a data bus without requiring the user to externally supply constants from input/output blocks, for example. Constant generator circuit 1430 overcomes this limitation by allowing a user to provide any 8-bit value and place that value onto any of the three data inputs to the logic block via multiplexers 1401-1403. From these inputs, the constant value can be routed elsewhere in the device, if desired, by routing the constant to one of the outputs of the logic block, and hence to the general interconnect structure. This solution can use fewer transistor and consume less area than the more straightforward solution of separately controlling each bit of the data bus in the lookup table. In some embodiments, constant generator circuit 1430 is omitted, or is coupled to fewer than all of the data inputs to the logic block.

Figure 17:
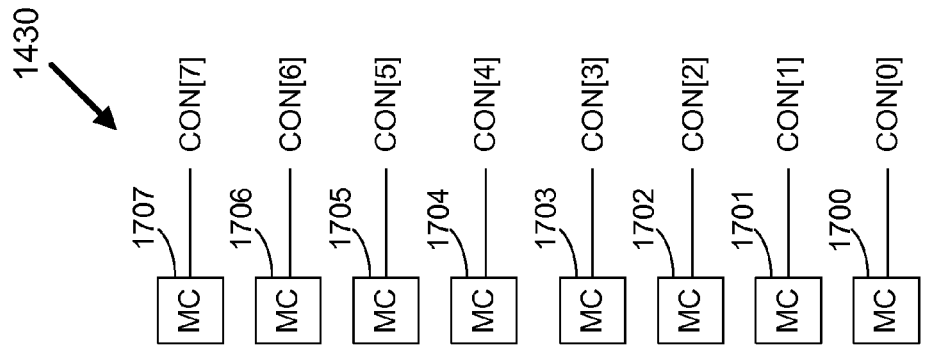
FIG. 17 illustrates one embodiment of the constant generator circuit included in the logic block of FIG. 14.

FIG. 17 shows a straightforward implementation that can be used for constant generator circuit 1430. The circuit simply includes eight memory cells (MCs) 1700-1707. These memory cells can be configuration memory cells in a field programmable IC, for example, and the values can be loaded into the configuration memory cells during a programming step, as is well known. The outputs of the memory cells, CON[7:0], provide the multi-bit output of the constant generator circuit.

Returning again to FIG. 14, note that input multiplexer circuit 1460 is a cascading input structure with respect to input Z[7:0]. In other words, input Zi[7:0] (the "cascade input" provided by the Z input multiplexer of a logic block immediately below logic block 1400) may be optionally selected as input Z[7:0], and output Zo[7:0] (the "cascade output") is provided to the Z input multiplexer of a logic block immediately above logic block 1400. This cascade feature can be very useful when combining multiple copies of logic block 1400 to create large functions, as is later shown and described.

Multiplier circuit 1470 includes a multiply block 1440, one-hot circuit 1420, multiplexers 1404-1407, and storage elements 1414-1417, coupled together as shown in FIG. 14. The multiplier circuit portion of the logic block is used to perform some, but not necessarily all, functions of the multiplication process, as is now described in conjunction with FIGS. 18-32. The remainder of the multiplication process, the addition of partial products, is performed in the lookup table circuit portion 1480 of the logic block 1400.

Figure 18:
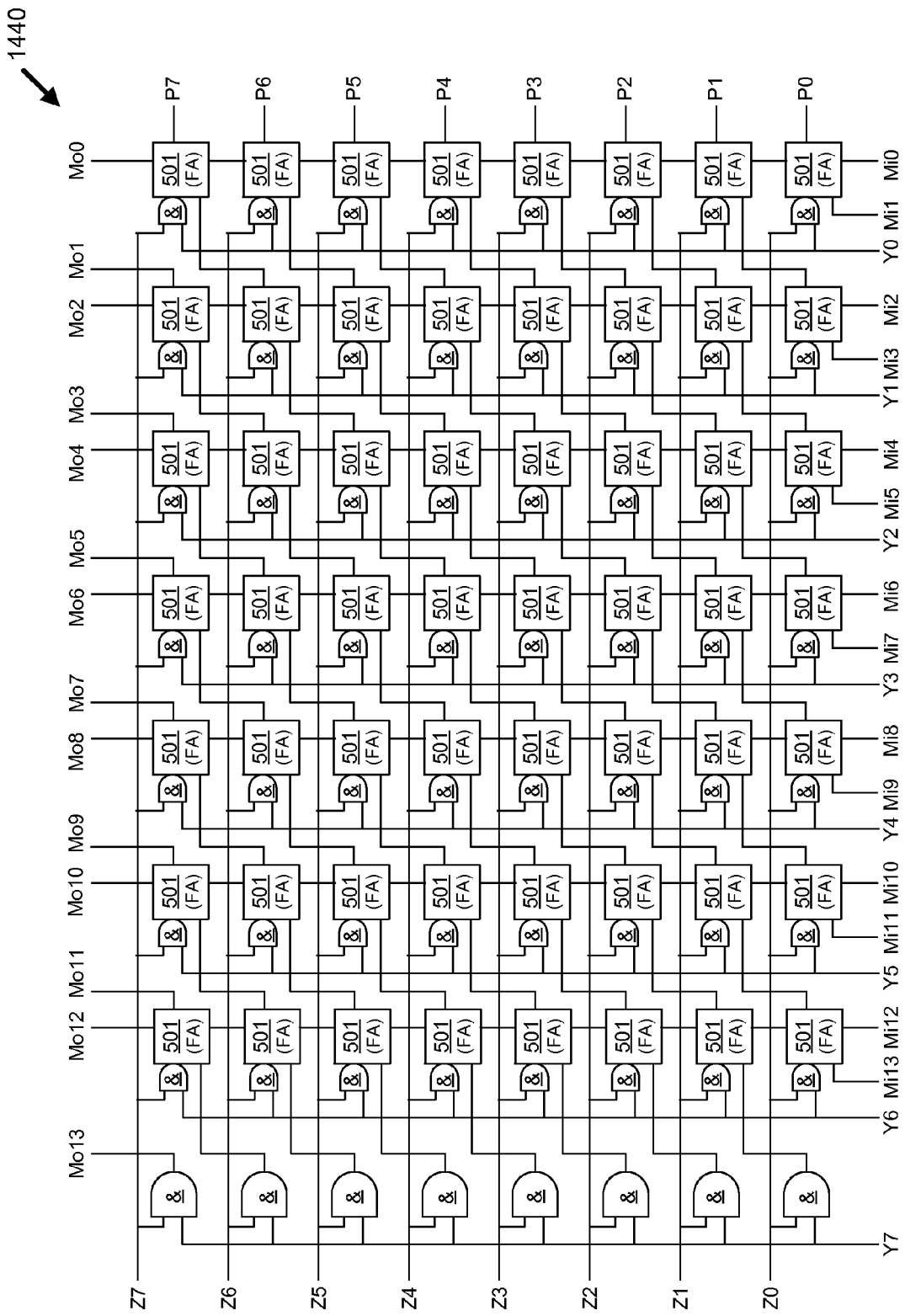
FIG. 18 illustrates a non-uniform array multiplier block that can be used in the logic block of FIG. 14.

FIG. 18 illustrates a non-uniform multiply block that can be used to implement multiply block 1440 of FIG. 14. While the uniform array of multiplier block 500 of FIG. 5 could be used to implement multiply block 1440, there are advantages to omitting some circuits as shown in FIG. 18. For example, the multiply block is somewhat smaller due to the omission of one column of full adders, with the final column of full adders being implemented in one or more logic circuit(s) coupled to the multiply block(s) (i.e., LUT circuit 1480 of FIG. 14). Another advantage is gained by eliminating the 8-bit X[7:0] input bus from the multiply block, and providing this input to the lookup table circuit instead. The lookup table circuit can perform the add function previously performed by the multiplier, but can also perform many other useful functions. Additionally, shifting the final add function to the lookup table circuit permits the input and output busses to be routed as a unit, rather than routing one of the bits separately, as described below in relation to FIG. 22.

Multiply block 1440 includes a non-uniform array of sub-circuits, with 8 rows and 8 columns of sub-circuits being included. In the leftmost column, each sub-circuit includes a logical AND gate (labeled "&"). In the pictured embodiment, the sub-circuit is a simple implementation of a logical AND gate. In some embodiments, as is later described in connection with signed multiplication (see FIGS. 30-32), the logical AND gates in each sub-circuit of this column may have an optionally inverted output (i.e., the logical AND gates are programmable to function as NAND gates). In the rightmost seven columns, each sub-circuit includes a logical AND gate (labeled "&") and a full adder circuit 501 (FA). This full adder circuit may be the same as the full adder circuit 501 of FIGS. 5 and 6, for example, or it may be a different implementation. In some embodiments, as is later described in connection with signed multiplication, the logical AND gates in the top row of sub-circuits may have an optionally inverted output. Full adder circuits are well known to those of skill in the relevant arts.

The multiplier circuit of FIG. 18 implements the arithmetic function:

$$Y[7:0]*Z[7:0]=P[7:0]$$

where the output P[7:0] comprises the lower eight bits of the output of the function. Multiple copies of logic block 1400 including multiply block 1440 can be combined to implement larger multipliers, as will now be described.

Figure 19:
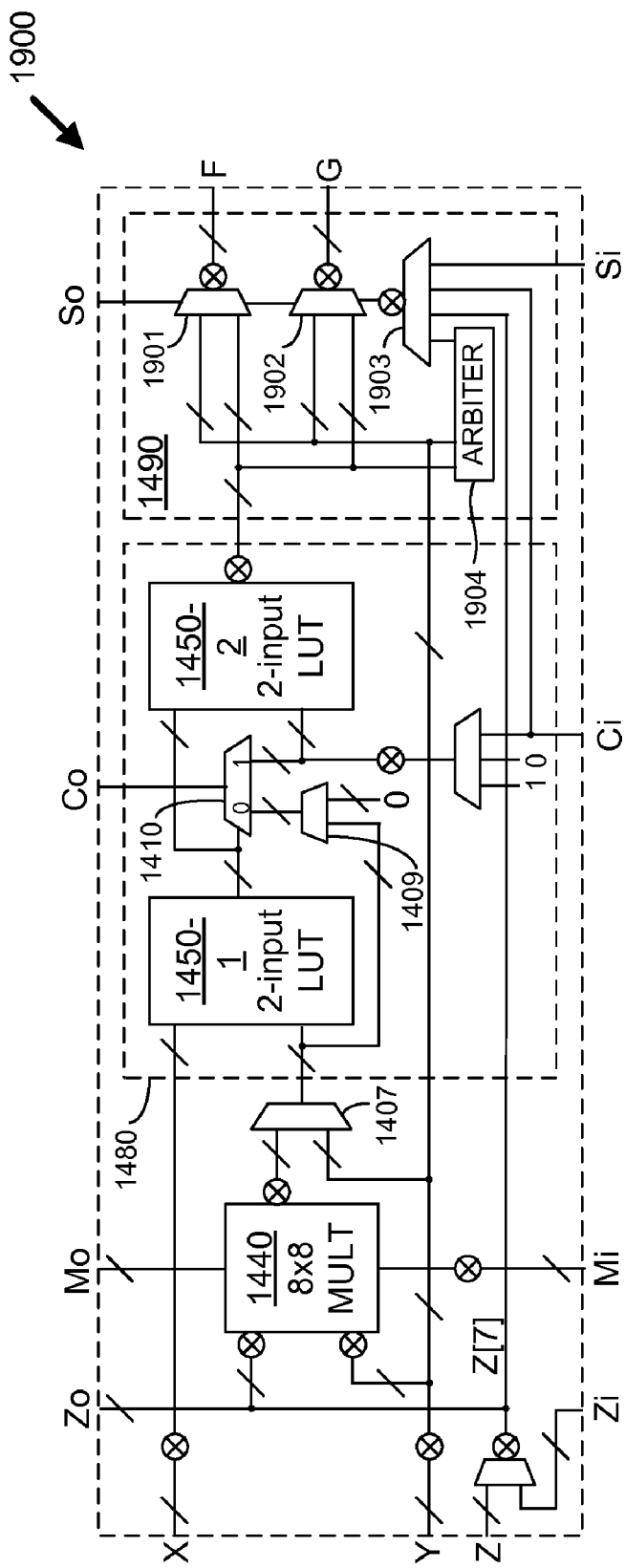
FIG. 19 is a simplified depiction of the logic block of FIG. 14.

FIG. 19 is a simplified depiction 1900 of the logic block of FIG. 14, which is useful in the following examples of how logic block 1400 can be programmed to implement various functions. Notice that logic block 1900 includes some details of the output multiplexer circuit 1490 that are useful in depicting the output paths and signals of the logic block. (In the present specification, the same reference characters are used to refer to terminals, signal lines or busses, and their corresponding signals.) As depicted in FIG. 19, output multiplexer circuit 1490 includes two multi-bit output multiplexers 1901 and 1902 providing outputs F and G, respectively, an S-chain (select chain) multiplexer 1903, and an arbiter circuit 1904, coupled together as shown in FIG. 19. The functions of these elements are further described below in conjunction with the figures pertaining to the output multiplexer circuit.

The terms "output circuit" and "output multiplexer circuit" as used herein are used to describe the circuit driving the outputs of the illustrated logic blocks. In the illustrated self-timed circuits, the output circuits or output multiplexer circuits provide timing at the outputs of the logic blocks. However, in some embodiments the timing is provided by similar circuits inserted at the inputs of the logic blocks, rather than at the outputs of the logic blocks. Or, to think of it another way, the term "logic block" is intended to include the combination of an output circuit (e.g., 1490) in a first illustrated logic block (e.g., 1400/1900), and a logic circuit (e.g., 1480) in a second illustrated logic block (e.g., 1400/1900), as well as the combination of a logic circuit and an output circuit illustrated in the same figure herein.

In this depiction of logic block 1400, a storage element is depicted as a circle containing an "X". Some circuit elements not essential to the understanding of the various examples are omitted from this depiction, for clarity. A multi-bit bus is indicated by a slash mark, rather than by a bolded line. Reference to FIG. 14 can help to identify which elements and lines are multi-bit elements.

FIGS. 20 and 21 show two different but similar programmed logic blocks that can be implemented using logic block 1900. In FIGS. 20 and 21, a bolded line indicates a signal or bus path utilized in the implementation. Both of these logic blocks are used in creating larger multipliers from arrays of logic blocks 1400.

FIG. 20 illustrates how the logic block of FIGS. 14 and 19 can be used to implement a first multiplier function, MULT1. The input X (a shorthand notation for X[7:0] in the illustrated embodiments) is passed to the first input of LUT 1450-1. The input Zi from the logic block adjacent below logic block 2000 is passed to the multiply block 1440, as is the Y input. The multiply block is used, multiplying Y*Z, and the output of the multiply block is passed to the second input of the first lookup table (LUT) 1450-1, as well as to the first data input (the "0" input) of the carry multiplexer 1410. The first LUT 1450-1 is programmed to implement an exclusive-OR function. The carry in input Ci is passed to the second data input (the "1" input) of the carry multiplexer 1410. The second LUT 1450-2 is programmed to implement an exclusive OR function. The output of the second LUT 1450-2 is passed to the F output as output P, or P[7:0]. The Y input is passed through to the G output as output Y, or Y[7:0].

FIG. 21 illustrates how the logic block of FIGS. 14 and 19 can be used to implement a second multiplier function, MULT2. Logic block 2100 is substantially similar to logic block 2000. However, in logic block 2100, the Z input is provided from the left, rather than on the Z cascade chain from the logic block adjacent below logic block 2100. As will be apparent to those of skill in the art, the Z input may in actuality come from any direction (left, right, above, or below), but the depiction illustrated in FIG. 21 clearly shows that the Z input does not come from the Z cascade input Zi, but from another source.

Figure 22:
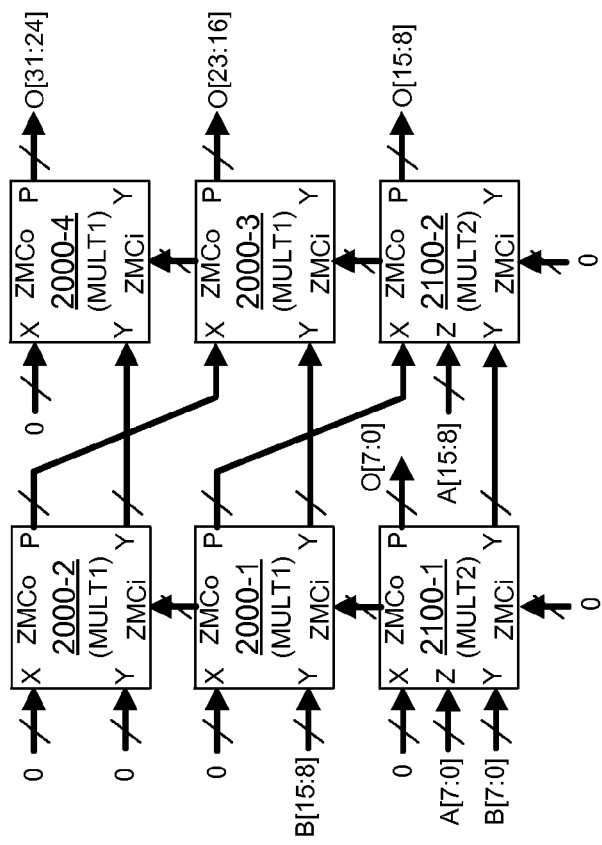
FIG. 22 illustrates how a 16×16-bit unsigned multiplier with a 32-bit output can be implemented using the logic block of FIGS. 20-21.

FIG. 22 illustrates how six instances of logic block 1400 can be used to implement a 16×16-bit unsigned multiplier having inputs A[15:0] and B[15:0] and a 32-bit output O[31:0]. Input bits A[7:0] drive the Z input of the lower left logic block (2100-1), which is configured as a MULT2 block (the Z input bits come from the left side of the logic block as pictured in FIG. 21). Input bits A[15:8] drive the Z input of the lower right logic block (2100-2), which is also configured as a MULT2 block. Note that all other logic blocks 2000-1 through 2000-4 (i.e., all logic blocks above the bottom row) are configured as MULT1 blocks (the Z inputs come from the adjacent logic block below, in FIG. 22 as part of the "ZMCi" input bus). Thus, the Z input for all logic blocks in the left-hand column is A[7:0], and the Z input for all logic blocks in the right-hand column is A[15:8].

The Y input for each logic block in the bottom row is B[7:0], with the Y value being fed through the logic block on the left to the logic block on the right (see FIG. 21 for the Y feedthrough). Similarly, the Y input for each logic block in the middle row is B[15:8], and the Y input for each logic block in the top row is all zeros. Each initial bit of the ZMCi bus (consisting of the Z-bus, the M-bus, and the carry chain input Ci) is tied to ground. Bits O[7:0] of the output are provided by logic block 2100-1; bits O[15:8] of the output are provided by logic block 2100-2; bits O[23:16] of the output are provided by logic block 2000-3; and bits O[31:24] of the output are provided by logic block 2000-4.

One advantage of the embodiment of FIG. 14 may now be discerned by comparing the multiplier implementation of FIG. 22 with the multiplier implementation depicted in FIG. 11. Both implementations provide a 16×16-bit multiplier with a 32-bit output. However, in the implementation of FIGS. 5 and 11, as previously described, the least significant bit X[0] of input X is separately stored and routed, as is the most significant bit P[7] of output P. In the embodiment of FIGS. 14 and 22, each internal data bus in the multiplier structure can be treated as a unit. Therefore, all bits of each bus can be collectively stored and routed, e.g., as shown in FIG. 22. To put it another way, all bits in each internal N-bit data bus in the multiplier originate at the same first logic block and terminate at the same second logic block. Thus, the routing software for the embodiment of FIGS. 14 and 22 may be simpler and faster in execution than the routing software for the embodiment of FIGS. 5 and 11. Further, the routing layout is simpler and faster to implement, because all of the signals in the bus can be routed together.

Figure 23:
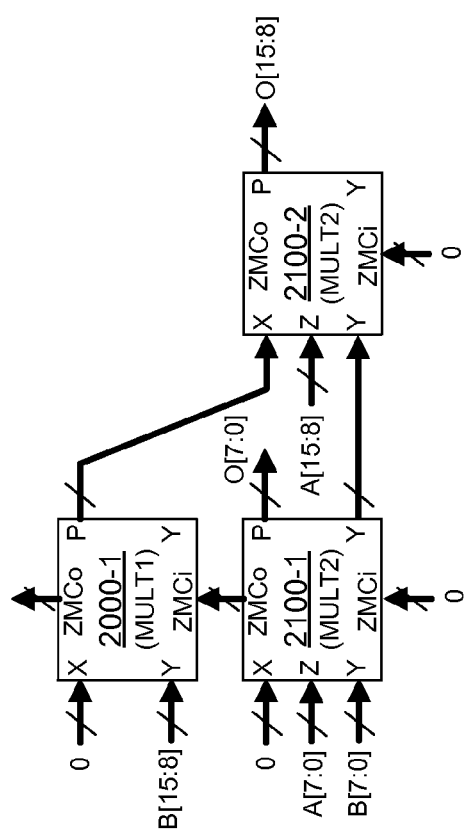
FIG. 23 illustrates how a 16×16-bit unsigned multiplier with a 16-bit output can be implemented using the logic block of FIGS. 20-21.

FIG. 23 illustrates how three instances of logic block 1400 can be used to implement a 16×16-bit unsigned multiplier having inputs A[15:0] and B[15:0] and a 16-bit output O[15:0]. The lower 16 bits of the product output are provided in this embodiment. A comparison of FIGS. 22 and 23 reveals that the multiplier of FIG. 23 includes a portion of the multiplier of FIG. 22, with the logic blocks not needed to produce the lower 16 bits of the output being removed. Note also that one less logic block is needed to implement the 16×16-bit multiplier with a 16-bit output than in the embodiment of FIG. 10, for example.

Figure 24:
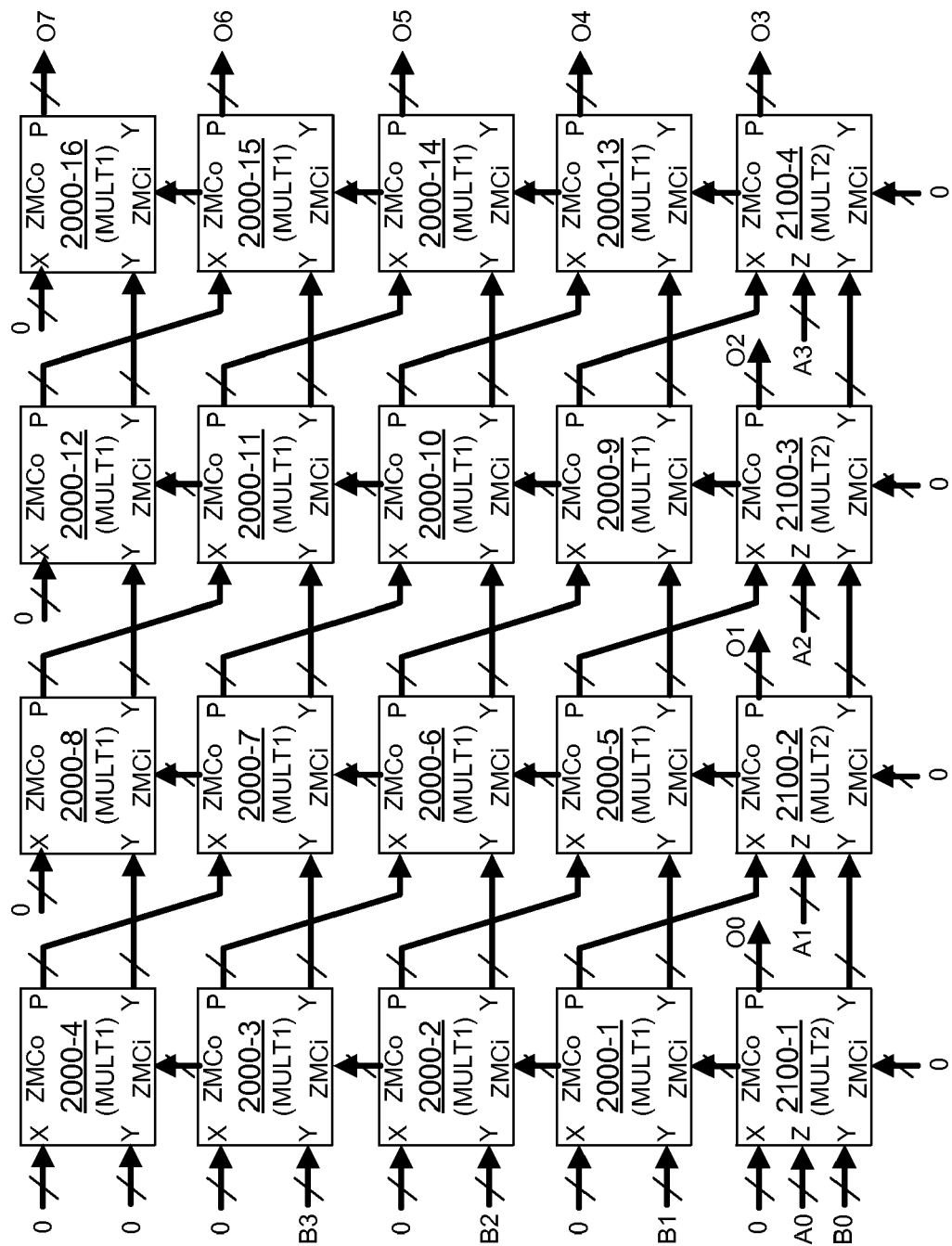
FIG. 24 illustrates how a 32×32-bit unsigned multiplier with a 64-bit output can be implemented using the logic block of FIGS. 20-21.

FIG. 24 illustrates how 20 instances of logic block 1400 can be used to implement a 32×32-bit unsigned multiplier with a 64-bit output. For clarity, FIG. 24 introduces a new notation, in which the 8-bit bus A[7:0] is labeled "A0", bus A[15:8] is labeled "A1", bus A[23:16] is labeled "A2", and so forth. Similar notation is used for the B input and the O output of the multiplier.

The implementation of FIG. 24 includes four instances of logic block 2100 (2100-1 through 2100-4) and 16 instances of logic block 2000 (2000-1 through 2000-16), coupled together as shown in FIG. 24. The array of logic blocks can conceptually be divided into two separate portions. The first portion of the array includes the lower 16 logic blocks (logic blocks 2100-1:4, 2000-1:3, 2000-5:7, 2000-9:11, and 2000-13:15). This portion of the array receives the two multiplicands A[31:0] and B[31:0], provides a multi-bit partial product bus, and provides the lower 56 bits of the product output (O[55:0] or O6-O0). The second portion of the array includes the top row of logic blocks. This portion of the array receives the partial product bus from the first portion, and provides from the partial product bus the upper eight bits of the product output (0[63:56] or O7).

FIG. 25 illustrates how ten instances of logic block 1400 can be used to implement a 32×32-bit unsigned multiplier having inputs A[31:0] and B[31:0] and a 32-bit output O[31:0]. The lower 32 bits of the product output are provided in this embodiment. A comparison of FIGS. 25 and 24 reveals that the multiplier of FIG. 25 includes a portion of the multiplier of FIG. 24, with the logic blocks not needed to produce the lower 32 bits of the output being removed.

FIG. 26 illustrates how the implementation of FIG. 25 can be "folded" to produce a more rectangular design, improving the efficiency with which the multiplier can be combined with other circuits. In this example, logic block 2100-4 is moved to a location above logic block 2000-9. Of course, the connections must remain intact to maintain the integrity of the design.

Figure 27:
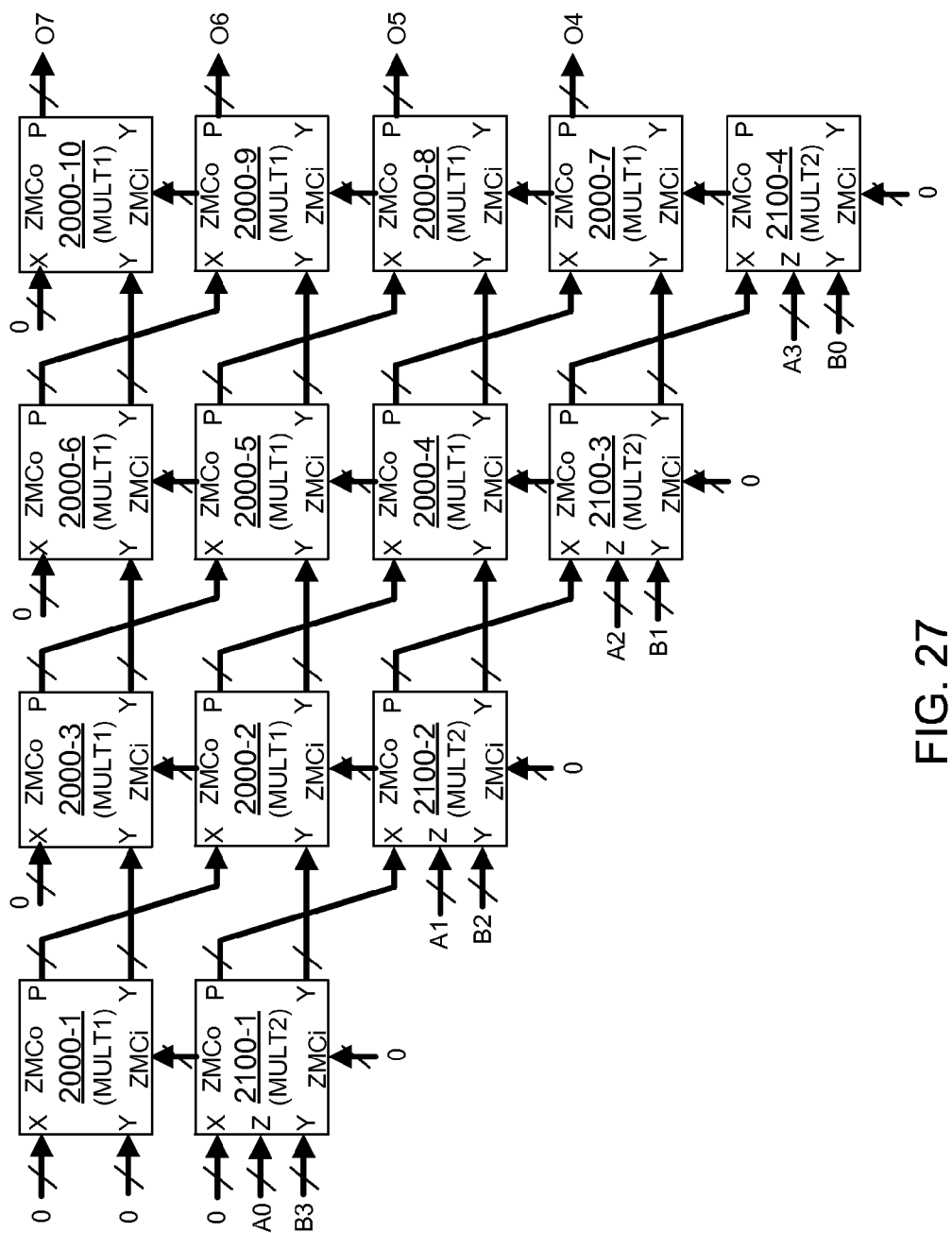
FIG. 27 illustrates how a 32×32-bit unsigned multiplier with a 32-bit output (higher order bits) can be implemented using the logic block of FIGS. 20-21.

FIG. 27 illustrates how 14 instances of logic block 1400 can be used to implement a 32×32-bit unsigned multiplier with a 32-bit output, where the output includes the 32 higher order bits of a 64-bit product. The implementation of FIG. 27 includes four instances of logic block 2100 (2100-1 through 2100-4) and 10 instances of logic block 2000 (2000-1 through 2000-10), coupled together as shown in FIG. 27.

Figure 28:
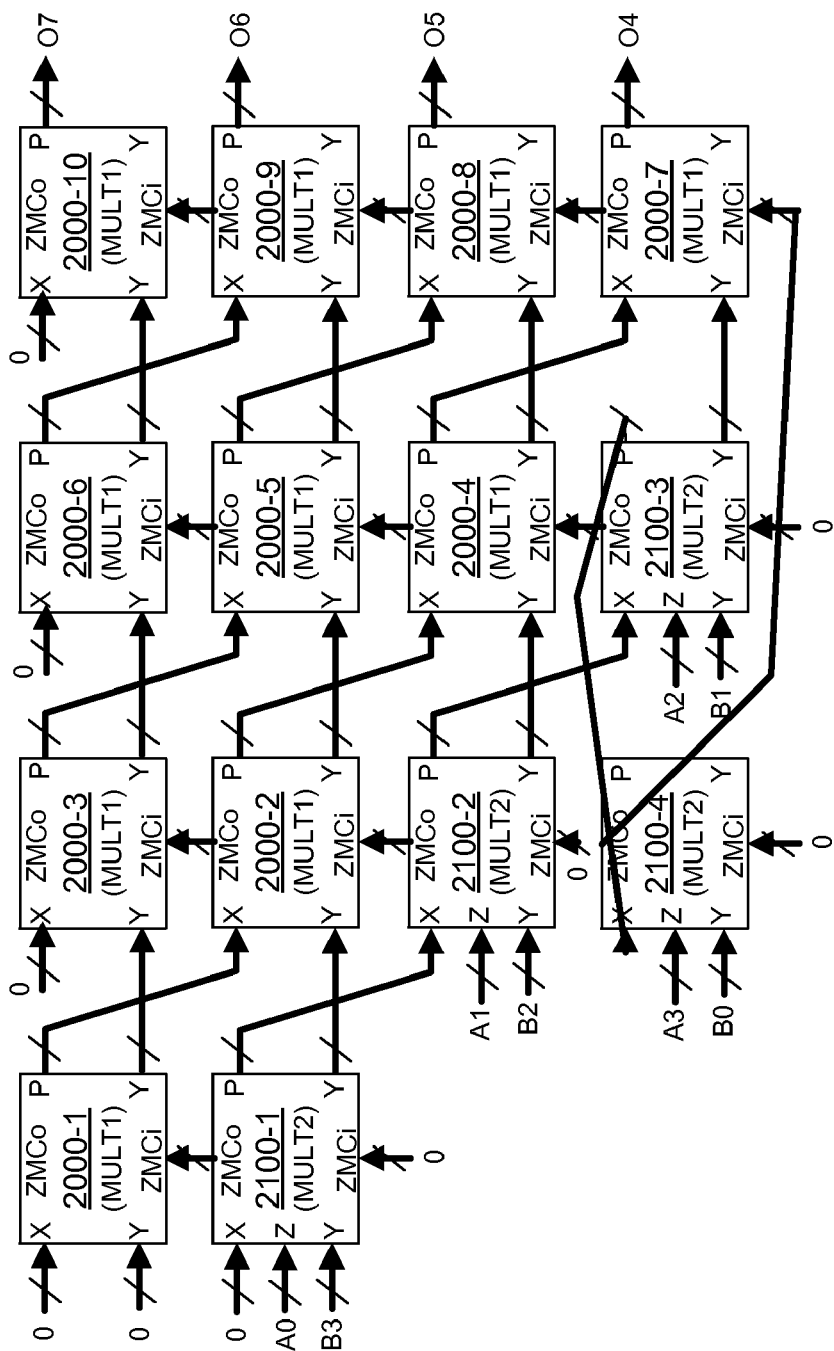
FIG. 28 illustrates a first way in which the multiplier of FIG. 27 can be "folded" to produce a more rectangular design.

FIG. 28 illustrates an exemplary way in which the implementation of FIG. 27 can be "folded" to produce a more rectangular design. In this example, logic block 2100-4 is moved to a location to the left of logic block 2100-3. Of course, the connections must remain intact to maintain the integrity of the design. It will be clear to those of skill in the art that the implementation of FIG. 27 can be "folded" in other ways, e.g., by moving logic blocks 2000-1 and 2100-1 to locations below logic block 2100-2. Non-rectangular multiplier implementations can often be "folded" in one or more ways to produce a more rectangular design, as in these examples, or to otherwise fit the available space in an array of logic blocks. Therefore, the remaining exemplary embodiments illustrate only the most straightforward physical configuration for the implementation.

Figure 29:
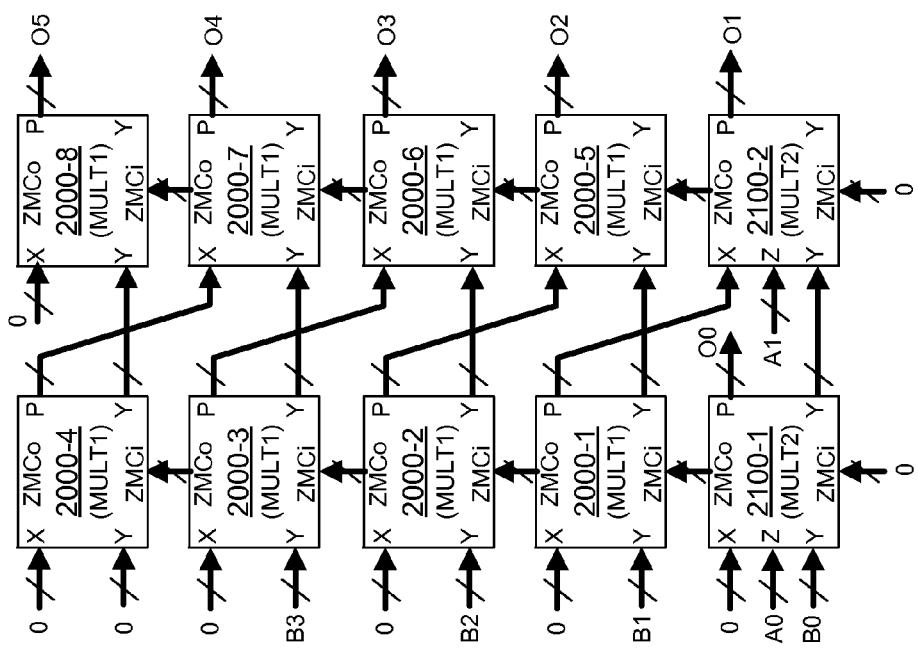
FIG. 29 illustrates a second way in which the multiplier of FIG. 27 can be "folded" to produce a more rectangular design.

FIG. 29 provides an example of a multiplier having inputs of two different sizes. FIG. 29 illustrates how 10 instances of logic block 1400 can be used to implement a 16×32-bit multiplier, where the output includes all 48 bits of a 48-bit product. The implementation of FIG. 29 includes two instances of logic block 2100 (2100-1 and 2100-2) and eight instances of logic block 2000 (2000-1 through 2000-8), coupled together as shown in FIG. 29.

Figure 30:
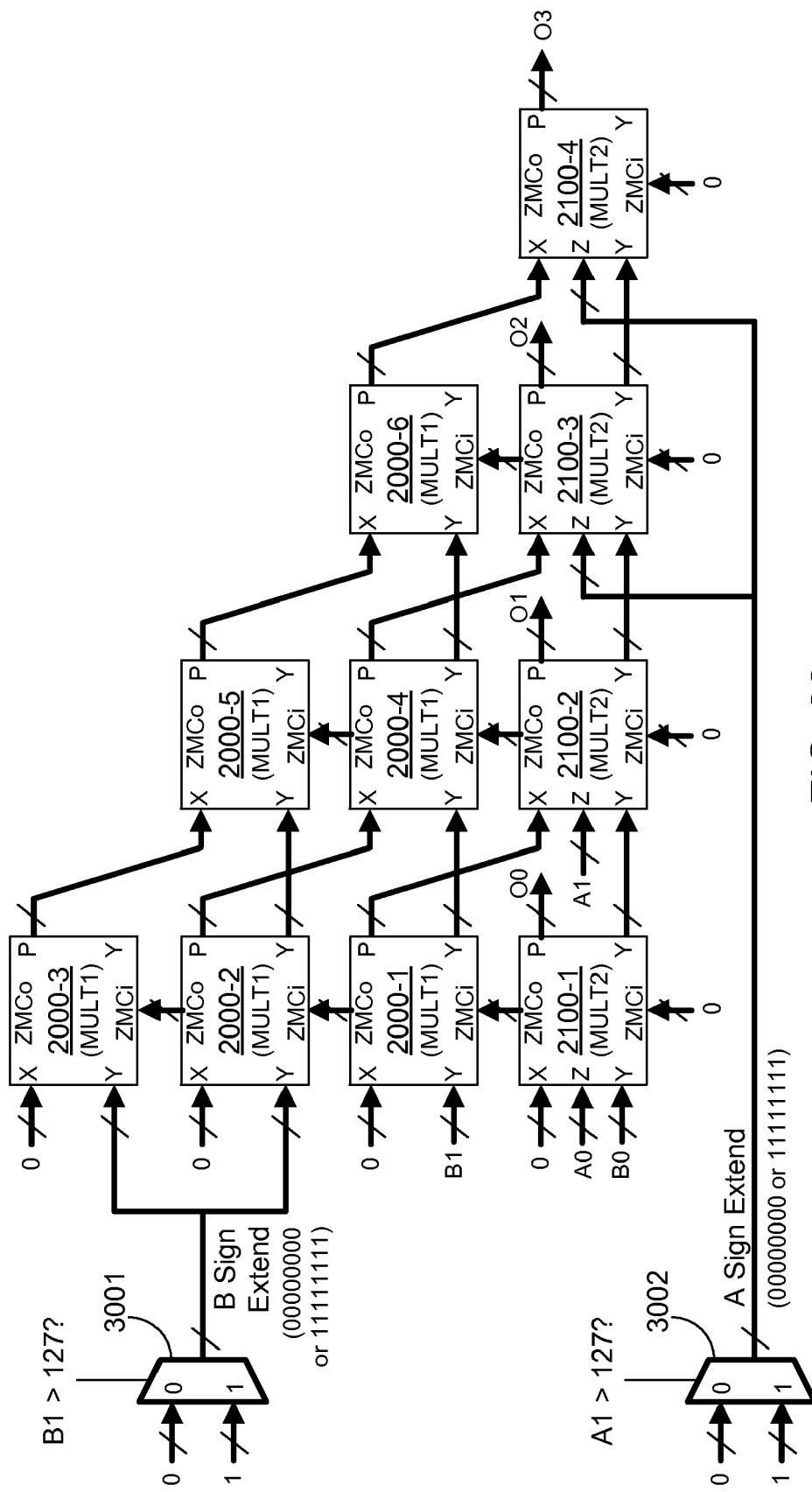
FIG. 30 illustrates a first method, the sign extension method, in which a 16×16-bit signed multiplier with a 32-bit output can be implemented using the logic block of FIGS. 20-21.
Figure 31:
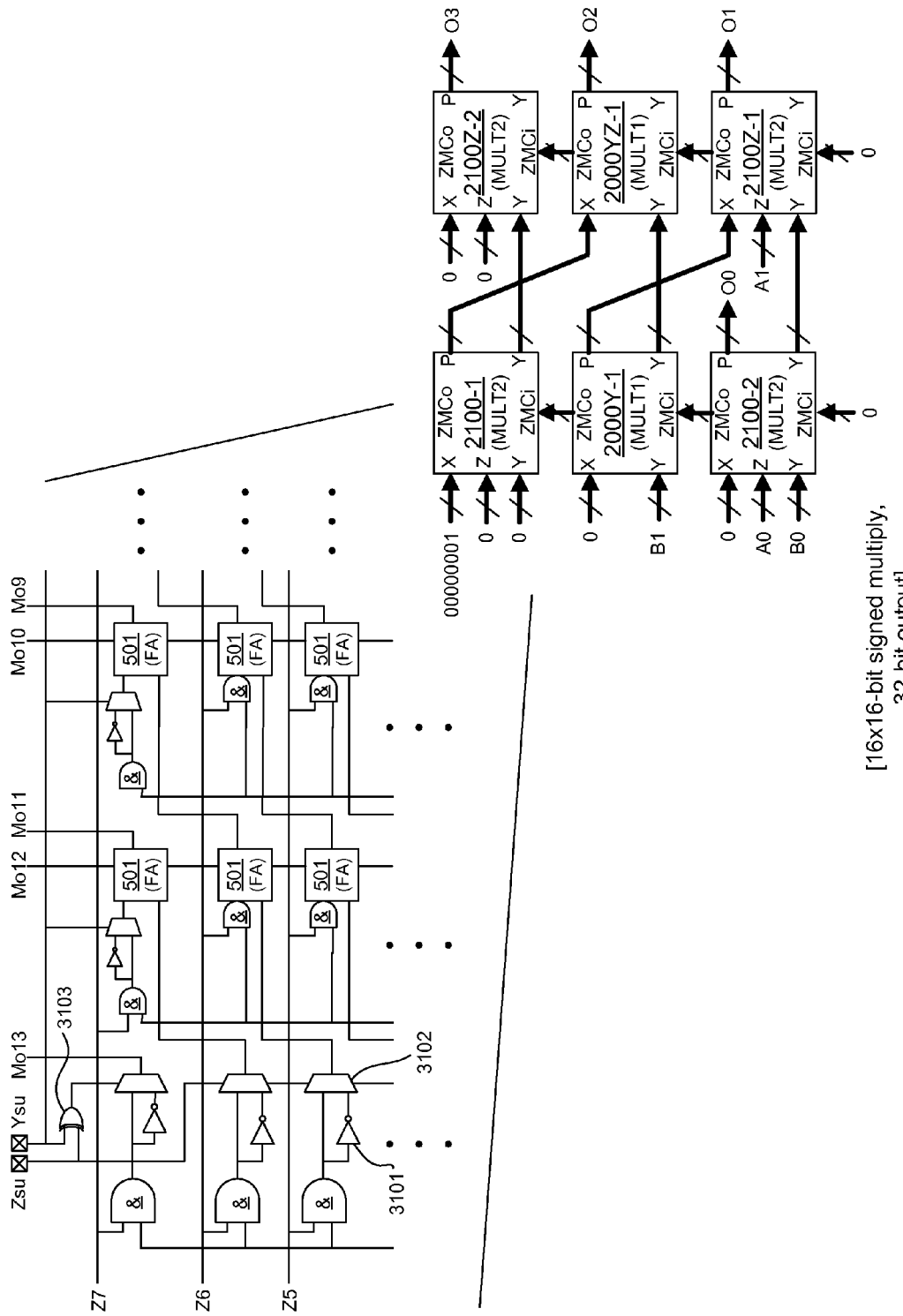
FIG. 31 illustrates a second method, the optional NAND method, in which a 16×16-bit signed multiplier with a 32-bit output can be implemented using the logic block of FIGS. 20-21.
Figure 32:
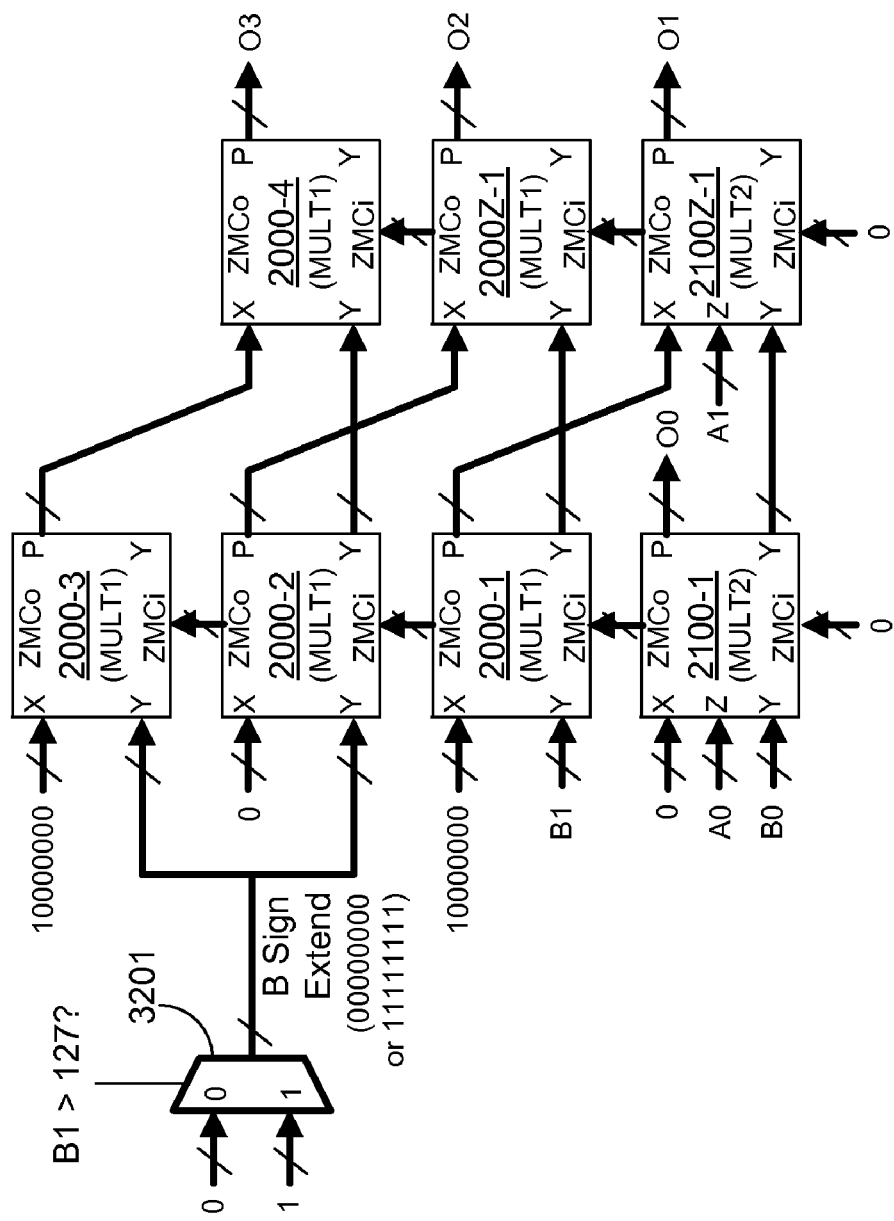
FIG. 32 illustrates a third method, a combination of the sign extension method and the optional NAND method, in which a 16×16-bit signed multiplier with a 32-bit output can be implemented using the logic block of FIGS. 20-21.

The preceding examples have all shown how to implement various unsigned multipliers. However, signed multipliers may also be used in arithmetic computations. When only the lower "T" bits of the output are used, with T being the number of bits in the smallest operand, the multipliers already shown will work for both signed and unsigned multiplication. However, when the output has more than T bits, a signed multiplier implementation differs from that of an unsigned multiplier. Therefore, FIGS. 30-32 illustrate three different embodiments in which a logic block similar to logic block 1400 is used to implement signed multipliers. The three embodiments of FIGS. 30-32 use three different methods of signed multiplication: the sign extension method; the optional NAND method; and a combination of the sign extension method and the optional NAND method. All three embodiments implement a 16×16-bit signed multiplier with a 32-bit output using the logic block of FIGS. 20-21, although minor changes may be required to the multiply block, as will be described.

In the sign extension method, the most significant bit (MSB) of each multiplicand is extended to the left by 16 bits. For example, if the MSB A[15] of input A[15:0] is a "1", the value "11111111" becomes two new most significant bytes A[31:24] and A[23:16] of the A input. Similarly, for example, if the MSB B[15] of input B[15:0] is a "0", the value "00000000" becomes two new most significant bytes B[31:24] and B[23:16] of the B input. A 32×32-bit multiplication is then performed, and the 32 lower bits of the output become the 32-bit product output.

FIG. 30 shows how the sign extension method can be applied to implement a 16×16-bit signed multiplier having a 32-bit output. External logic blocks (e.g., other logic blocks 1400 in the array) are used to implement the sign extension logic, which in the pictured example is implemented as 8-bit multiplexers 3001, 3002. The B sign extension is performed by multiplexer 3001, which passes an all ones value when the B[15] bit is high (e.g., when the value of the B1 byte is greater than 127), and otherwise passes an all zeros value. The A sign extension is performed by multiplexer 3002, which passes an all ones value when the A[15] bit is high (e.g., when the value of the A1 byte is greater than 127), and otherwise passes an all zeros value. The compare functions can be implemented in another copy of logic block 1400, for example, using one of the exemplary compare methods later shown and described herein. The 32×32-bit multiplication is carried out by the array including logic blocks 2100-1 through 2100-4 and 2000-1 through 2000-6, coupled together as shown in FIG. 30.

Note the similarities between the signed multiplier of FIG. 30 and the unsigned 32×32-bit multiplier of FIG. 25. The array of MULT and MULTB blocks is unchanged; only the sign extension logic is added. Therefore, the multiply block used in this embodiment can be the same as multiply block 1440 of FIG. 18, for example.

FIG. 30 illustrates the case where a 32-bit output is desired. When a 16-bit output is desired, the 16-bit output being the lower 16 bits of the product, no sign extension is necessary. The signed multiplier can simply be implemented as shown in FIG. 23. This conclusion can easily be understood by reference to FIG. 30, in which it is clearly seen that the logic blocks having the sign-extended bytes as inputs are not used in producing the lower 16 bits (O1 and O0) of the output.

The sign extension method has the advantages of not requiring any additional logic in the multiply block (e.g., the multiply block of FIG. 18 can be used "as is") and being straightforward of execution. However, the number of logic blocks required to do signed multiplication is much larger than when performing unsigned multiplication. The number of logic blocks necessary to implement a signed multiplier can be reduced by using either of the two following alternative methods.

FIG. 31 shows how the optional NAND method can be applied to implement a 16×16-bit signed multiplier having a 32-bit output. No external logic blocks are needed for this implementation, but some changes to the multiply block are required. Briefly, the multiply block 1440 can be made programmable to add an optional inversion to the AND output in each sub-circuit in the left column and the top row, as shown in FIG. 31. FIGS. 31 and 32 may be more easily understood by noting that a 16-bit signed input (for example) includes one signed byte, and one unsigned byte (the least significant byte). Therefore, a signed multiplication of multiple bytes includes both signed, unsigned, and partially signed multiplication functions. Thus, the ability to programmably elect to have either, both, or neither 8-bit input as a signed input permits the same logic block/multiply block to be used throughout the multiplier. To put it another way, the availability of independent signed and unsigned options for the two multiplier inputs enables the use of an array of substantially similar programmable logic blocks to create large signed multipliers of virtually any size.

When only the Z input of a multiply block is signed, all logical AND gates in the leftmost column are inverted. In the embodiment of FIG. 31, the logical AND gates in the leftmost column are inverted by programming the multiplexers 3102 to select the output of the inverters 3101, rather than the output of the AND gates. The programming is controlled by a value stored in memory cell Zsu. Memory cell Zsu can be, for example, a configuration memory cell in a programmable logic device, or some other type of memory cell. When only the Y input is signed, all logical AND gates in the topmost row are inverted in a similar fashion. The programming of the topmost row is controlled by a value stored in memory cell Ysu. Memory cell Ysu can be, for example, a configuration memory cell in a programmable logic device, or some other type of memory cell.

When both of the Z and Y inputs are signed, all logical AND gates in both the leftmost column and the topmost row are inverted, except for the logical AND gate in the top-left sub-circuit. Because of the double inversion, the output of this logical AND gate remains the same when both inputs are signed. In the pictured embodiment, exclusive OR (XOR) gate 3103 is driven by both memory cells Zsu and Ysu, and controls the multiplexer that selects between the true and inverted AND outputs.

An additional change necessary to implement the multiplier in this embodiment is the addition of the value "1" ("00000001" for an 8-bit multiplier block) in logic block 2100-1 at the upper left corner of array of logic blocks (see FIG. 31).

Note that the methods employed in FIG. 31 to provide a scalable signed multiplier can also be applied to the multiply block of FIG. 5. In other words, each sub-circuit in the leftmost column and the topmost row of FIG. 5 can be amended to have a programmably invertible logical AND gate, as shown in the embodiment of FIG. 31, and an exclusive OR gate can be included in the top-left sub-circuit for the case where two signed numbers are being multiplied together.

These programmable logic blocks can be combined and programmed as necessary to create larger multipliers, e.g., as shown in FIG. 31. The embodiment of FIG. 31 includes four copies of logic block 2100 and two copies of logic block 2000, coupled together as shown in FIG. 31. The states of these logic blocks are indicated as shown in Table 1. For ease of reference, FIG. 18 shows the multiply block included in the referenced logic blocks, which are shown in FIGS. 20-21. Note that not all of the states shown in Table 1 are actually used in the examples illustrated herein. However, the multiplier circuit of FIG. 31 utilizes logic blocks having two signed inputs (2000YZ), two unsigned inputs (2100), a first signed input and a second unsigned input (2100Z), and a first unsigned input with a second signed input (2000Y).

TABLE 1

| Label | Logic Block |
| --- | --- |
| 2000 | Logic block 2000 (no inverted ANDs) |
| 2000Y | Logic block 2000 with the Y input signed (top row of ANDs inverted) |
| 2000Z | Logic block 2000 with the Z input signed (left column of ANDs inverted) |
| 2000YZ | Logic block 2000 with both inputs signed (top row & left column of ANDs inverted, except for top-left AND) |
| 2100 | Logic block 2100 (no inverted ANDs) |
| 2100Y | Logic block 2100 with the Y input signed (top row of ANDs inverted) |
| 2100Z | Logic block 2100 with the Z input signed (left column of ANDs inverted) |
| 2100YZ | Logic block 2100 with both inputs signed (top row & left column of ANDs inverted, except for top-left AND) |

FIG. 32 shows a third option that constitutes a compromise between the sign extension of FIG. 30, which may consume large numbers of logic blocks, and the optional AND inversion of FIG. 31, which requires what may be considered too many additions to the multiply block. In the compromise method of FIG. 32, the B/Y input is sign-extended, and optional NAND gates are used for the A/Z input. Therefore, the outputs of the leftmost column of logical AND gates are optionally inverted. Note that the top-left logical AND gate is not a special case in this embodiment, further simplifying the implementation of the multiply block.

An external logic block (e.g., another logic block 1400 in the array) is used to implement the sign extension logic, which in the pictured example is implemented as 8-bit multiplexer 3201. The B sign extension is performed by 8-bit multiplexer 3201, which passes an all ones value when the B[15] bit is high (e.g., when the value of the B1 byte is greater than 127), and otherwise passes an all zeros value. The compare function can be implemented in another copy of logic block 1400, for example, using one of the exemplary compare methods later shown and described herein.

When the Z input of a multiply block is signed, all logical AND gates in the leftmost column are inverted. An additional change necessary to implement this embodiment of the multiplier is the addition of the value "10000000" in logic blocks 2000-1 and 2000-3 in the left column of the array. The 32×16-bit multiplication is carried out by the array including seven logic blocks, as shown in FIG. 32. The states of these logic blocks are indicated as shown in Table 1.

Figure 50:
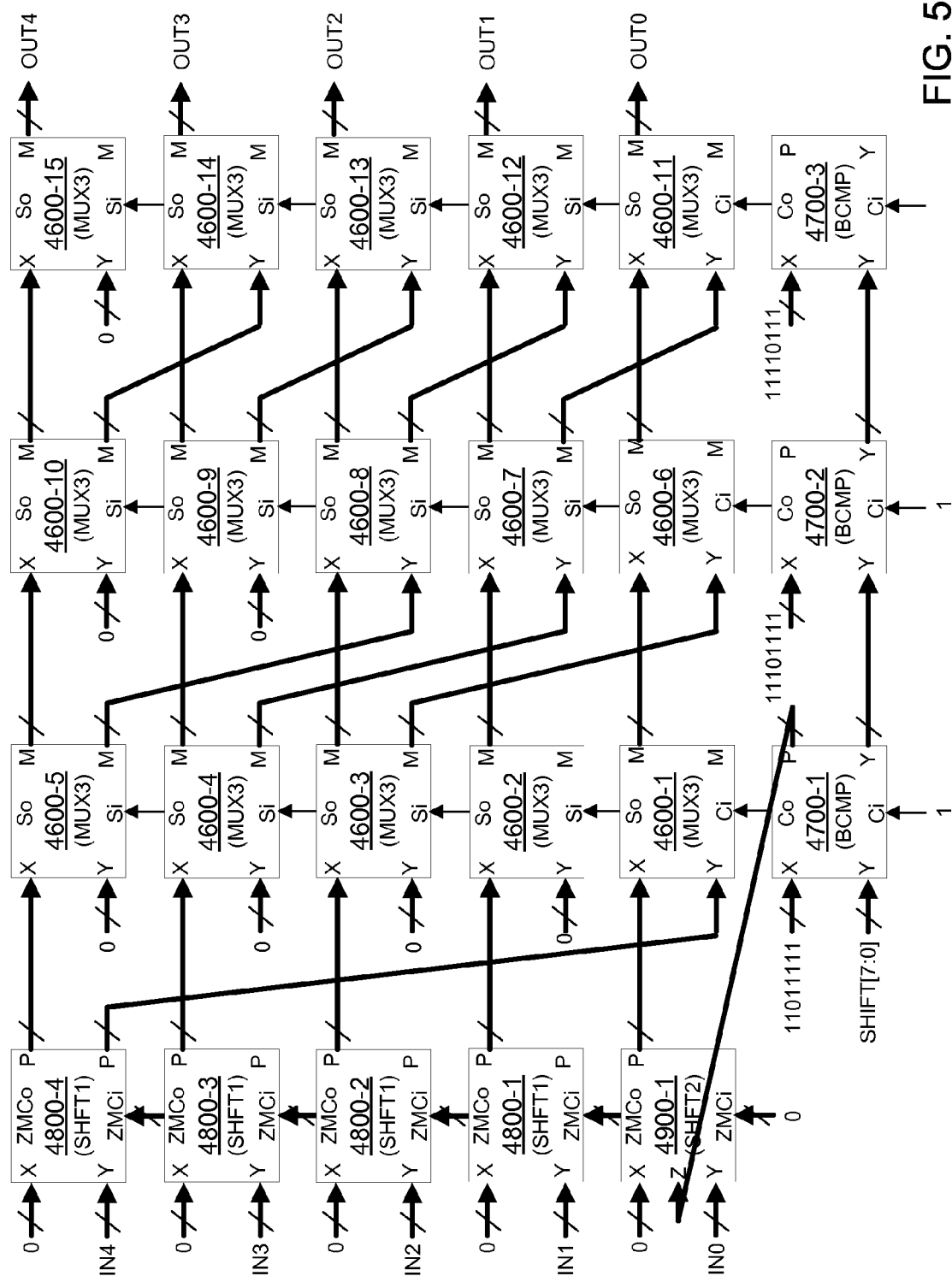
FIG. 50 illustrates an exemplary 40-bit shifter that can be implemented using the logic blocks of FIGS. 46-49.

Returning once again to FIG. 14, the ability to configure the multiplier circuit as a bit shifter is conferred by the addition of one-hot circuit 1420 (2^K), which provides an output that is all zeros except for a "1" in one selectable bit position. In other words, one-hot circuit 1420 implements a 2^K function, with the value of K being selectable. By selecting a bit position for the "1" output, and selecting the output of one-hot circuit 1420 to provide the first multiplicand of multiply block 1440 (e.g., by programming multiplexer 1404), the multiply block can be configured to perform a left-shift of the second multiplicand by K bits. In the pictured embodiment, in which the output of the one-hot circuit is eight bits wide, K can have a value from zero to seven, inclusive. The combination of the Z-bus and one-hot circuit 1420 allows the logic block of FIG. 14 to be used to implement large shifters, as shown in FIG. 50 and as described in conjunction with this figure.

In some embodiments, one input of the multiplier can be set to an all-zeros value (e.g., by appropriately programming multiplexer 1404 in FIG. 14). This option can be selected, for example, when the Z-bus is used but multiply block 1440 is unused. Thus, a changing value on the Z-bus does not cause the multiply block to change state, thereby reducing the power consumption of multiplier circuit 1470.

Figures 33, 34, 35:
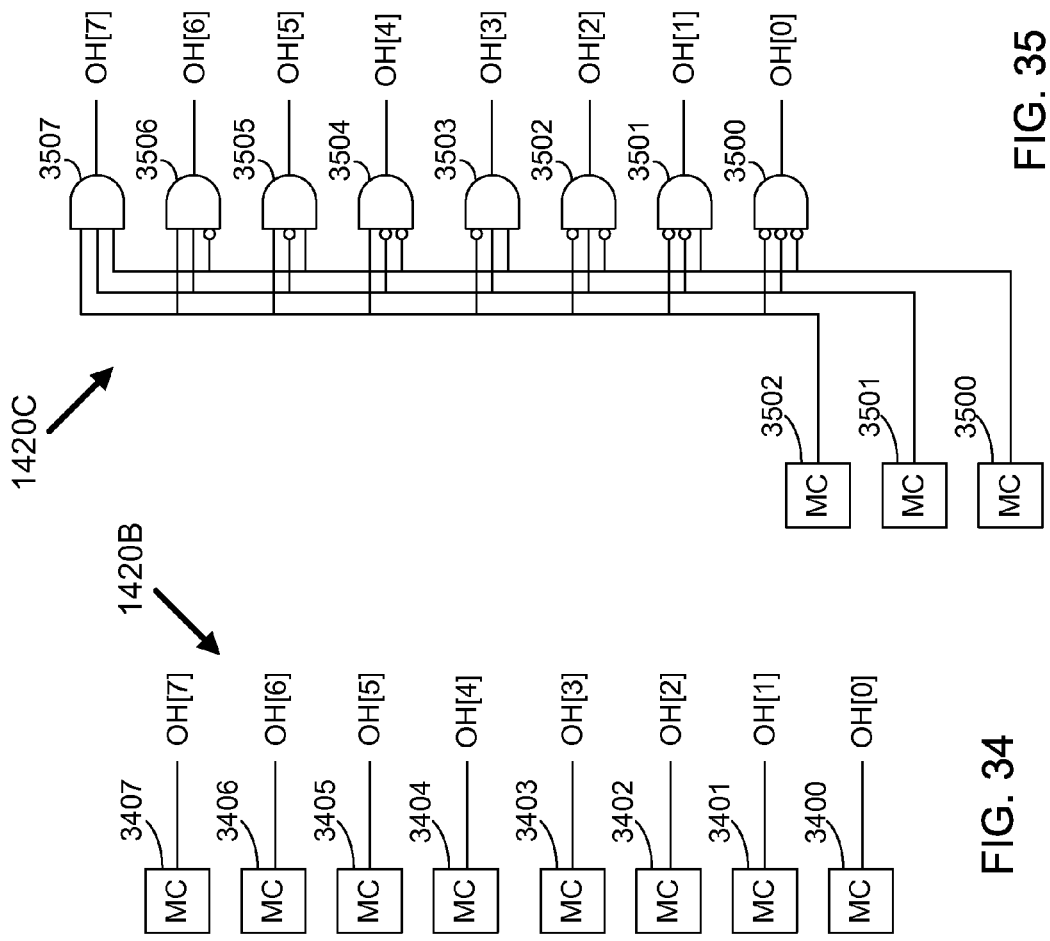
FIG. 33 illustrates a first embodiment of the one-hot circuit included in the logic block of FIG. 14.
FIG. 34 illustrates a second embodiment of the one-hot circuit included in the logic block of FIG. 14.
FIG. 35 illustrates a third embodiment of the one-hot circuit included in the logic block of FIG. 14.

FIGS. 33-35 illustrate three exemplary implementations of one-hot circuit 1420. FIG. 33 shows an implementation 1420A in which the three least significant bits of the Z[7:0] input are decoded using logical AND gates 3300-3307 to produce the one-hot output OH[7:0]. The upper five input bits Z[7:3] are ignored. FIG. 34 shows a second implementation 1420B in which the 8-bit one-hot output value OH[7:0] is simply stored in eight memory cells (3400-3407). The memory cells can be configuration memory cells in a programmable IC, for example. FIG. 35 shows a third implementation 1420C in which only three values are stored in memory cells 3500-3502, and the value is decoded by logical AND gates 3500-3507.

By setting a value of K=0, the output of one-hot circuit 1420 can be set to 00000001 (2^0=1). By selecting this option, the multiply circuit is configured to pass the value Y[7:0] to the output of multiply block 1440. Multiplying by "1", of course, yields an identity function.

In the pictured embodiment, multiplier circuit 1470 of FIG. 14 can also be configured to pass the value Z[7:0] to the output of multiply block 1440, by programming multiplexer 1405 to select a 00000001 value as the second multiplicand.

Further, as has been shown in many illustrated multiplier embodiments in the figures herein, it is common to provide an all-zeros value to the M-bus to initialize the M-bus chain. To simplify this process, multiplier circuit 1470 of FIG. 14 includes a multiplexer 1406 that can optionally select an all-zeros value to pass to the M-bus input of multiply block 1440. Alternatively, the M-bus input Mi[13:0] is provided by the Mo[13:0] output of the logic block adjacent below.

It has been amply demonstrated that multiple copies of the logic block of FIG. 14 can be used to implement various multipliers, using the multiply block and the lookup tables to perform the multiplication steps and the addition of the resulting partial products. However, lookup table circuit 1480 can also be used to implement many other functions, such as addition and subtraction, compare functions, large shift functions, and so forth. It will also be demonstrated that logic block 1400 is well suited to the implementation of software constructs such as if-then statements, while loops, and memory functions. Thus, the structure of FIG. 14 well also provides a logic block well suited for compute-intensive applications.

FIGS. 36-50 provide examples of how the logic block of FIGS. 14 and 19 can be used to implement various arithmetic functions other than multiplication.

FIG. 36 illustrates how the logic block of FIGS. 14 and 19 can be used to implement an addition function, ADD (3600). The X input is passed to the first input of LUT 1450-1. The Y input is passed to the second input of LUT 1450-1, as well as to the first data input (the "0" input) of carry multiplexer 1410. The first LUT 1450-1 is programmed to implement an exclusive-OR function. The carry input ("0" for a first copy of logic block 3600) is passed to the second data input (the "1" input) of the carry multiplexer. The second LUT 1450-2 is programmed to implement an exclusive OR function between the carry input and the output of the first LUT 1450-1. The output of the second LUT 1450-2 is passed to the F output as output S, or S[7:0]. The output S is the sum of the X and Y inputs, with the overflow being carried out on the Co output.

As shown in FIG. 36, logic block 3600 implements an 8-bit adder. To build wider adders, multiple copies of logic block 3600 can be cascaded using the carry chain. The carry input is "0" for the first logic block, as previously noted, and input Ci for subsequent blocks.

FIG. 37 illustrates how the logic block of FIGS. 14 and 19 can be used to implement a subtraction function, SUB. Logic block 3700 is similar to logic block 3600. However, the first LUT 1450-1 is programmed to implement an exclusive-NOR function instead of an exclusive-OR, and the carry input is "1" for a first copy of logic block 3700. The output S is the result of the subtraction of input X from input Y, with the overflow being carried out on the Co output.

As shown in FIG. 37, logic block 3700 implements an 8-bit subtractor. To build wider subtractors, multiple copies of logic block 3700 can be cascaded using the carry chain. The carry input is "1" for the first logic block, as previously noted, and input Ci for subsequent blocks.

FIG. 38 illustrates how the logic block of FIGS. 14 and 19 can be used to implement an equal compare function, ECMP (3800). This function works for both signed and unsigned inputs, and also when one input is signed and other input is unsigned. Note that a "signed" input herein is assumed to be in two's complement notation. As is well known, in two's complement notation a negative number is created by inverting each bit in the number and then adding a "1" value (e.g., adding 00000001 in the illustrated embodiments.) A negative number always has a "1" as the most significant bit (MSB).

In logic block 3800, the X input is passed to the first input of LUT 1450-1, and the Y input is passed to the second input of LUT 1450-1. The first LUT 1450-1 is programmed to implement an exclusive-NOR function. The first data input (the "0" input) of the carry multiplexer 1410 is a "0". The carry input ("1" for a first copy of logic block 3800) is passed to the second data input (the "1" input) of the carry multiplexer. The output of the carry multiplexer 1410 is passed to the Co output as the result of the compare function.

Logic block 3800 functions as follows. Because of the exclusive NOR function in LUT 1450-1, the output of LUT 1450-1 will be high whenever the X and Y inputs are equal, and low whenever any two corresponding X and Y bits are not equal. Therefore, the first unequal pair of bits causes a "0" to be placed on the carry chain. A "0" placed on the carry chain at any point is propagated to the carry out Co of the logic block. Thus, output Co is "1" if the X and & inputs are equal, and "0" if they are not equal.

Larger compare functions can be built by placing additional copies of logic block 3800 above the initial logic block, and selecting the Ci input as the carry chain input for these subsequent logic blocks.

Note that the output of this compare function, as well as the other illustrative compare functions shown and described herein, appears on the Co output. As can be seen from the logic block diagram in FIG. 38 and many other figures herein (e.g., see FIG. 19), the Ci input can optionally be used as a select input for the two output multiplexers 1901 and 1902. Therefore, the Co output can be used in a logic block adjacent above the instant logic block, to select one of two possible output values for outputs F and G. Exemplary situations in which this arrangement proves useful are shown in FIGS. 43 and 45, and described in conjunction with these figures. In other situations, the Co output can be routed through the above-adjacent logic block (e.g., from input Ci through the second LUT 1450-2 and one or both of output multiplexers 1901 and 1902) to the F and/or G output.

FIG. 39 illustrates how the logic block of FIGS. 14 and 19 can be used to implement a first unequal compare function, UCMP (3900). This function only works for unsigned inputs. In the embodiment of FIG. 39, the X input is passed to the first input of LUT 1450-1, and the Y input is passed to the second input of LUT 1450-1, as well as to the first data input (the "0" input) of the carry multiplexer 1410. As in the embodiment of FIG. 38, the first LUT 1450-1 is programmed to implement an exclusive-NOR function. The carry input is passed to the second data input (the "1" input) of the carry multiplexer. The initial carry input is "0" when the compare function being implemented is X<Y, and "1" when the compare function being implemented is X<=Y. The output of the carry multiplexer 1410 is passed to the Co output as the result of the compare function.

Logic block 3900 functions in a similar fashion to the equal comparison of FIG. 38. However, when two corresponding X and Y bits are not equal, the Y bit is placed on the carry chain. Thus, if Y is larger than X, the Y bit is "1", and a "1" is placed on the carry chain. Similarly, if Y is less than X, the Y bit is "0", and a "0" is placed on the carry chain.

As previously noted, when the comparison being implemented is "X<Y", the initial value on the carry chain is a "0". This value will be changed to a "1" (indicating that X is indeed less than Y) only when the two bits are unequal and Y is a "1". However, when the comparison being implemented is "X<=Y", the initial value on the carry chain is a "1". This value will be changed to a "0" (indicating that X is more than Y, i.e., that X<=Y is not true) only when the two bits are unequal and Y is a "0".

FIG. 40 illustrates how the logic block of FIGS. 14 and 19 can be used to implement a function, SCMP (4000), that can be used when implementing a signed unequal compare (see FIGS. 42-43). Logic block 4000 is similar to logic block 3900. However, in addition to the functions of the UCMP logic block, the output of first LUT 1450-1 is provided to the F output, and the Y input is provided to the G output.

FIG. 41 illustrates another function, a first multiplexer function MUX1, that can be used when implementing a signed unequal compare (see FIGS. 42-43). Logic block 4100 implements a multiplexer with two data inputs C and Y, and a select input Z. Referring to FIG. 16, it can be seen that the C input is an 8-bit bus input having the Ci input of the logic block as the least significant bit C[0], and the subsequent bits on the carry chain as the C[1] through C[7] bits of the carry chain.

FIGS. 42 and 43 provide two different views of a signed unequal compare function (A<B). FIG. 42 is a logical view, and FIG. 43 illustrates a specific implementation that uses the logic blocks of FIGS. 39-41. The embodiment of FIGS. 42 and 43 only works when both inputs are signed.

As shown in FIG. 42, a signed unequal compare can be logically modeled using an exclusive-NOR gate and a multiplexer. The most significant bits (MSBs) of the two inputs A and B are the sign bits. Therefore, the MSBs of the two inputs are compared using exclusive-NOR gate 4201. If the two MSBs are the same (i.e., if the output of exclusive-NOR gate 4201 is high), then either both inputs are positive (or zero), or both inputs are negative. In either case, the unsigned unequal compare of FIG. 39 can be used to provide the result (e.g., see logic block UCMP of FIG. 39). Therefore, the unsigned unequal compare output ("Compare Co") is selected by multiplexer 4202. However, since the result in this embodiment is active low, the unsigned unequal compare output is inverted to provide the result. That is, the MSB of the result is high if A<B is not true, and low if A<B is true.

However, if the two MSBs are different (i.e., if the output of exclusive-NOR gate 4201 is low), then one of the inputs is positive and one is negative. In this situation, the sign bit of the B input is used as the compare output. Thus, if the B MSB is low (i.e., the B input is positive and the A input is negative), then the compare output (Result)' is low, because A<B. If the B MSB is high (i.e., the B input is negative and the A input is positive), then the compare output (Result)' is high, because A<B is false.

Thus, FIG. 42 illustrates a signed compare function that checks for A<B.

FIG. 43 illustrates how the signed unequal compare function of FIG. 42 can be implemented using the logic blocks of FIGS. 39-41. The exclusive-NOR gate 4201 is implemented as an "SCMP" logic block 4000-1 (see FIG. 40) having the A input as the X logic block input and the B input as the Y logic block input. If A and B each have more than eight bits, additional bits of the comparator can be implemented by adding one or more copies of the "UCMP" logic block 3900-1 coupled together in series. The Co output of these logic blocks provides the "Compare Co" value shown in FIG. 42.

The SCMP logic block 4000-1 has two outputs, F and G. The F output of logic block 4000-1 provides the output of the exclusive NOR (XNOR) gate to the select input of the multiplexer via the Z input of logic block 4100-1. The G output is the same as the B input to the SCMP logic block (see FIG. 40), and drives the Y input of the MUX1 block 4100-1. In another embodiment, the B input drives the Y input of block 4100-1 directly. However, in the illustrated embodiments each data bus can have a fanout of only one, so a copy of input B is made by traversing logic block 4000-1, as shown.

The MUX1 logic block 4100-1 is used to implement multiplexer 4202 of FIG. 42. The two data inputs are X (01111111) and Y (B), and the Z input (Co from logic block 4000-1) controls the selection. Note that the inversion of the Compare Co value (denoted by a bubble in FIG. 42) is performed in lookup table 1450-2 of logic block 4100 (see FIG. 41). The result is provided (in active low form) on the MSB of the F output of logic block 4100-1.

FIG. 44 illustrates how the logic block of FIGS. 14 and 19 can be used to implement a second multiplexer function, MUX2. In logic block 4400 of FIG. 44, the carry in input Ci is used to select between the X and Y inputs, with the selected value being placed on the F output. The Z input is also selected and placed on the Z-bus, appearing on the Zo output of the logic block.

FIG. 45 illustrates an exemplary adder/subtractor that can be implemented using the logic blocks of FIGS. 20, 38, and 44. The exemplary circuit of FIG. 45 performs the following function:

If (IN1=IN2)

$$S=A-B$$

else $$S=A+B$$

The equals comparison is performed in ECMP logic block 3800-1. If IN1 equals IN2, the carry out Co is high. In the MUX2 logic block 4400-1, a high value on carry in input Ci selects the Y input (a value of negative one) as output F. If IN1 is not equal to IN2, the carry out Co is low. In the MUX2 logic block 4400-1, a low value on carry in input Ci selects the X input (a value of positive one) as output F. In multiplier (MULT1) logic blocks 2000-1 through 2000-4, the value B is multiplied by either positive one or negative one, with the positive or negative one being supplied via the Z-bus from below. The addition of either B or −B to A is performed in the lookup table circuits of MULT1 logic blocks 2000-1 through 2000-4, and the result S of the addition is provided on the P outputs of the MULT1 logic blocks.

FIG. 46 illustrates another way in which the logic block of FIGS. 14 and 19 can be used to implement a multiplexer function, MUX3, that can be used, for example, in implementing a large shifter circuit. Logic block 4600 selects between inputs X and Y, with the selected input being supplied to both F and G outputs as selected value M. Therefore, this multiplexer implementation can be used for fanout as well as to perform the select function. The selection is controlled in a first occurrence of the logic block by the carry in input Ci, and in subsequent occurrences by the same value, carried vertically by a vertical S-chain, i.e., from Si to So.

FIG. 47 illustrates how the logic block of FIGS. 14 and 19 can be used to implement a one-bit compare function, BCMP, that can be used, for example, in implementing a large shifter circuit. Logic block 4700 compares an input Y against an input X. Input X can be a constant, for instance, in which only one bit is a "0", and all other bits are "1"s. Each bit of the Y input is compared to a corresponding bit of the X input. The Y bits corresponding to the "1" bits of the X input are ignored, because the "1" of the X input drives the output of the OR function in LUT 1450-1 high regardless of the value of the corresponding Y bit. Only the bit corresponding to the "0" bit of the X input is tested. If the value of the Y bit is also "0", a "0" is placed onto the carry chain and is carried out to the output. If the value of the Y bit is a "1", a "1" on the carry chain is passed on to the next adjacent carry multiplexer through the carry chain. The Y input is also fanned out to both the F and G outputs.

FIG. 48 illustrates how the logic block of FIGS. 14 and 19 can be used to implement a first bitwise shift function, SHFT1, that can be used, for example, in implementing a large shifter circuit. As noted above in connection with FIGS. 33-35, the logic block of FIG. 14 can be configured as a bit shifter using one-hot circuit 1420. One-hot circuit 1420 provides an output that is all zeros except for a "1" in one selectable bit position. In other words, one-hot circuit 1420 implements a $2^K$ function, with the value of K being selectable. By selecting a bit position for the "1" output, and selecting the output of one-hot circuit 1420 to provide the first multiplicand of multiply block 1440 (e.g., by programming multiplexer 1404 in FIG. 14), the multiply block can be configured to perform a left-shift of the second multiplicand by K bits. In the pictured embodiment, in which the output of the one-hot circuit is eight bits wide, K can have a value from zero to seven, inclusive.

In the embodiments of FIGS. 48 and 49, one-hot circuit 1420 is implemented as shown in FIG. 33, and is therefore controlled by the three least significant bits (LSBs) of input Z. Depending on the values of these three bits, the Y value is multiplied by one of 00000001, 00000010, 00000100, and so forth. In other words, the Y input is shifted left by 0-7 bits. The output P is provided to both the F and G outputs to provide an optional fanout capability.

FIG. 49 illustrates how the logic block of FIGS. 14 and 19 can be used to implement a second bitwise shift function, SHFT2, that can be used, for example, in implementing a large shifter circuit. Logic block 4900 is similar to logic block 4800 of FIG. 48, except that the Z input comes from an external input instead of the logic block adjacent below, a zero is placed on the carry chain instead of Ci (or a "0" can be provided to the Ci input), and the output P is only placed on the F output.

FIG. 50 illustrates how an exemplary 40-bit shifter can be implemented using the logic blocks of FIGS. 46-49. The shifter circuit of FIG. 49 shifts five bytes of data by from zero to 39 bits, the number of bits being determined by a value SHIFT[7:0]. The three LSBs (bits 2-0) of SHIFT[7:0] are decoded in logic blocks 4900-1 and 4800-1 through 4800-4, and shift the inputs IN by from zero to seven bits. Bits 5-3 of SHIFT[7:0] are each compared to a constant having a zero only in that bit. For example, bit SHIFT[5] is compared to "0" in BCMP logic block 4700-1. If SHIFT[5] is "1", the Co output of logic block 4700-1 is high, and the 40-bit input value IN is shifted by four bytes (32 bits) in MUX3 blocks 4600-1 through 4600-5. If SHIFT[5] is "0", the Co output of logic block 4700-1 is low, and the 40-bit input value IN is not shifted, but is simply passed to the right, to the next multiplexer column. Similarly, bit SHIFT[4] is compared to "0" in BCMP logic block 4700-2. If SHIFT[4] is "1", the Co output of logic block 4700-2 is high, and the value is shifted by two bytes (16 bits) in MUX3 blocks 4600-6 through 4600-10. If bit SHIFT[4] is "0", the value is not shifted. Finally, if SHIFT [3] is "1", the Co output of BCMP logic block 4700-3 is high, and the value is shifted by one byte (8 bits), to generate the 40-bit output bus OUT. Otherwise, the value is not shifted.

The exemplary 40-bit shifter of FIG. 50 includes 23 logic blocks. It will be clear to those of skill in the art that similar shifters of larger or smaller sizes can be implemented using similar techniques. For example, a 24-bit shifter uses 11 logic blocks, and a 64-bit shifter uses 35 logic blocks. Further, the comparisons and shifts need not be performed in the order shown, i.e., the columns can be "shuffled", if desired. It will be clear to those of skill in the art that this aspect of the present invention can be implemented using these and many other architectural variations.

The shifter circuit of FIG. 50 provides an example of a type of shifter including a column of shift blocks, at least one compare block, and at least one column of multiplexer blocks. In the pictured embodiment, the shift blocks, the compare blocks, and the multiplexer blocks are all implemented by programming substantially similar logic blocks to function in these capacities. The logic blocks are bus-based, i.e., they have N-bit data inputs and N-bit data outputs, N being an integer greater than one, and operate on the bussed data as an N-bit bus. Thus, the shifter circuit of FIG. 50 provides an example of how a bus-based architecture can be used to implement bit-wise functions, i.e., a bit compare and a bit shift.

Figure 51:
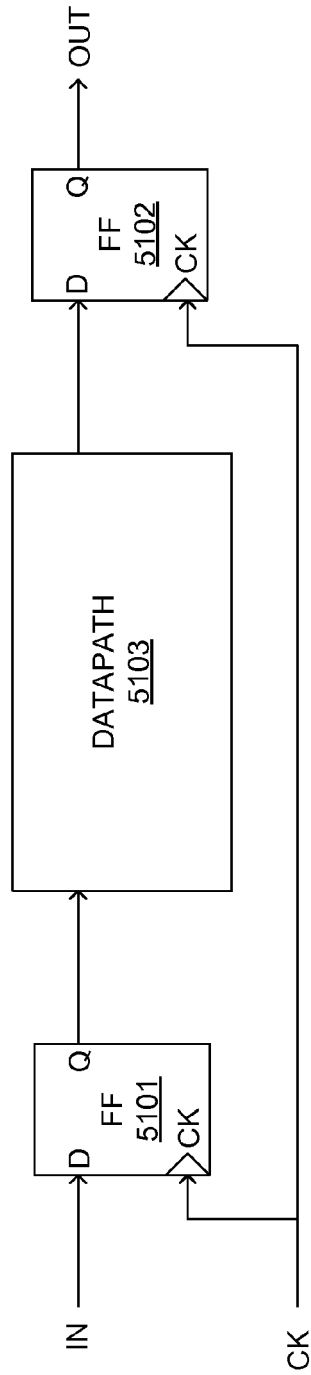
FIG. 51 illustrates a first implementation of the storage logic in the logic block of FIG. 14, in which the storage elements are implemented as flip-flops.

The exemplary circuits that have so far been described can be implemented using a logic block 1400/1900 in which the storage elements are clocked flip-flops or latches, i.e., the logic block is synchronous. For example, FIG. 51 shows a simple example of synchronous pipelining such as can be used in these logic blocks. Flip-flops 5101 and 5102 can correspond to the storage elements (SEs) 1411-1419 in FIG. 14, for example, while datapath 5103 can correspond to the logic between these storage elements. For example, flip-flop 5101 can be storage element 1411, flip-flop 5102 can be storage element 1419, and datapath 5103 can be LUTs 1450-1 and 1450-2. As another example, flip-flop 5101 can be storage element 1416 on the MBUS input, flip-flop 5102 can be the same storage element 1416 in the logic block located above the pictured logic block, and datapath 5103 can be 8×8 multiply block 1440. Flip-flops 5101-5102 can be any flip-flop having a data input D, an output Q, and a clock signal OK. Flip-flops, latches, and synchronous logic are well known to those of skill in the relevant arts. Therefore, further details of the synchronous embodiments are not described herein.

Alternatively, the storage elements of FIGS. 14 and 19 can be implemented using asynchronous or self-timed logic, as shown in the following figures and described in connection with these figures.

Asynchronous or self-timed logic does not use a clock signal. Instead, the circuit includes latches at various points along the datapath. Each latch only changes state when the previous latch on the datapath signals that it has new data ready and the next latch on the datapath acknowledges that it has received the previously-sent data and is ready to receive new data. Thus, each data signal is typically accompanied by two other signals: a ready signal traveling in the same direction as the data, and an acknowledge signal traveling in the opposite direction. However, the logic block of FIG. 14 is bus-based. Therefore, fewer ready and acknowledge signals are required than in most self-timed logic, because the same ready and acknowledge signals are used to control data flow for all eight bits of the data bus.

Figure 53:
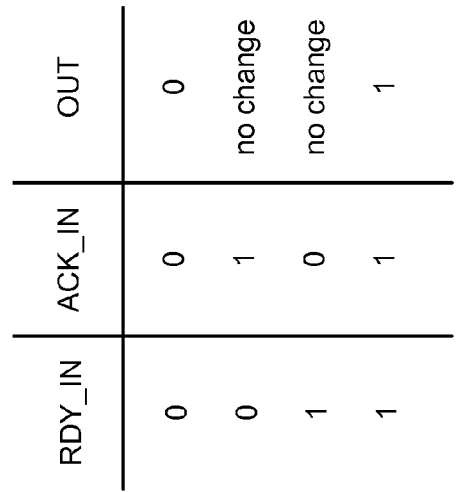
FIG. 53 is a truth table for the C-element of FIG. 52.
Figure 52:
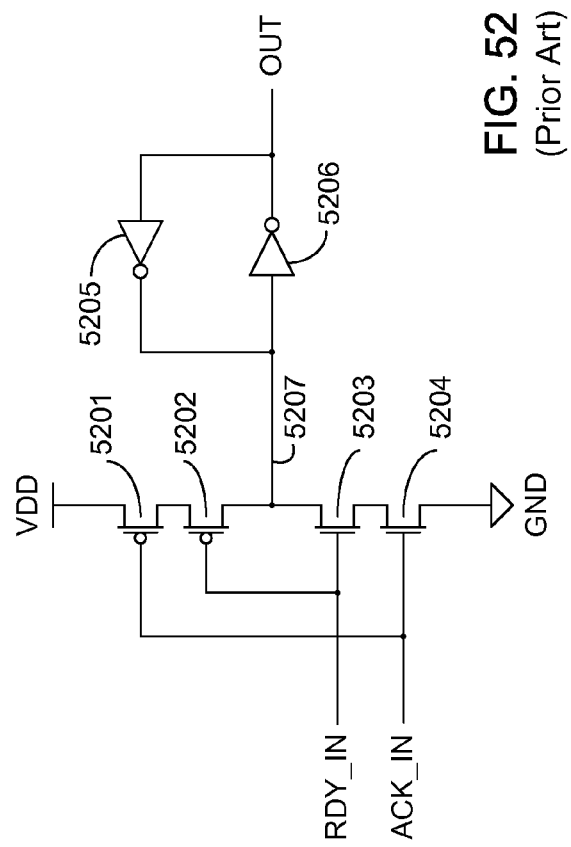
FIG. 52 illustrates a C-element that is commonly used to implement asynchronous logic.

FIG. 52 illustrates a logic element commonly used in self-timed logic: a C-element. Briefly, a C-element has two or more inputs and an output. As long as the values of the inputs are different, the output of the C-element does not change. When all inputs go high, the output goes high. When all inputs go low, the output goes low. This behavior is shown in tabular form in FIG. 53, for a 2-input C-element.

The C-element implementation of FIG. 52 includes P-channel transistors 5201-5202, N-channel transistors 5203-5204, and inverters 5205-5206, coupled together as shown in FIG. 52. When inputs RDY_IN and ACK_IN are both high, internal node 5207 is pulled low through transistors 5203-5204, the low value is latched by inverters 5205-5206, and output OUT goes high. When inputs RDY_IN and ACK_IN are both low, internal node 5207 is pulled high through transistors 5201-5202, the high value is latched by inverters 5205-5206, and output OUT goes low. When inputs RDY_IN and ACK_IN have two different values, the value in the latch does not change, so output OUT does not change value.

Figure 54:
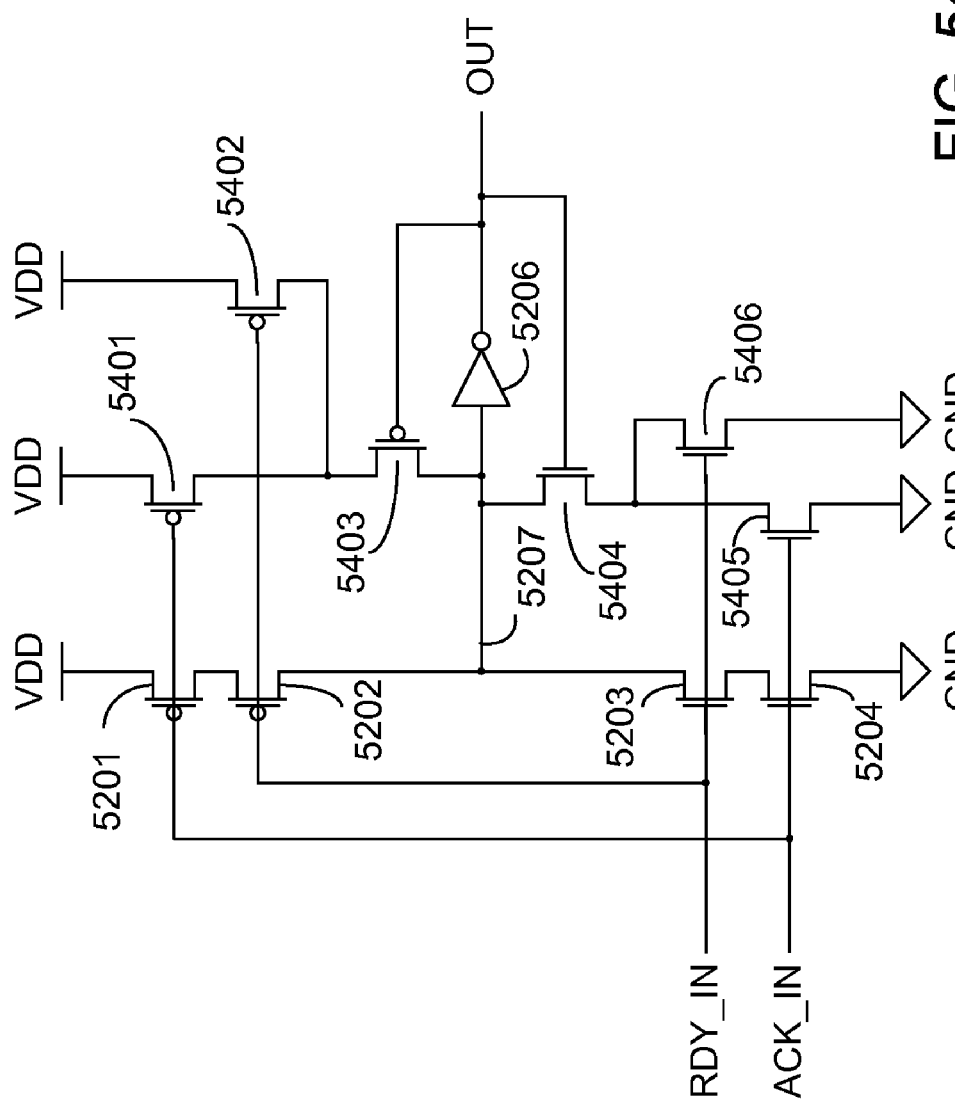
FIG. 54 illustrates an alternate implementation of a C-element.

FIG. 54 illustrates an alternative logic element that can also be used in self-timed logic. The C-element of FIG. 54 is similar to that of FIG. 52 and also exhibits the behavior shown in FIG. 53. However, inverter 5205 is replaced by a more complicated structure including P-channel transistors 5401-5403 and N-channel transistors 5404-5406, coupled together as shown in FIG. 54. In the embodiment of FIG. 54, the feedback path of the latch is turned off whenever the C-element is changing state. For example, when both inputs RDY_IN and ACK_IN go low, the pullup path through transistors 5401-5403 turns on at the same time the pulldown path through transistors 5404-5406 turns off. Similarly, when both inputs RDY_IN and ACK_IN go high, the pulldown path through transistors 5404-5406 turns on at the same time the pullup path through transistors 5401-5403 turns off. Therefore, the value stored in the latch is easily overwritten, whether the stored value is a one or a zero value.

Asynchronous logic is typically implemented using either 4-phase or 2-phase handshake logic. "Handshake logic" is a term commonly used to describe the ready/acknowledge control circuitry in asynchronous circuits.

In 4-phase handshake logic, only one edge of the triggering signal (either ACK_IN or RDY_IN) is used to enable the transfer of new data to the data latches, as in the circuit of FIG. 55. In the pictured embodiments, the falling edge of the triggering signal is used to enable the transfer of new data into the latches. However, it will be clear to those of skill in the art that the circuitry in the embodiments shown herein could be adapted to use the rising edge of the triggering signal for this purpose. Further, the ACK_IN and RDY_IN signals can change value in either order, or simultaneously. However, in all of these situations, in 4-phase mode only the rising or the falling edge of the triggering input signal, and not both, enables a transfer of new data to the latches.

In 2-phase handshake logic, both rising and falling edges of the triggering input signal (either ACK_IN or RDY_IN) are used to enable the transfer of new data to the data latches, as in the circuit of FIG. 56. The ACK_IN and RDY_IN signals can change value in either order, or simultaneously. However, in all of these situations, in 2-phase mode both rising and falling edges of the triggering input signal enable a transfer of new data to the latches FIG. 55 illustrates one way in which 4-phase handshake logic can be used to implement the storage logic in the logic block of FIG. 14. Bolded lines and slash marks are used in FIGS. 55 and 56 to denote multi-bit signals and circuit elements. Latches 5501 and 5502 can correspond to the storage elements (SEs) 1411-1419 in FIG. 14, for example, while datapath 5503 can correspond to the logic between these storage elements. For example, latch 5501 can be storage element 1411, latch 5502 can be storage element 1419, and datapath 5503 can be LUTs 1450-1 and 1450-2. As another example, latch 5501 can be storage element 1416 on the MBUS input, latch 5502 can be the same storage element 1416 in the logic block located above the pictured logic block, and datapath 5503 can be 8×8 multiply block 1440. Latches 5501-5502 can be any latch having a data input D, an output Q, and an enable signal EN.

When each data signal has corresponding ready and acknowledge signals, the datapath itself can be used to time the data. However, the logic blocks described herein are bus-based, with a single ready signal and a single acknowledge signal being used to control all bits of the data bus. Therefore, a delay element 5504 is used to match the delay of the slowest path through the datapath 5503, as shown in FIG. 55. A first C-element 5505 checks for a high value on the RDY_IN input and a low value on the output of C-element 5506. (The circle on the ACK_IN input of C-elements 5705-5706 indicates that the ACK_IN input is inverted on entering the C-element. This inverter is not shown in FIGS. 52 and 54, in order not to obscure the explanation of the C-element functionality.) Once the corresponding RDY_IN is high and ACK_IN is low, the output of the C-element goes high, enabling the corresponding latch to pass new data.

FIG. 56 illustrates one way in which 2-phase handshake logic can be used to implement the storage logic in the logic block of FIG. 14. The handshake logic shown in FIG. 56 is the same as that of FIG. 55, except that the enable signals EN are derived from both the OUT signal and the ACK_IN signal of the corresponding C-element. The enable input EN of latch 5501 is driven by XNOR (exclusive-NOR) gate 5607, which is turn is driven by the output of C-element 5505 and the ACK_IN input of C-element 5505. Similarly, the enable input EN of latch 5502 is driven by XNOR gate 5608, which is turn is driven by the output of C-element 5506 and the ACK_IN input of C-element 5506.

Figure 57:
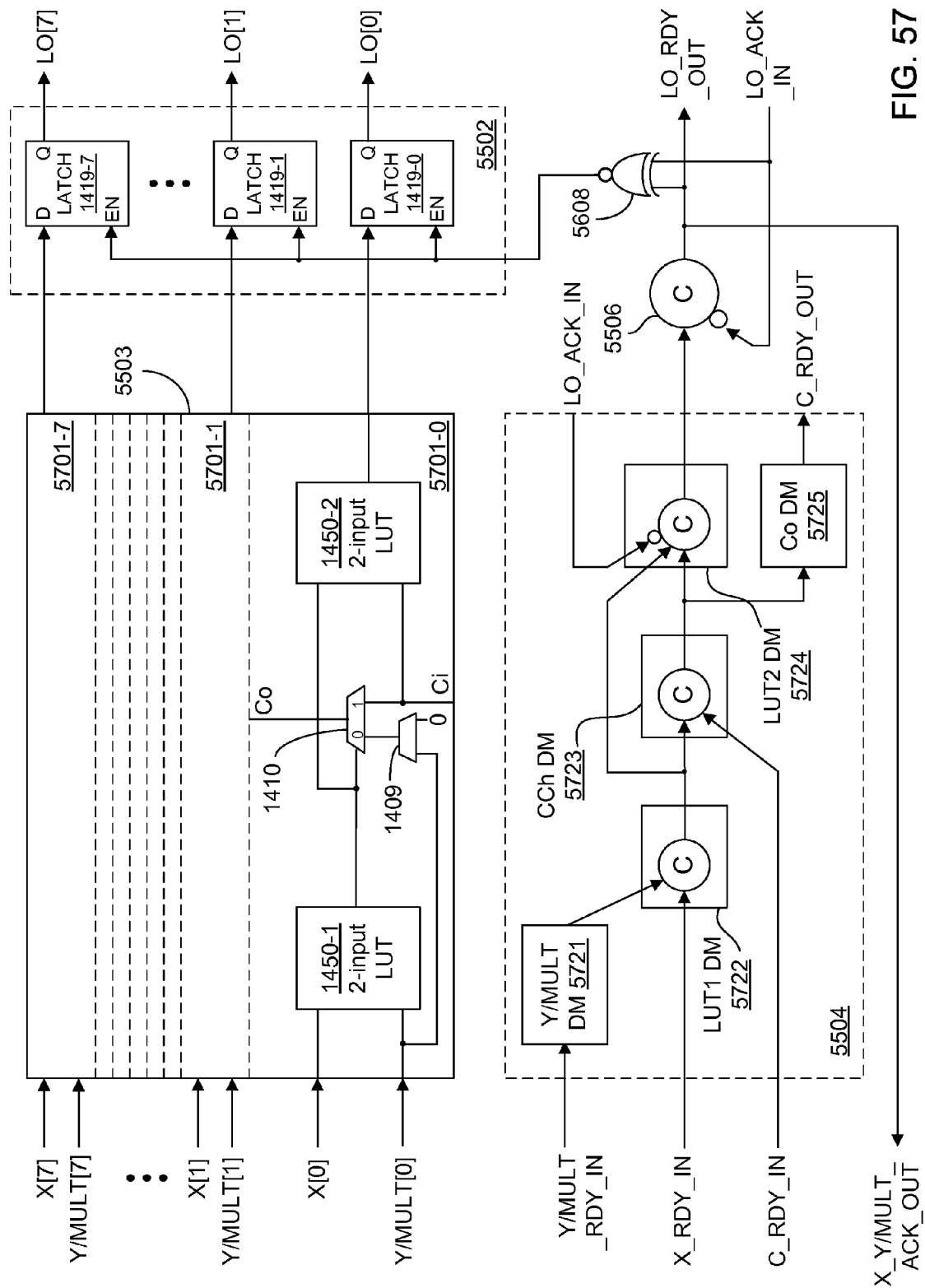
FIG. 57 illustrates how the 2-phase handshaking circuit of FIG. 56 can be applied to the horizontal handshake logic for the lookup table circuit of FIG. 14.

FIG. 57 illustrates how the 2-phase handshaking circuit of FIG. 56 can be applied to the horizontal handshake logic for the lookup table circuit of FIG. 14. Datapath 5503 includes the lookup table circuit portion of FIG. 14. Thus, datapath 5503 includes eight copies of circuit 5701 (5701-0 through 5701-7). Latch circuit 5502 includes eight latches 1419 (1419-0 through 1419-7), driven by the 8-bit output of the second lookup table 1450-2 and providing the lookup table output bus LO[7:0]. C-element 5506 and XNOR gate 5608 correspond to the like-numbered elements of FIG. 56. Note that the eight latches 1419 are commonly controlled by a single handshake circuit, as shown in FIG. 57.

Datapath delay match circuit 5504 illustrates how the delay through the LUT circuit 5701 can be accurately compensated, although the path through the datapath 5503 differs depending on how the lookup table circuit is configured. For example, the carry chain can be utilized or disabled. Clearly, if the carry chain is included in the user circuit implemented in the datapath, the carry chain imposes an additional data delay. The delay from the carry chain within the logic block is matched by delay match element 5723 (CCh DM). Thus, the delay from the carry chain within the logic block can be optionally ignored by configuring the C-element within the delay match element for the second LUT (LUT2 DM 5724) to ignore the output of delay match element 5723. Examples of C-elements with an optional delay capability are provided in FIGS. 63-64 and described in conjunction with these figures.

Further, the output circuit for the carry output of the logic block imposes another additional delay. This delay is matched by another delay match element (Co DM 5725).

Additionally, the Y/MULT input (the output of multiplexer 1407 in FIG. 14) can be utilized in the first lookup table (LUT1 or 1450-1) or ignored. For example, when the first LUT implements only an inverter or a feedthrough path for the X input, the Y input is not used. In these cases, the delay on the Y/MULT input path is irrelevant to matching the datapath delay. Therefore, the delay of the Y/MULT input path is matched by delay match element 5721 (Y/MULT DM), and can be optionally ignored by the C-element in the delay match element for the first LUT (LUT1 DM 5722).

Figure 58:
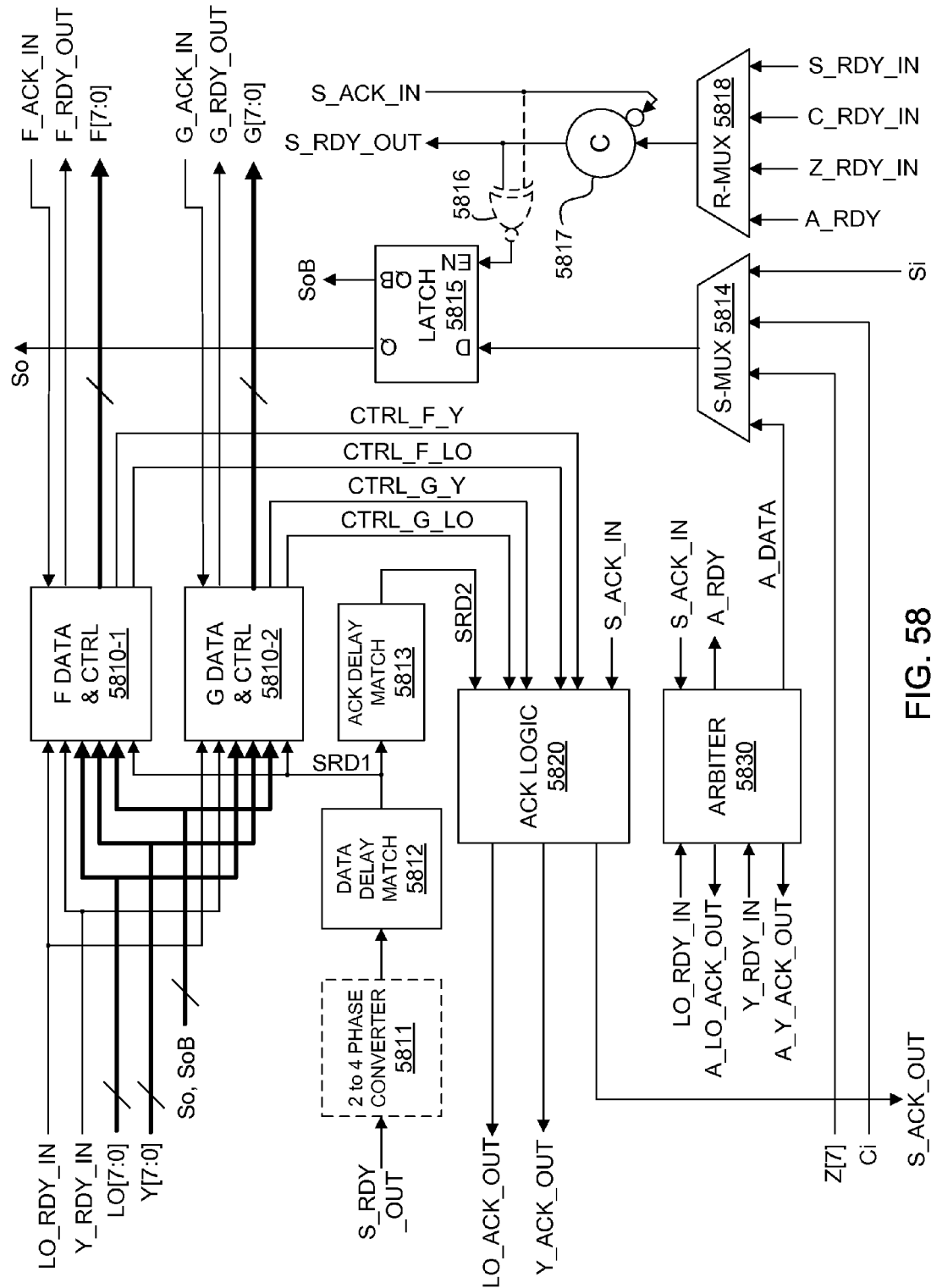
FIG. 58 illustrates in more detail the output multiplexer circuit of FIGS. 14 and 19.

FIG. 58 illustrates in more detail output multiplexer circuit 1490 of FIGS. 14 and 19. In the pictured embodiment the output multiplexer circuit includes: two data and control blocks 5810-1 and 5810-2, one for each of the two outputs F and G of the logic block; one acknowledge logic block 5820; an optional 2- to 4-phase converter 5811; a data delay match element 5812 and an acknowledge delay match element 5813; and the select chain logic, which includes select multiplexer 5814, select ready multiplexer 5818, arbiter block 5830, latch 5815, C-element 5817, and optional exclusive-NOR gate 5816. These elements are coupled together as shown in FIG. 58.

The circuit of FIG. 58 performs multiple functions. Firstly, as has been previously shown and described, the circuit provides two output multiplexers (see elements 1901 and 1902 in FIG. 19) which are included in the data and control blocks 5810-1 and 5810-2. These output multiplexers can be dynamically controlled, i.e., they are controlled by a signal So (driven by latch 5815) that can change value during the operation of the circuit. Secondly, the circuit includes timing and control logic for the datapath that flows from left and right through logic block 1400 (see FIG. 14), as well as for the vertical select chain shown at the right side of FIG. 19. Thus, this circuit implements many complex functions that provide additional functionality for the logic block, as is described below in conjunction with FIG. 69 and the following figures.

The circuit of FIG. 58 may be considered as including three different functional areas: data and control logic; acknowledge logic; and logic associated with the vertical select chain. Data and control blocks 5810-1 and 5810-2 may be two copies of the same circuit, 5810. In addition to the output multiplexers, these blocks include control logic that controls the horizontal and vertical data flow through the logic block. Data and control blocks 5810-1 and 5810-2 are shown and described in connection with FIGS. 59-61. Acknowledge logic block 5820 is shown and described in connection with FIGS. 62-64.

As previously noted, the select chain logic includes select data multiplexer (S-MUX) 5814, select ready multiplexer (R-MUX) 5818, arbiter 5830, latch 5815, C-element 5817, and optional exclusive-NOR gate 5816 (which is only needed when using 2-phase handshake logic). Multiplexers 5814 and 5818 are controlled by configuration memory cells (not shown in FIG. 58, for clarity). In one embodiment, both multiplexers are controlled by the same memory cells, because the data and ready signals are used in tandem. For example, when the Si input is selected by multiplexer 5814, the related select ready input S_RDY_IN is used as the select ready in signal. Similarly, when the arbiter input A_DATA is selected by multiplexer 5814, the arbiter ready signal A_RDY is selected by multiplexer 5818. Signals Z[7] and Z_RDY_IN are similarly paired, as are signals Ci and C_RDY_IN.

Latch 5815, C-element 5817, and exclusive-NOR gate 5816 can be the same, for example, as the similar elements shown in FIG. 56. Arbiter 5830 may use any appropriate implementation. However, FIGS. 65-68 provide an exemplary arbiter implementation that can be used in the pictured embodiment. Signal S_ACK_IN is the select acknowledge signal from the logic block above the pictured circuit, and S_RDY_IN is the select ready signal from the logic block below the pictured circuit. The select ready output signal, S_RDY_OUT, is generated by C-element 5817 and goes to the logic block above.

Figure 63:
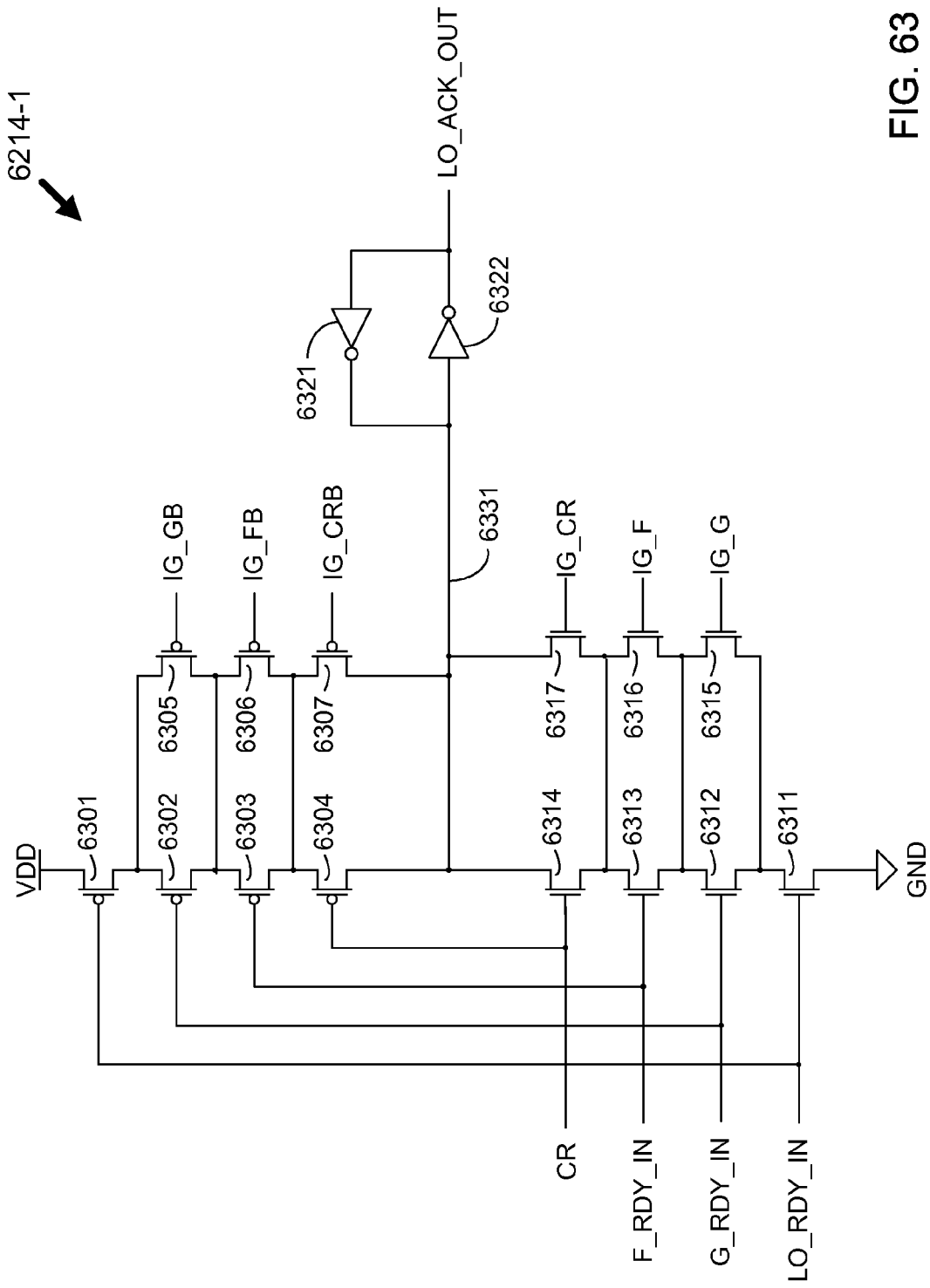
FIG. 63 illustrates an exemplary 4-input C-element having ignorable inputs that can be used, for example, in the acknowledge logic block of FIG. 62.
Figure 64:
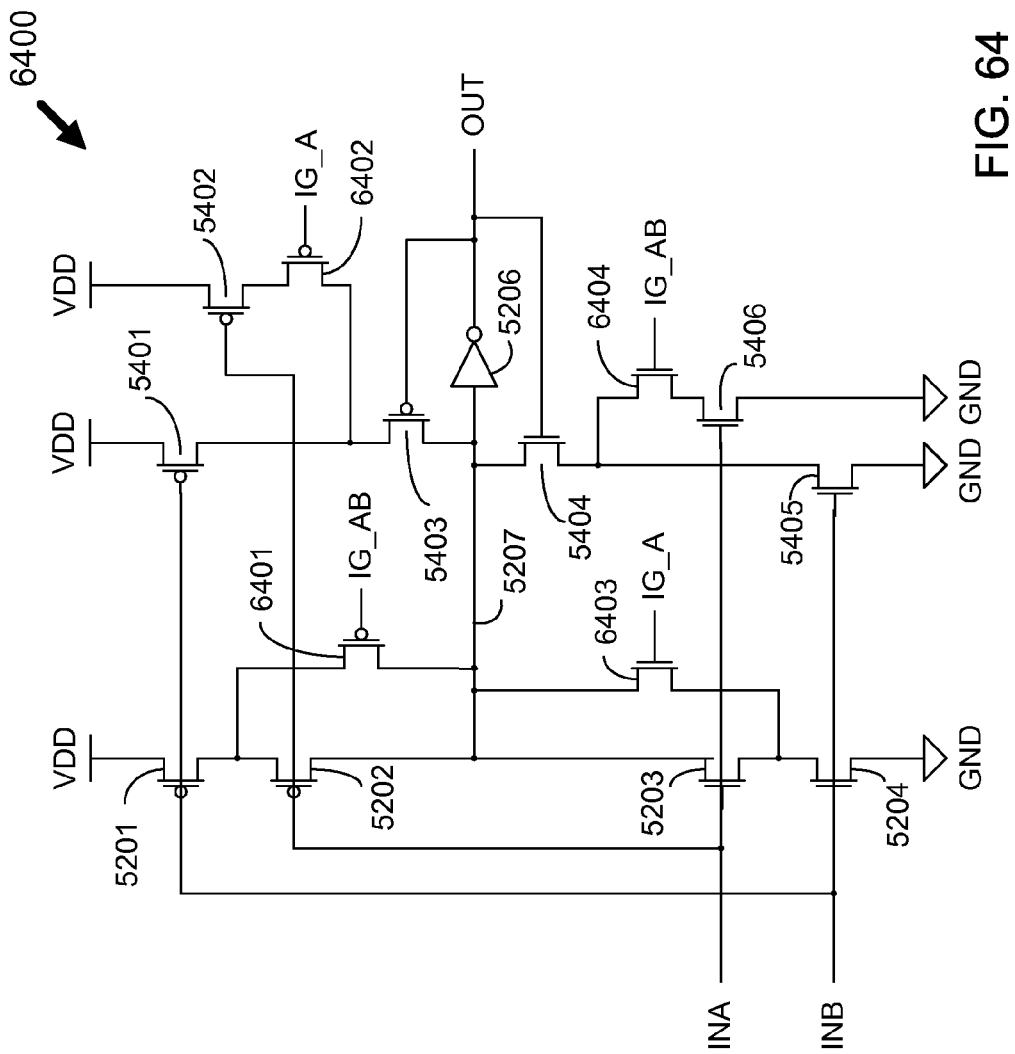
FIG. 64 illustrates a second C-element having ignorable inputs.

The select acknowledge output signal S_ACK_OUT for the logic block below is not the same as signal S_RDY_OUT in this embodiment, because the S-chain has not finished processing new data until the data from the horizontal datapath has also been processed. Therefore, in the pictured embodiment signal S_ACK_OUT is generated by acknowledge logic block 5820 (see also FIG. 62). The select acknowledge output signal, S_ACK_OUT, does not need a de-multiplexer in the pictured embodiment. Instead, the single S_ACK_OUT signal is routed to all four destinations, i.e., the sources of the four signals A_RDY, Z_RDY_IN, C_RDY_IN, and S_RDY_IN. The S_ACK_OUT signal is simply ignored at the three unused destinations. For example, when the Si input is used to feed the select chain, the S_ACK_OUT signal is ignored at the origin of the A_DATA, Z[7], and Ci inputs. FIGS. 63 and 64 provide examples of how a C-element can be designed to ignore an acknowledge input. In other embodiments, a de-multiplexer is included in the output multiplexer circuit. In these embodiments, the S_ACK_OUT signal is only sent to the used destinations, and the three unused outputs of the de-multiplexer are held high.

The select chain logic also includes optional 2- to 4-phase converter 5811, data delay match element 5812, and acknowledge delay match element 5813, coupled together in series as shown in FIG. 58. Optional 2- to 4-phase converter 5811 is only needed when using 2-phase handshake logic, and not when the select ready output signal S_RDY_OUT is already in 4-phase format. Data delay match element 5812 matches the delay of the select signal moving upward along the S-chain, between the previous latch on the S-chain (in the logic block below) and the latch in the present circuit. The output of data delay match element 5812 is designated SRD1. Acknowledge delay match element 5813 matches the delay of the acknowledge path for the S-chain. The output of acknowledge delay match element 5813 is designated SRD2. Delay elements 5812 and 5813 are included to ensure that the receipt of new data is not acknowledged, and the readiness to send new data is not indicated to the next destination on the datapath, until after the new data has actually been received and latched. The delay elements may be implemented as inverter chains, for example, or as logic chains that mimic the logic actually encountered when traversing the data and acknowledge paths.

The need to balance delays, as demonstrated by the presence of delay elements 5812 and 5813, illustrates the desirability of having about the same delay between each latch along the horizontal datapath, the vertical select chain, and the vertical M-bus. If there is a long delay between the output of a logic block and a latch in the interconnect structure, for example, data may be "backed up" in the logic block, waiting for an acknowledge signal from the interconnect structure. Thus, the speed of operation of the integrated circuit will be determined by this slowest portion of the path. Hence, it is desirable to design the entire circuit, logic blocks and interconnect, such that each latch-to-latch delay has about the same value. Therefore, for example, the interconnect structure of such an IC may omit very long interconnect lines that, by their very nature, may impose a long delay between latches. Such an interconnect structure may include, for example, only "single" and "double" length lines, rather than lines spanning more than two logic blocks, such as are commonly included in known arrayed devices such as PLDs. Longer wires are typically included to minimize the performance cost of routing a signal over a long distance. However, in a pipelined PLD, the performance is determined by throughput, not by routing delay. Hence, long interconnect lines may not be needed in such architectures. In some embodiments, even "double" length lines are omitted.

The select chain can be viewed in another way, as a column of logic circuits coupled to a vertical cascade chain spanning multiple logic blocks. A column of logic blocks 1900, for example (see FIG. 19) can be considered to include a column of logic circuits (e.g., 1480) and a vertical cascade chain including the select logic. For example, the vertical cascade chain can include the output multiplexers (e.g., 1901 and 1902, which are included in 5810-1 and 5810-2 of FIG. 58), the select multiplexers (e.g., 1903, 5814), and supporting logic (see FIG. 58).

Figure 59:
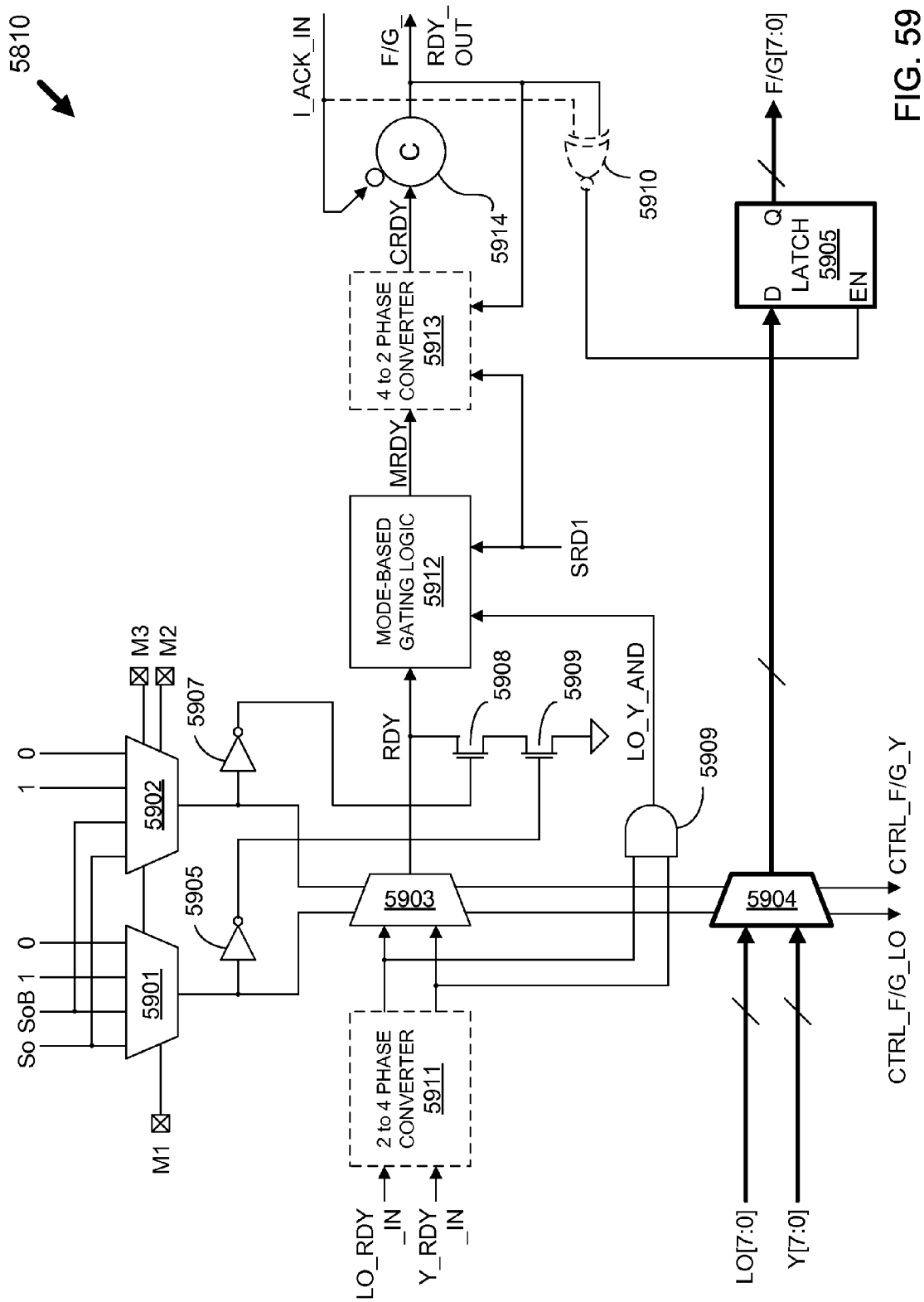
FIG. 59 illustrates an embodiment of the data and control logic block from FIG. 58.

FIG. 59 illustrates an embodiment of data and control logic block 5810 of FIG. 58. The path through which the data flows includes multi-bit multiplexer 5904 and multi-bit latch 5905. The remainder of the data and control logic block provides two control signals CTRL_F_LO (or CTRL_G_LO in block 5810-2) and CTRL_F_Y (or CTRL_G_Y in block 5810-2) that are used in controlling timing for the logic block, and implements the handshake logic for the horizontal datapath, including enabling latch 5905. Multi-bit multiplexer 5904 is also controlled by the two control signals CTRL_F/G_LO and CTRL_F/G_Y. When signal CTRL_F/G_LO is high, the output LO[7:0] of the lookup table logic is selected and passed to latch 5905. When signal CTRL_F/G_Y is high, bus Y[7:0] (see FIG. 14) is selected and passed to latch 5905.

Multiplexers 5901 and 5902 provide the control signals CTRL_F/G_LO and CTRL_F/G_Y under control of several configuration memory cells, including three configuration memory cells M1-M3. Memory cell M1 drives one select input of multiplexer 5901, memory cell M2 drives one select input of multiplexer 5902, and memory cell M3 drives a second select input of both multiplexers 5901 and 5902. These multiplexers can pass either signal So, the S-chain output of the logic block, the inverse SoB of signal So, a one value, or a zero value. In some embodiments, the So and/or SoB inputs to multiplexers 5901 and 5902 can be tied high or low, rather than supplying the high and/or low values directly to the multiplexers as shown in FIG. 59. However, FIG. 59 correctly illustrates the logical functionality of these embodiments.

When one of control signals CTRL_F/G_LO and CTRL_F/G_Y is high, the selected data bus LO[7:0] or Y[7:0] is passed through multiplexer 5904 to latch 5905. When in 2-phase format, data ready input signals LO_RDY_IN and Y_RDY_IN are converted from 2-phase to 4-phase format by 2- to 4-phase converter 5911. One of these two signals is selected in multiplexer 5903 and is passed as signal RDY to the mode-based gating logic 5912 along with the delayed ready signal SRD1. When both control signals CTRL_F/G_LO and CTRL_F/G_Y are low, inverters 5906 and 5907 provide high values to pulldowns 5908 and 5909, placing a low value on the output RDY of multiplexer 5903. When both data ready signals LO_RDY_IN and Y_RDY_IN are high, the output of AND gate 5909, LO_Y_AND, is also high, and this value is also passed to mode-based gating logic 5912. The output of mode-based gating logic 5912, MRDY, is converted to 2-phase mode by converter 5913, unless 4-phase handshake logic is being used. C-element 5914 provides the data ready out signal F/G_RDY_OUT to the destination of the signal, e.g., to corresponding handshake logic in the interconnect structure that interconnects the logic block with other logic blocks in the array. XNOR gate 5910 (included only for 2-phase mode) generates the enable signal for latch 5905. The acknowledge output signals for the LO and Y busses are generated by acknowledge logic block 5820 in FIG. 58.

The functionality of mode-based gating logic 5912 is described below in connection with FIGS. 69-70 and the five operating modes of the output multiplexer circuit.

Figure 60:
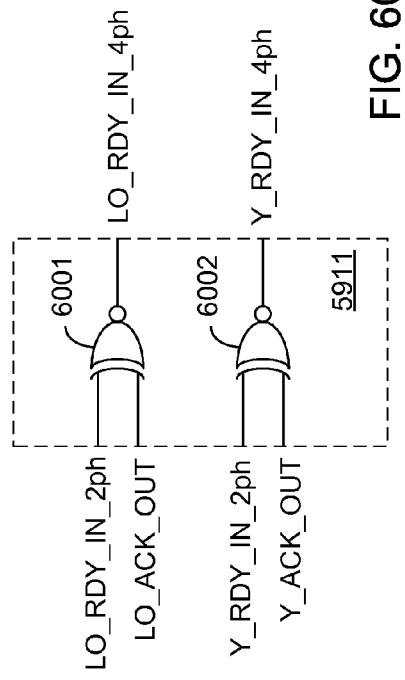
FIG. 60 illustrates an exemplary 2- to 4-phase converter that can be used, for example, in the circuit of FIG. 59.
Figure 61:
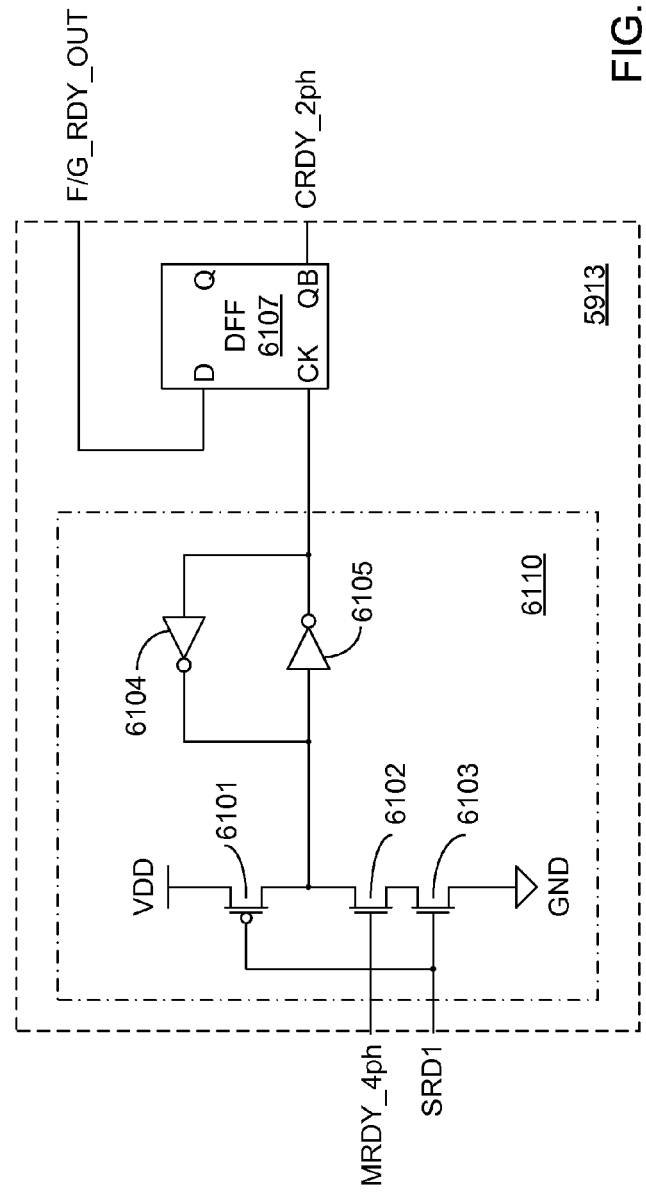
FIG. 61 illustrates an exemplary 4- to 2-phase converter that can be used, for example, in the circuit of FIG. 59.

Mode-based gating logic 5912, as well as the other control logic in the output multiplexer circuit, is simpler for 4-phase handshake signals than for 2-phase handshake signals, because the 4-phase signals are level-dependent as opposed to the edge-dependent signals of 2-phase handshake circuitry. Therefore, where 2-phase handshake logic is used throughout the circuit, mode-based gating logic 5912, as well as the other control circuitry, can be simplified by converting the handshake signals to 4-phase mode prior to entering the gating logic, and back to 2-phase mode on exiting the gating logic. (However, in other embodiments the control logic is implemented using the 2-phase signals directly.) FIGS. 60 and 61 provide exemplary circuitry for performing such conversions.

FIG. 60 illustrates an exemplary embodiment of 2- to 4-phase converter 5911 that can be used, for example, in the circuit of FIG. 59. As is well known, a 2-phase ready signal can be converted to a 4-phase ready signal simply by exclusive-NORing (XNORing) the 2-phase ready signal with the corresponding 2-phase acknowledge signal. Thus, exemplary 2- to 4-phase converter 5911 includes two XNOR gates 6001-6002. In the exemplary embodiment, 2-phase signals LO_RDY_IN_2ph and LO_ACK_OUT are combined to form the 4-phase ready signal LO_RDY_IN_4ph, and 2-phase signals Y_RDY_IN_2ph and Y_ACK_OUT are combined to form the 4-phase ready signal Y_RDY_IN_4ph.

FIG. 61 illustrates an exemplary 4- to 2-phase converter 5913 that can be used, for example, in the circuit of FIG. 59. As is well known, a 4-phase ready signal can be converted to a 2-phase ready signal by feeding the 4-phase ready signal into the clock input of a D flip-flop with the corresponding ready data output signal as the D input. Thus, D flip-flop 6107 of FIG. 61 performs the 4- to 2-phase conversion.

However, circuit 5913 also includes another function, which is implemented by circuit 6110. Circuit 6110 includes transistors 6101-6103 and inverters 6104-6105, coupled together as shown in FIG. 61. Circuit 6110 is essentially an SR (set-reset) latch where the reset input overrides the set input. Thus, in the pictured embodiment, the reset input SRD1 overrides the set input MRDY (labeled MRDY_4ph in FIG. 61, to emphasize that the signal is a 4-phase signal). In the pictured embodiment, SR latches such as latch 6110 are included on the ready paths for LO, Y, F, and G. (For example, latches similar to latch 6110 are included in the 4- to 2-phase converters shown in FIG. 62.) The SR latches ensure that the ready signals remain inactive until after the select ready signal arrives and the new select data has stabilized. Therefore, the SR latches are reset by the delayed select ready signal, and not by the select input itself.

Figure 62:
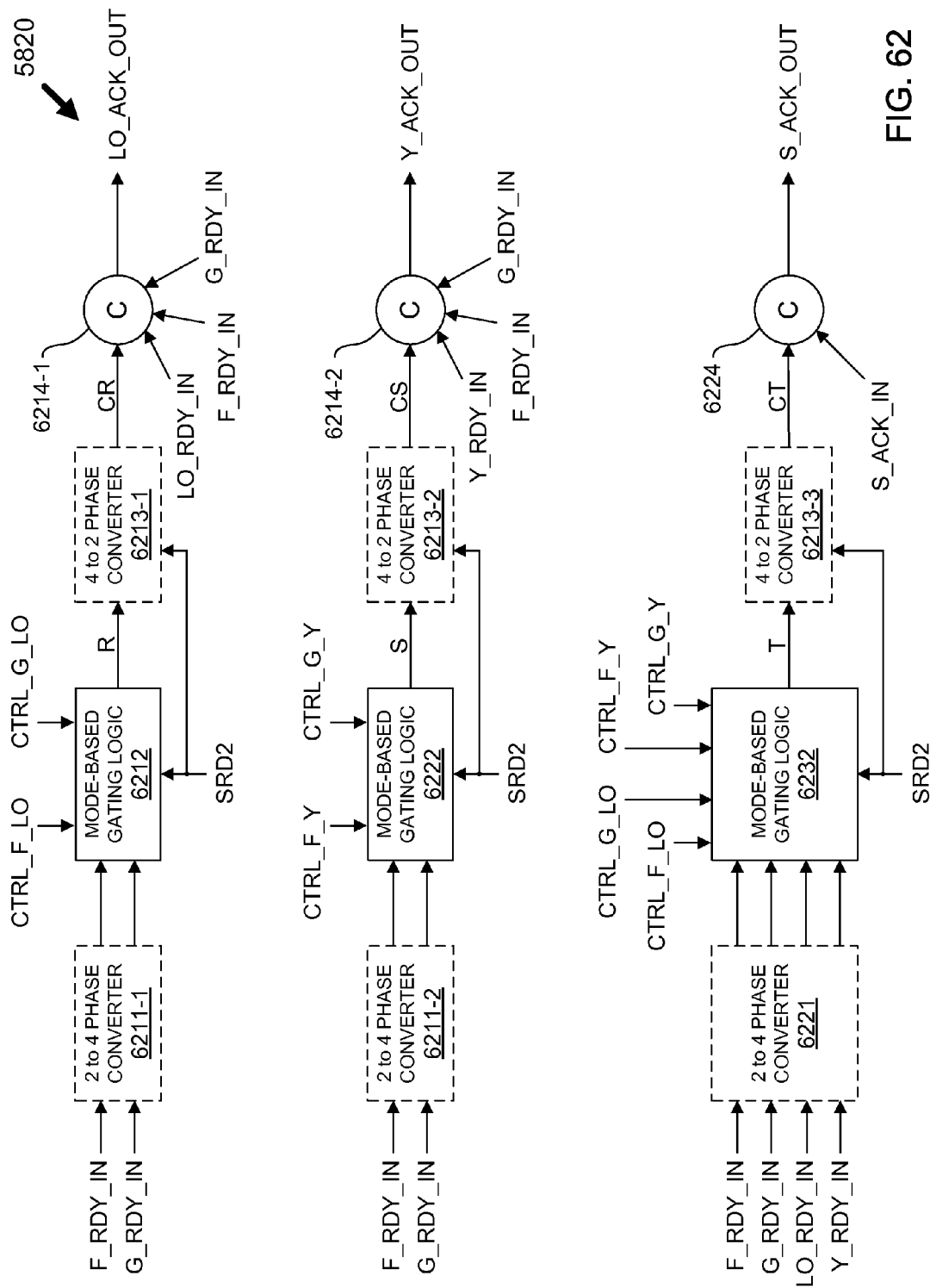
FIG. 62 illustrates an embodiment of the acknowledge logic block from FIG. 58.

FIG. 62 illustrates an embodiment of acknowledge logic block 5820 from FIG. 58. The acknowledge logic for the LO and Y busses is similar, and includes an optional 2- to 4-phase converter 6211, mode-based gating logic 6212/6222, optional 4- to 2-phase converter 6213, and C-element 6214. The data ready signals F_RDY_IN and G_RDY_IN are converted to 4-phase format in converter 6211, if not already in 4-phase format. Mode-based gating logic 6212 (for the LO bus acknowledge signal) or 6222 (for the Y bus acknowledge signal) uses the control signals from the corresponding data and control block to generate a signal R or S from the converted data ready signals. In some embodiments, the converted F and G ready signals are latched using an SR latch similar to latch 6110 of FIG. 61 prior to being used by gating logic 6212 or 6222. These latches are reset by signal SRD1 or SRD2 (SRD2 in the pictured embodiment).

Signal R or S is then converted back to 2-phase format by converter 6213, if 2-phase handshake logic is being used. The converted signal CR or CS is combined with the LO or Y, F, and G data ready signals in C-element 6214 to generate the acknowledge output signal LO_ACK_OUT or Y_ACK_OUT.

A four-input C-element is similar to a 2-input C-element, such as that of FIG. 52, for example, except that the output does not go high until all four inputs are high, and does not go low until all four inputs are low. C-elements 6214-1 and 6214-2 are different, however, in that three of the inputs can optionally be ignored, depending on the mode in which the output multiplexer circuit is operating. The operating modes for the illustrated output multiplexer circuit are described below in connection with FIGS. 69-70.

The acknowledge logic for the S-chain includes optional 2- to 4-phase converter 6221, mode-based gating logic 6232, optional 4- to 2-phase converter 6213-3, and C-element 6224.

The data ready signals F_RDY_IN, G_RDY_IN, LO_RDY_IN, and Y_RDY_IN are converted to 4-phase format in converter 6221, if not already in 4-phase format. Mode-based gating logic 6232 uses the control signals from both data and control blocks to generate a signal T from the converted data ready signals. In some embodiments, the converted F, G, LO, and Y ready signals are latched using an SR latch similar to latch 6110 of FIG. 61 prior to being used by gating logic 6232. These latches are reset by signal SRD1 or SRD2 (SRD2 in the pictured embodiment).

Signal T is then converted back to 2-phase format by converter 6213-3, if 2-phase handshake logic is being used. The converted signal CT is combined with the S-chain acknowledge signal S_ACK_IN in C-element 6224 to generate the S-chain acknowledge output signal S_ACK_OUT. Note that in this case there is no inversion on the S_ACK_IN input to C-element 6224.

In some embodiments, the handshake logic for the S-chain also includes the capability of internally setting the select acknowledge and select ready signals to values indicating that a token is present, without a token actually being received by the circuit. To put it another way, the output multiplexer circuit can generate its own select token, a capability which can optionally be used, for example, during the initial cycle of feedback mode operation. In some embodiments, a configuration memory cell independent of the mode control memory cells controls whether or not the output multiplexer signal internally generates a select token in an initial cycle, by appropriately setting the ready and acknowledge handshake signals.

As used herein, a "token" may be defined as an indicator of a request that has not yet been acknowledged. In the pictured embodiments, a token is separate from the related data, and includes a ready signal signaling that new data is ready (e.g., a high value on an LO_RDY_IN signal from a previous location on the datapath or chain), and an acknowledge signal acknowledging receipt of the previously-sent signal (e.g., a high value on an F_ACK_IN signal from a next location on the datapath or chain). In other embodiments, a token may be implemented in some other fashion.

FIG. 63 illustrates a C-element 6214-1 having ignorable inputs that can be used, for example, to implement C-elements 6214-1 and 6214-2 in the acknowledge logic block of FIG. 62. The basic C-element functionality is imparted by pullups (P-channel transistors) 6301-6304 coupled in series between node 6331 and power high VDD, pulldowns (N-channel transistors) 6314-6311 coupled in series between node 6331 and ground GND, and the latch formed by inverters 6321-6322. However, pullup 6302 can be bypassed by turning on P-channel transistor 6305, which is coupled in parallel to transistor 6302. Similarly, pullup 6303 can be bypassed using P-channel transistor 6306, and pullup 6304 can be bypassed using P-channel transistor 6307. The pulldowns can also be ignored by turning on other N-channel transistors coupled in parallel with the pulldowns. Pulldown 6314 can be bypassed by turning on transistor 6317. Pulldown 6313 can be bypassed by turning on transistor 6316; and pulldown 6312 can be bypassed by turning on transistor 6315.

A high value on signal IG_G and a low value on the complement signal IG_GB causes the G_RDY_IN input to C-element 6214-1 to be ignored. Similarly, a high value on signal IG_F and a low value on the complement signal IG_FB causes the F_RDY_IN input to the C-element to be ignored; and a high value on signal IG_CR and a low value on the complement signal IG_CRB causes the CR input to the C-element to be ignored. Thus, as previously described, these C-element inputs can optionally be ignored, depending on a mode in which the output multiplexer circuit is operating. The operating modes for the illustrated output multiplexer circuit can be controlled, for example, by the memory cells M1-M3 in data and control blocks 5810-1 and 5810-2 (see FIG. 58), as well as several other memory cells throughout the output multiplexer circuit. Therefore, these memory cells can also be used to provide the ignore signals IG_G, IG_GB, and so forth. As previously noted, the operating modes for the illustrated output multiplexer circuit are described below in connection with FIGS. 69-70.

FIG. 64 illustrates a second C-element 6400 having ignorable inputs. The circuit of FIG. 64 can be generated by taking the C-element of FIG. 54 and adding transistors 6401-6404 as shown in FIG. 64. As shown, input INA can be ignored by applying a high value to signal IG_A and a low value to signal IG_AB. The same technique can be applied to C-elements with more than two inputs, if desired.

FIGS. 65-68 illustrate an exemplary arbiter circuit 5830 that can be used, for example, in the output multiplexer circuit of FIG. 58. This arbiter is designed for use with 2-phase handshake logic. Arbiters for use with 4-phase handshake logic are well known. Thus, if 4-phase handshake logic is used, one of these known arbiters can be used instead of the arbiter of FIGS. 65-68. In some 4-phase embodiments, the arbiter of FIGS. 65-68 is used, but converters 6502-1 through 6502-3 are omitted.

An arbiter circuit is essentially an event scheduler. An arbiter circuit has two or more inputs or input channels that it monitors for activity. For example, in the embodiment of FIG. 58, the monitored input channels are LO (represented by input signals LO_ACK_IN and LO_RDY_IN) and Y (represented by input signals Y_ACK_IN and Y_RDY_IN). Whichever input channel first displays signal values indicating the arrival of new data is propagated to the arbiter output (only one of signals GRANT_LO or GRANT_Y goes low). If signal values indicating new data arrive on the other input channel before the first input has been processed, the new signal is stored until the first process is complete. The second signal is then propagated to the arbiter output in its turn.

Figure 65:
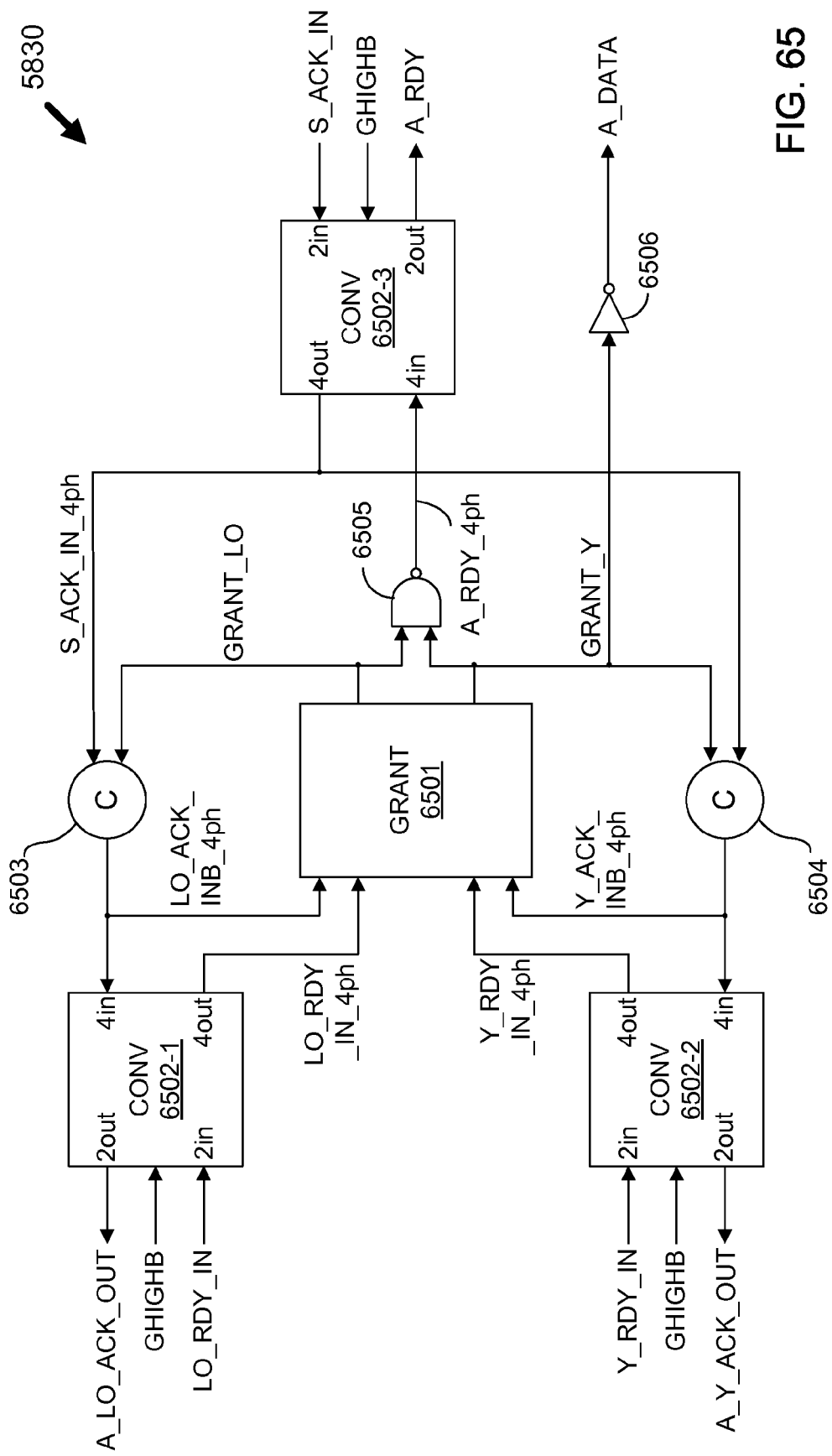
FIG. 65 illustrates an exemplary arbiter circuit that can be used, for example, in the output multiplexer circuit of FIG. 58.

FIG. 65 illustrates a top-level schematic for the exemplary arbiter circuit 5830. The arbiter circuit of FIG. 65 includes grant circuit 6501, converter circuits 6502-1, 6502-2, and 6502-3, C-elements 6503-6504, NAND gate 6505, and inverter 6506, coupled together as shown in FIG. 65.

Converters 6502-1 and 6502-2 convert the LO and Y ready signals (LO_RDY_IN and Y_RDY_IN, respectively) from 2- to 4-phase operation (generating signals LO_RDY_IN_4ph and Y_RDY_IN_4ph, respectively). Converters 6502-1 and 6502-2 also convert the LO and Y acknowledge signals (LO_ACK_INB_4ph and Y_ACK_INB_4ph, respectively) from 4- to 2-phase operation (generating signals A_LO_ACK_OUT and A_Y_ACK_OUT, respectively). When the arbiter is used, these 2-phase acknowledge signals may be combined with other acknowledge signals (e.g., LO_ACK_OUT and/or Y_ACK_OUT of FIG. 58) in another C-element before being sent back to the source of the LO and/or Y tokens.

Grant circuit 6501 monitors the two input channels LO and Y, and selectively issues a grant signal (i.e., GRANT_LO or GRANT_Y goes low) to at most one of the two channels, either LO or Y, depending on which signal arrives first. Therefore, grant circuit 6501 has three possible states: GRANT_LO is high and GRANT_Y is low; GRANT_LO is low and GRANT_Y is high; or GRANT_LO and GRANT_Y are both high. Signals GRANT_LO and GRANT_Y are never both low at the same time. The GRANT_Y signal is also used to provide the arbiter data signal A_DATA on behalf of the arbiter. Output A_DATA is the inverse of GRANT_Y. Therefore, if Y is granted, A_DATA is high. If LO is granted, GRANT_Y is high (because at most one of the data channels can be granted at any one time), and A_DATA is low. Thus, output A_DATA can be used as an indicator as to which channel is granted, e.g., A_DATA can be used as signal So to drive the output multiplexers selecting between LO and Y (see FIGS. 58-59). Note that the value of signal A_DATA is ignored unless signal A_RDY is high, so when neither LO nor Y is granted (i.e., GRANT_LO and GRANT_Y are both high), the resulting low value of signal A_RDY is also ignored.

When the arbiter is used to provide the signal for the S-chain, if two tokens arrive at the same time, and one of the two channels is granted, the data in that channel will be processed first. Once that data has been processed and receipt of the data has been acknowledged, the other channel will be granted in its turn. The ready signals from each channel are latched in an SR latch similar to latch 6110 of FIG. 61, for example, so a high value remains on the ready input until the token is processed. This behavior is compatible with that of Merge mode (see FIG. 77, which provides an example of arbiter use when the output multiplexer circuit is in Merge mode). In some embodiments, the arbiter can also be used to provide the signal for the S-chain when the output multiplexer circuit is in Gate mode (see FIG. 75, for example). The Merge and Gate modes are described below in connection with FIGS. 69-70.

Converter 6502-3 converts the select acknowledge signal S_ACK_IN from 2- to 4-phase operation (generating signal S_ACK_IN_4ph), and also converts the select ready signal generated by the arbiter circuit (output A_RDY_4ph of NAND gate 6505) from 4- to 2-phase operation, generating signal A_RDY. When the arbiter is used, signal A_RDY is selected by multiplexer 5818 as the ready input for the S-chain, just as multiplexer 5814 selects signal A_DATA as the select signal for the S-chain (see FIG. 58). Signal GHIGHB is a reset signal that, when low, initializes the arbiter, as well as other circuits in the IC, to known values. Signal GHIGHB can be used, for example, to keep the logic block, and all inputs and outputs of the logic block, in a known state during configuration of a programmable IC containing the logic block. Thus, the GHIGHB signal can prevent contention and unpredictable behavior of the circuit during the configuration process.

Figure 66:
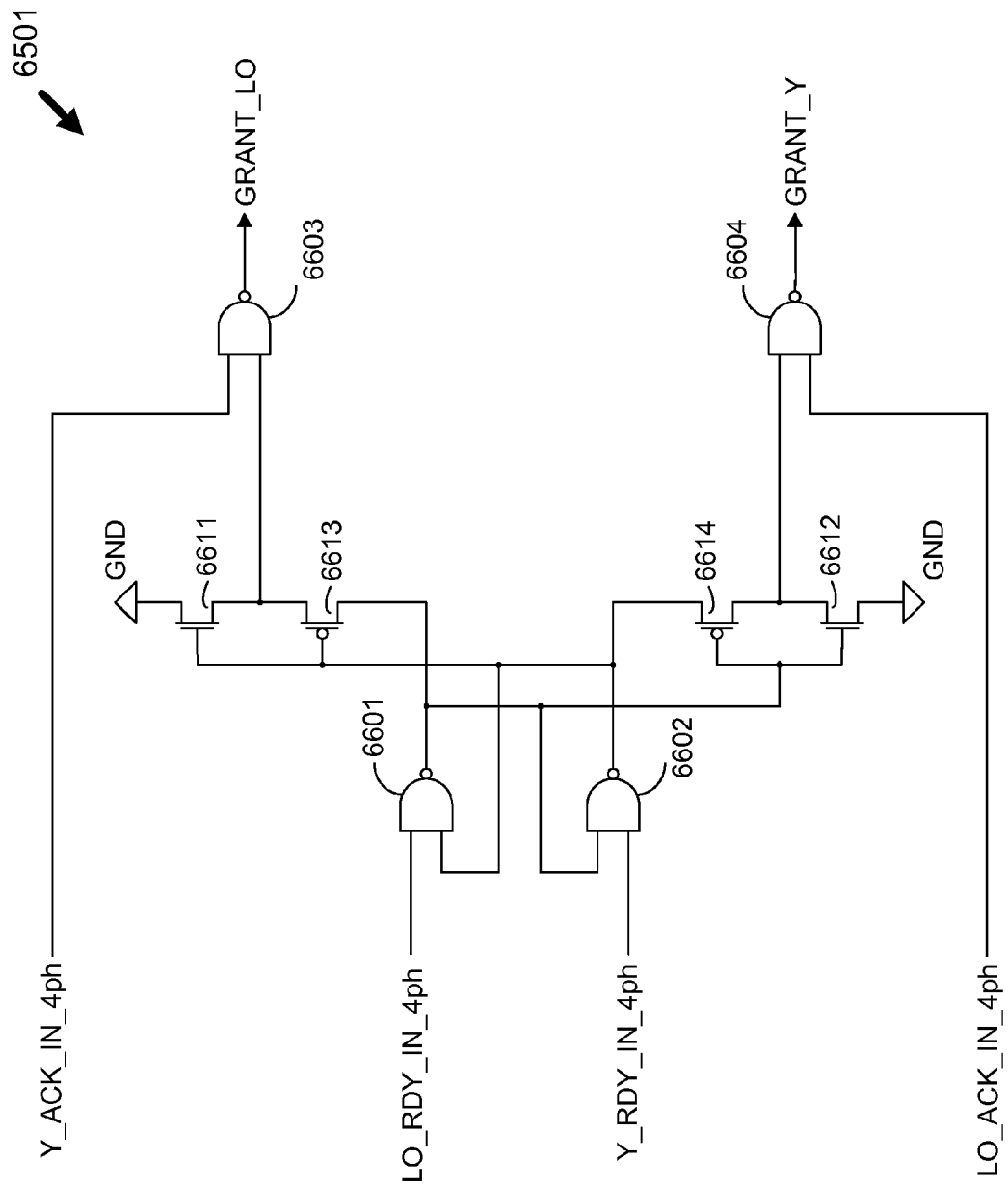
FIG. 66 illustrates a grant circuit that can be used, for example, in the arbiter circuit of FIG. 65.

FIG. 66 illustrates an exemplary implementation of grant circuit 6501 of FIG. 65. In the pictured embodiment, grant circuit 6501 is a mirrored circuit; that is, the logic for the LO channel is the same as the logic for the Y channel. Grant circuit 6501 includes NAND gates 6601-6604, N-channel transistors 6611-6612, and P-channel transistors 6613-6614, coupled together as shown in FIG. 66.

At most one of the two outputs GRANT_LO and GRANT_Y of the grant circuit can be low at any given time, based on the values of the ready and acknowledge inputs for the two channels. Transistors 6611-6614 together form a metastability filter that ensures this behavior. If both inputs to the metastability filter are low, the feedback paths through NAND gates 6601-6602 ensure that one of the two values will go high after some period of time. This behavior is sufficient to resolve the condition in the pictured embodiment, because an occasional metastability condition is not a significant liability for a self-timed circuit, as it might well be for a synchronous circuit. The circuit simply pauses for a short time, then resumes its functions as soon as the metastability is resolved.

NAND gates 6603-6604 prevent a next request from propagating to the grant outputs until after the previous request has reset the acknowledge signals.

Figure 67:
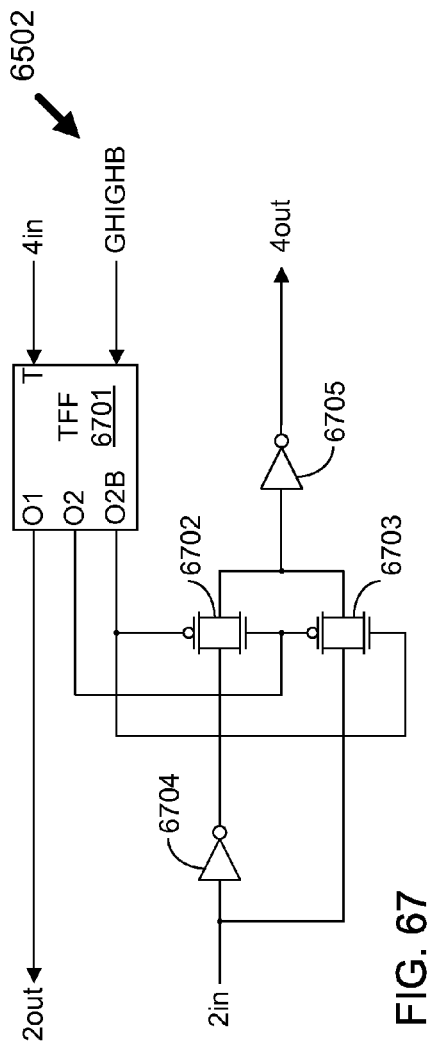
FIG. 67 illustrates a converter circuit that can be used, for example, in the arbiter circuit of FIG. 65.

FIG. 67 illustrates an exemplary implementation 6502 of converter circuits 6502-1 through 6502-3 of FIG. 64. As previously described, in 2-phase handshake logic any transition on a ready or acknowledge signal is interpreted as an arriving token (assuming the other signal has already experienced the necessary transition). However, in 4-phase handshake logic, a high level on a ready or acknowledge signal is interpreted as an arriving token in the pictured embodiments (assuming the other signal is already high). In other embodiments, not shown, a low level is interpreted as an arriving token in 4-phase handshake logic. Converter circuit 6502 converts a 2-phase signal (either RDY or ACK) from a 2- to a 4-phase signal, and another signal (either ACK or RDY) from a 4- to a 2-phase signal. For a fuller explanation of phase conversion in handshake logic, see FIGS. 60-61 and the explanation presented in connection therewith.

Converter circuit 6502 includes T flip-flop (toggle flip-flop) 6701, CMOS pass gates 6702-6703, and inverters 6704-6705, coupled together as shown in FIG. 67. T flip-flop (TFF) 6701 has two outputs O1 and O2, as well as the inverse O2B of signal O2. Output O1 is the output of the master latch, and output O2 is the output of the slave latch, as shown in FIG. 68.

Figure 68:
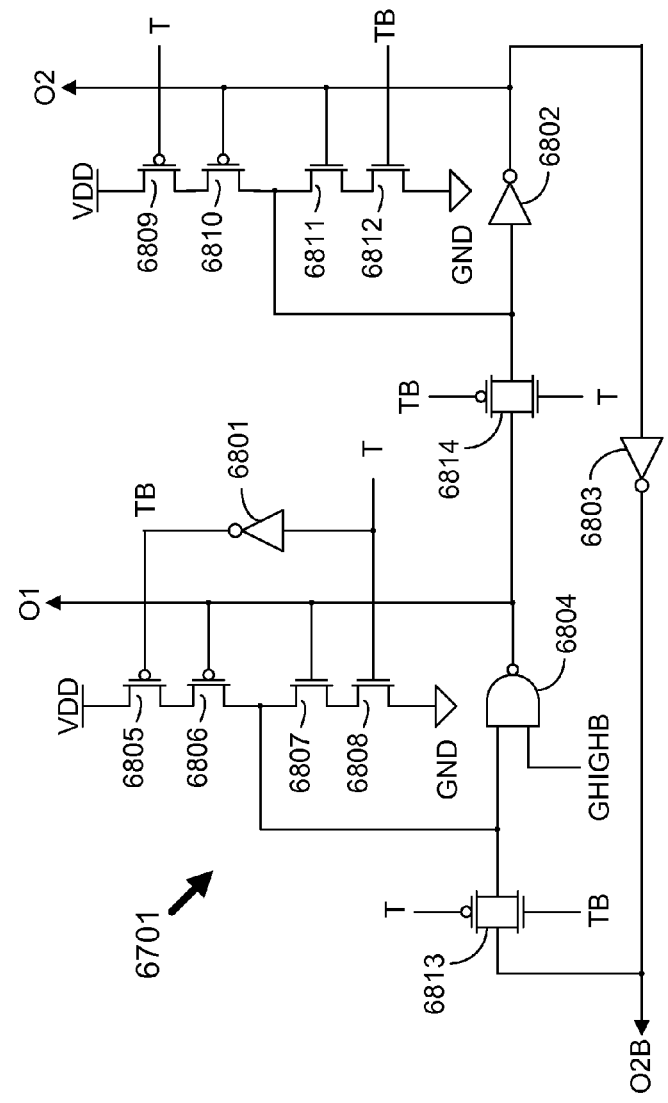
FIG. 68 illustrates a T-flip-flop that can be used, for example, in the converter circuit of FIG. 67.

FIG. 68 illustrates an exemplary implementation of toggle flip-flop 6701 of FIG. 67. The master latch includes a tristate inverter (transistors 6805-6808) and NAND gate 6804, with CMOS pass gate 6813. The slave latch includes a tristate buffer (transistors 6809-6812) and an inverter 6802, with CMOS pass gate 6814. The feedback path passes through inverter 6803, providing the inverted value back to the input of the flip-flop. Inverter 6801 is used to generate the complement TB of the toggle input T.

As previously mentioned, the output multiplexer circuit of FIGS. 58-68 can operate in any of five modes. In the pictured embodiment, the choice of operating mode is determined by the values of the memory cells M1-M3 in the two instances of data and control logic 5810, for example, as well as other memory cells throughout the output multiplexer circuit. FIG. 69 illustrates how the data multiplexers are logically controlled (see also FIG. 59). The multiplexers 5901 and 5902 providing the control signals CTRL_F/G_LO and CTRL_F/G_Y are controlled by three memory cells M1-M3, in addition to other memory cells that are omitted from FIG. 69, for clarity. Memory cells M1 and M2 are unique to multiplexers 5901 and 5902, respectively. These memory cells allow the control signals to be set to a low value, i.e., "0" is selected as the multiplexer outputs. Memory cell M3 drives both of multiplexers 5901 and 5902. The value of memory cell M3 controls the polarity of the outputs of multiplexer 5901-5902. In other words, memory cell M3 controls which of the control signals CTRL_F/G_LO and CTRL_F/G_Y goes high in response to a high value on So, and which of the control signals goes low in response to a high So value.

Figure 69:
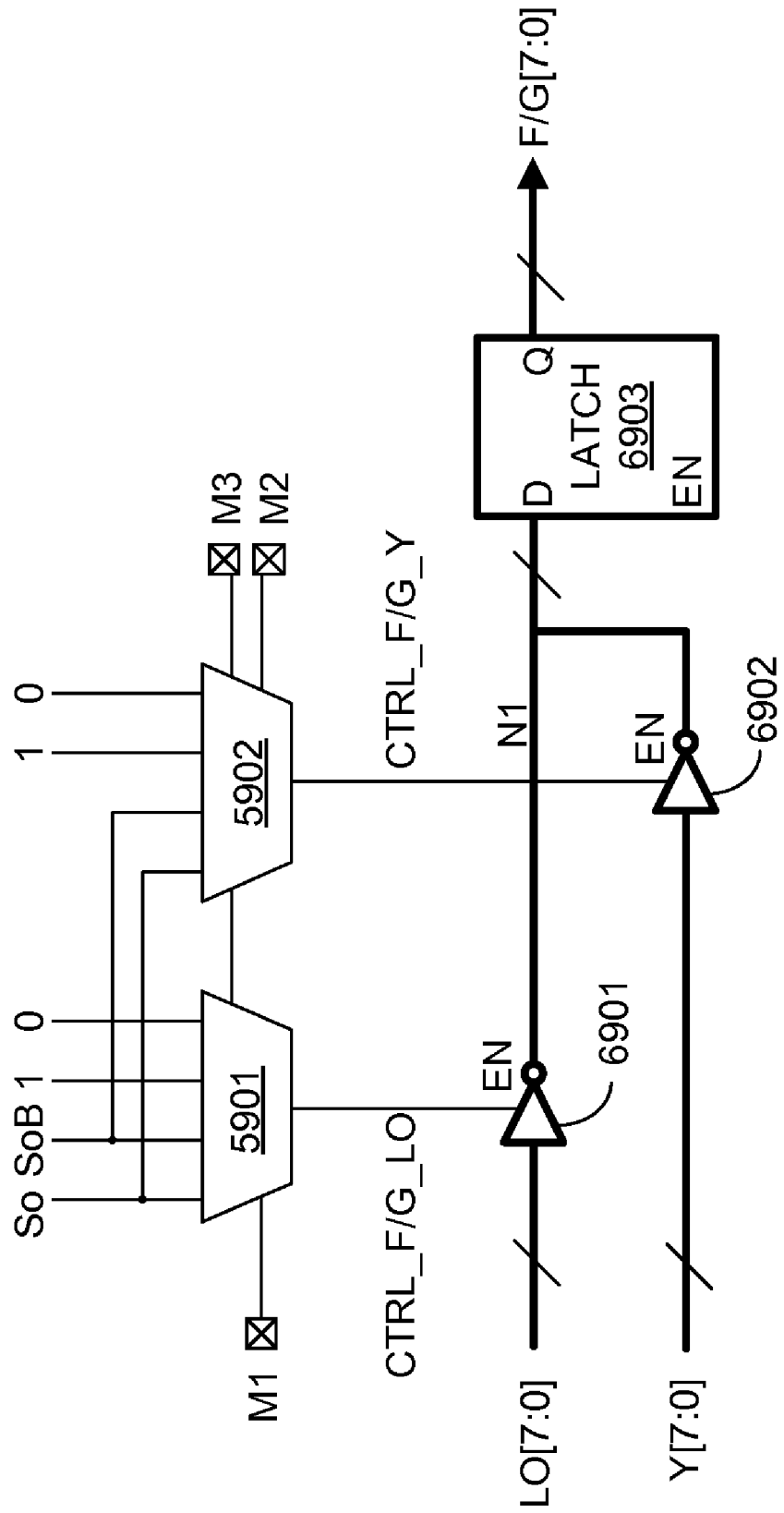
FIG. 69 shows in greater detail the data multiplexers from the data and control logic of FIGS. 58 and 59.

Multiplexer 5904 of FIG. 59 is shown in FIG. 69 as a pair of tristate buffers 6901 and 6902. When the associated enable signal EN (CTRL_F/G_LO or CTRL_F/G_Y) is high, each buffer 6901-6902 is enabled. When the associated enable signal is low, each buffer 6901-6902 is tristated. In one embodiment, to prevent the multiplexer output node N1 from floating when both buffers are tristated, the tristate buffers are configured such only one buffer can be tristated at one time. For example, the buffers can be driven not by signals CTRL_F/G_LO and CTRL_F/G_Y, but by signals CTRL_F/G_LO and CTRL_F/G_LOB, or CTRL_F/G_Y and CTRL_F/G_YB. In one embodiment, half of the buffers are driven by CTRL_F/G_LO and CTRL_F/G_LOB and half are driven by CTRL_F/G_Y and CTRL_F/G_YB, in order to equalize loading. In one embodiment, the two buffers are consolidated into the latch 6903 using well known circuit design techniques.

FIG. 70 illustrates in tabular format the five operating modes of the F and G data paths through the output multiplexer circuit. Note that the modes of the F datapath are illustrated in FIG. 70. However, the modes of the G datapath are the same as the F modes. As shown in FIG. 70, the five operating modes are designated herein as the Feedthru, Gate, MUX, Merge, and Feedback modes. Each mode also has a selectable polarity (e.g., selected using the M3 memory cell shown in FIG. 69), so each mode has two different sub-modes, which are generally shown as two separate columns in FIG. 70.

The first row of the table in FIG. 70 shows the operating mode. The second row shows the sub-mode or selected polarity. For example, the sub-modes of the Feedthru mode cause either the LO data or the Y data to be passed through the datapath of the output multiplexer circuit. Thus, the two sub-modes are designated "LO→F" and "Y→F". The third row shows which input signal is selected by multiplexer (MUX) 5901 in the data and control logic, and the fourth row shows which output is selected by multiplexer 5902 in the data and control logic. Thus, for example, in Feedthru mode, sub-mode LO→F, the output CTRL_F_LO of MUX 5901 is a high value, and the output CTRL_F_Y of MUX 5902 is a low value.

The fifth row of the table shows the equivalent circuit implemented by the configuration shown in rows 1-4, and the sixth row shows how tokens are treated in each mode and sub-mode. As previously described, in the pictured embodiments a "token" includes a ready signal signaling that new data is ready, and an acknowledge signal acknowledging receipt of the previously-sent signal. One or more tokens are required for each of the five functions corresponding to the five modes to execute in the exemplary output multiplexer circuit. For example, a new value may not be latched into the F latch until all of the input signals required to create that new value have been received by the circuit. The input tokens are then "consumed", i.e., in the pictured embodiments the function is performed, the associated latch opens and closes again with valid new data in the latch (with one exception, as described below), the ready out signal goes high indicating the availability of the new data, and a high acknowledge signal is sent to all sources of the input data.

Note that in some cases the sixth row appears to be the only differentiator between two modes (e.g., MUX mode and Merge mode). This behavior is controlled by the way the mode-based gating logic 5912, 6212, 6222, and 6232 functions when the circuit is in each of the five operating modes. The control logic behavior is described below, after an explanation of the five operating modes of the output multiplexer circuit, which are now described.

In Feedthru mode, one of the two data inputs LO and Y is passed through ("fed through") the datapath to the F or G output latch. Which data input is selected depends on the memory cells controlling multiplexers 5901 and 5902. The selected data input (LO or Y) must provide a token prior to implementation of the feedthrough function, and the token is consumed once the new value is latched. A token is provided at the F or G output. Any token on the unselected data input (Y or LO) does not affect the result and is consumed. No useful design implementation should provide a token on the select input (So), as it has no function in this mode. However, in the pictured embodiment the select input must have a constant value (e.g., a high value, with the select input being initialized high via a half latch), and any token on the select input is ignored. Feedthru mode is used to route tokens from the internals of the logic block to the F and G outputs of the logic block. For example, in logic blocks 2000 and 2100 of FIGS. 20-21, both the F and G datapaths use Feedthru mode. In logic blocks 3600 and 3700 of FIGS. 36-37, only the F datapath is in use, and the F datapath uses Feedthru mode.

In MUX mode, one of the two data inputs LO and Y is selected by the So and Sob signals and passed to the F or G output latch. The polarity of the So and SoB signals is determined by the values stored in memory cells M1-M3 (see FIG. 69). Both data inputs (LO and Y) and the select input So must all provide tokens prior to implementation of the multiplexer function, and all three tokens are consumed once the new value is latched. A token is provided at the F or G output. MUX mode is used to select either LO or Y based on the value of a select signal. In the pictured embodiment, the select signal can be a dynamic signal provided from outside the logic block (Si, Ci, or Z[7]) or the arbiter data output A_DATA. In logic blocks 4100 and 4400 of FIGS. 41 and 44, the F datapath uses MUX mode, with the select signal being signal Z[7] and Ci, respectively. In logic block 4600 of FIG. 46, both F and G datapaths are in MUX mode, with the select signal being Ci for a first logic block and Si for subsequent blocks in the S-chain.

In Gate mode either of the following actions can occur, depending on the value of So: one of the two data inputs LO and Y is passed through to the F or G output; or no signal is passed to the F or G output. Gate mode is the only mode in which under certain circumstances no output token is provided at the F or G output. Which data input LO or Y is treated as the data input of the "gate" depends on the values stored in memory cells M1-M3. The select signal (or "gating input") of the gate is signal So. Tokens must be provided by the data input treated as the input of the "gate" (LO or Y) and by the select input So prior to performance of the gating function. A token on the select input So is consumed. Any token on the unused data input (Y or LO) does not affect the result and is consumed. A token is provided at the F or G output only when the gate is "on". Gate mode can be used, for example, as a "token sink", e.g., to allow a token to pass only if selected, and otherwise to consume the token. For example, Gate mode can be used to implement "if then" software statements. Gate mode can also be used to dynamically route a token to one of two logic blocks. Examples of Gate mode use are provided below in connection with FIGS. 71, 73-76, and 78.

Merge mode is similar to MUX mode, except in the way that tokens are treated. As in MUX mode, one of the two data inputs LO and Y is selected by the So and Sob signals and passed to the F or G output latch. The polarity of the So and SoB signals is determined by the values stored in memory cells M1-M3. Unlike MUX mode, however, only the selected data input (LO or Y) and the select input So must provide tokens prior to implementation of the merge function, and only these two tokens are consumed once the new value is latched. A token is provided at the F or G output. As in MUX mode, any token on the unselected input (Y or LO) does not affect the current result. However, unlike MUX mode, the token on the unselected input is not consumed until the select input So changes value and selects the previously unselected input. At that point, the newly selected input is forwarded to the F or G output and the input token is consumed while a new output token is provided. Thus, Merge mode can be used to merge two data streams. For example, Merge mode can be used to merge two data streams at the end of an "if then" software statement. Examples of Merge mode use are provided below in connection with FIGS. 72-74 and 76-78.

In the pictured embodiment, Feedback mode is used whenever the F or G output is fed back to the lookup table, and the lookup table output LO feeds the F or G datapath in the output multiplexer circuit. As long as the feedback path includes at least one logic element having handshake logic (e.g., a routing multiplexer), handshaking in a feedback loop operates in the same manner as any other chain of dataflow elements. The logic cell of FIGS. 14 and 19 does not include a feedback path. Therefore, in these embodiments the feedback path may be implemented in the interconnect structure external to the logic block (e.g., see FIG. 15). In some embodiments, the logic block includes a dedicated feedback path designed to feed the F or G output back to the X input of the logic block with a minimum delay, e.g., by traversing only one routing multiplexer. However, when a feedback path is present, it must be possible to initialize the loop correctly. This is the purpose of Feedback mode.

In Feedback mode, the output multiplexer circuit behaves differently in an initial cycle than in subsequent cycles through the feedback path. In the initial cycle, Y and So tokens are required to generate an output token for F or G. However, as described above, the output multiplexer circuit itself can optionally be used to generate the initial So token. This approach ensures that an initial token can be fed into the feedback loop, via the Y input. The Y token is consumed after the F or G token is generated. In subsequent cycles, one of the two data inputs LO and Y is selected by the So and Sob signals and passed to the F or G output latch. The polarity of the So and SoB signals is determined by the values stored in memory cells M1-M3. The LO data input and the select input So must both provide tokens prior to implementation of the feedback function, regardless of which data input is selected, and the tokens are consumed once the new value is latched. The Y data input is only required to provide a token if the Y input is selected. If the Y input is not selected, any token on the Y input does not affect the current result, and any token on the Y input is not consumed until the select input So changes value to select the Y input. At that point, the Y input is forwarded to the F or G output and the Y token is consumed. Thus, once an initial value has been loaded via the Y input path, the feedback signal LO is loaded into the F or G output latch repeatedly, until the select input So selects the Y data input. At this point, the new "initial" value on the Y data input is loaded into the F or G output latch.

Feedback mode can be used, for example, to implement a counter or accumulator. Feedback mode can also be used to implement a token replicator, which is useful when implementing a software loop structure such as a for/while loop. Each time an S token arrives, either the last token is replicated (when LO is chosen) or the new token is accepted and acted upon (when Y is chosen). Examples of Feedback mode use are provided below in connection with FIGS. 79 and 80.

As previously noted, in Feedback mode the output multiplexer circuit behaves differently in an initial cycle than in subsequent cycles. Clearly, this behavior requires that the control logic correctly determine whether or not a current cycle is the initial cycle, and control the datapath logic accordingly. This is only one example of a special circumstance that must be accommodated by the control logic. The control logic, as exemplified by mode-based gating logic 5912, 6212, 6222, and 6232 of FIGS. 59 and 62, is best described by delineating the required behavior for each of these gating logic blocks. Note that this description assumes the ready and acknowledge signals both have a positive polarity; that is, a high ready or acknowledge signal indicates a ready or acknowledge status. However, it will be clear to those of skill in the art that one or both of these signals can have a negative polarity, if desired. As previously described, the control logic can be simplified by converting the ready signals to 4-phase mode prior to providing them to the control logic, and back to 2-phase mode on exiting the control logic, if 2-phase mode is used for the handshake logic throughout the circuit.

Mode-based gating logic 5912 is included in the data and control logic of FIG. 59. Therefore, the output multiplexer circuit includes two copies of gating logic 5912, one for F and one for G. As shown in FIG. 59, the inputs to gating logic 5912 are signal RDY (the data ready signal as modified by control signals CTRL_F/G_LO and CTRL_F/G_Y), signal LO_Y_AND (the output of AND gate 5909), and signal SRD1 (the select ready signal delayed to match the data delay along the S-chain, see FIG. 58). The output of gating logic 5912 is signal MRDY, as shown in FIG. 59. Mode-based gating logic 5912 behaves as follows.

When in Feedthru mode, output MRDY is the same as signal RDY, and signal CRDY also has the same value as RDY. In other words, the ready input RDY feeds through to the ready output MRDY (e.g., bypassing the master latch of D flip-flop 6107 in FIG. 61). The other two inputs (LO_Y_AND and SRD1) are ignored. When in MUX mode, gating logic 5912 waits for high values at all three inputs, then places a high value on signal MRDY, which goes low again when any of the three inputs goes low. In Merge and MUX modes, gating logic 5912 waits for high values at the RDY and SRD1 inputs, then places a high value on signal MRDY, which goes low again when either of RDY and SRD1 goes low. In Feedback mode, on the initial cycle, gating logic 5912 waits for signals RDY and SRD1 to go high, then places a high value on signal MRDY, which goes low again when either of signals RDY and SRD1 goes low. On subsequent cycles, all of signals RDY, SRD1, and LO_Y_AND must be high for signal MRDY to go high. Additionally, the Y input must be selected by signal So in order for signal MRDY to go high. MRDY goes low again when any of signals RDY, SRD1, and LO_Y_AND goes low again, or when signal So ceases to select the Y input.

Mode-based gating logic 6222 is included in the acknowledge logic of FIG. 62. Therefore, a single copy of this logic is included in the output multiplexer circuit, and is used in generating the acknowledge signal Y_ACK_OUT for the Y input. As shown in FIG. 62, the inputs to gating logic 6222 are signals F_RDY_IN (the data ready signal for the F output), G_RDY_IN (the data ready signal for the G output), CTRL_F_Y (the Y control signal for the F output), CTRL_G_Y (the Y control signal for the G output), and signal SRD1 (the select ready signal delayed to match the data delay along the S-chain, see FIG. 58). These signals are converted to 4-phase mode in 2- to 4-phase converter 6211-2, if not already in 4-phase mode. The output of gating logic 6222 is signal S, as shown in FIG. 62. Signal S is converted back to 2-phase mode in 4- to 2-phase converter 6213-2, if the handshake logic for the circuit is in 2-phase mode.

C-element 6214-2 behaves as follows in the five different modes.

When in Feedthru mode, C-element 6214-2 is configured to ignore signal CS, the converted output of mode-based gating logic 6222. Signal F_RDY_IN is also ignored if the F output of the logic cell is not used, that is, if memory cell M2 in F data and control logic 5810-1 is low, selecting no output from F. Similarly, signal G_RDY_IN is ignored if the G output of the logic cell is not used, that is, if memory cell M2 in G data and control logic 5810-2 is low, selecting no output from G. Input Y_RDY_IN is never ignored by gating logic 6222. When all non-ignored ready signals have arrived (gone high), the output Y_ACK_OUT of C-element 6214-2 goes high. FIGS. 63 and 64 provide two exemplary embodiments of a 4-input C-element configured to optionally ignore three of the four inputs. The ignore control signals can be provided, for example, by configuration memory cells when the integrated circuit is a programmable IC.

For all modes other than Feedthru mode, C-element 6214-2 is configured to ignore the F_RDY_IN and G_RDY_IN inputs. Instead, C-element 6214-2 waits only for high values on the Y ready signal Y_RDY_IN and the converted signal CS from the mode-based gating logic before driving output Y_ACK_OUT high.

Mode-based gating logic 6222 behaves as follows in the five different modes.

In Feedback mode, the behavior of gating logic 6222 is not important, as the CS signal is ignored by C-element 6214-2.

In MUX mode, gating logic 6222 waits for high values on one or both of signals F_RDY_IN and G_RDY_IN, depending on whether or not the F and/or G outputs are used, before driving signal S high. (In the pictured embodiments, at least one of the F and G outputs is always used when in MUX mode, as the default mode for an unused output is Feedthru mode.) Additionally, a high value is required on signal SRD2 before output signal S goes high. When signal Y_RDY_IN is also high, C-element 6214-2 drives signal Y_ACK_OUT high until one of the active signals goes low again.

In Merge mode, gating logic 6222 waits for high values on neither, one, or both of F_RDY_IN and G_RDY_IN, depending on whether or not the F and/or G outputs are used, before driving signal S high. For the used output(s) (F and/or G), the corresponding control signal(s) (CTRL_F_Y and/or CTRL_G_Y) must also be high for signal S to go high. The high values on the control signals are required because a transition on F_RDY_IN or G_RDY_IN does not guarantee that the Y token was consumed—the X token could have been consumed instead, since only one of X and Y is consumed in a data cycle. Lastly, a high value is also required on SRD2 before output signal S goes high. Requiring the SRD2 signal to go high last prevents false results from possible glitching on the CTRL_F_Y and CTRL_G_Y signals. When signal Y_RDY_IN is also high, C-element 6214-2 drives signal Y_ACK_OUT high until one of the active signals goes low again.

In Gate mode, gating logic 6211 waits for a high value on SRD2 before driving signal S high. If the Y input is being passed to the F or G output, then the Y acknowledge signal must wait for the F or G output token to be generated. In other words, if one of CTRL_F_Y and CTRL_G_Y is high, then signal S does not go high until signal F_RDY_IN or G_RDY_IN has gone high. If the Y input is not being passed to the F or G output, no output token will be generated, but the Y input should nevertheless be acknowledged. Therefore, signal S goes high without waiting for signal F_RDY_IN or G_RDY_IN to go high. Once signal S is high and Y_RDY_IN is high, C-element 6214-2 drives signal Y_ACK_OUT high until one of the active signals goes low again.

In Feedback mode, gating logic 6211 behaves in the same way as in Merge mode.

Mode-based gating logic 6212 is included in the acknowledge logic of FIG. 62. Therefore, a single copy of this logic is included in the output multiplexer circuit, and is used in generating the acknowledge signal LO_ACK_OUT for the LO input. Mode-based gating logic 6212 behaves in a similar fashion to gating logic 6222 for the Y input. However, the roles of the Y and LO inputs are reversed. Additionally, gating logic 6212 uses memory cell M1, rather than M2, to determine whether the F and G outputs are used. As shown in FIG. 66, memory cell M1 is used in generating control signal CTRL_F/G_LO, while memory cell M2 is used in generating control signal CTRL_F/G_Y.

Another difference between the Y gating logic 6222 and the LO gating logic 6212 occurs in Feedback mode. In Feedback mode, LO_ACK_OUT does not go high on the initial data cycle. After the initial data cycle, Feedback mode is identical to the Y MUX mode. The reason for this exception is that on the initial cycle, a token does not yet exist on the feedback input (X), so no token should be acknowledged by driving signal LO_ACK_OUT high.

Mode-based gating logic 6232 is included in the acknowledge logic of FIG. 62. Therefore, a single copy of this logic is included in the output multiplexer circuit, and is used in generating the acknowledge signal S_ACK_OUT for the select input. As shown in FIG. 62, the inputs to gating logic 6232 are signals F_RDY_IN (the data ready signal for the F output), G_RDY_IN (the data ready signal for the G output), LO_RDY_IN (the data ready signal for the LO input), Y_RDY_IN (the data ready signal for the Y input), CTRL_F_LO (the LO control signal for the F output), CTRL_G_LO (the LO control signal for the G output), CTRL_F_Y (the Y control signal for the F output), CTRL_G_Y (the Y control signal for the G output), and signal SRD1 (the select ready signal delayed to match the data delay along the S-chain, see FIG. 58). The four ready signals are converted to 4-phase mode in 2- to 4-phase converter 6221, if not already in 4-phase mode. The output of gating logic 6232 is signal T, as shown in FIG. 62. Signal T is converted back to 2-phase mode in 4- to 2-phase converter 6213-3, if the handshake logic for the circuit is in 2-phase mode. Mode-based gating logic 6232 functions as follows.

For all modes except Gate mode, four conditions apply. Firstly, if memory cell M1 or memory cell M2 of F stores a high value, then F is being used, and signal T is not driven high until signal F_RDY_IN goes high. Secondly, if memory cell M1 or memory cell M2 of G stores a high value, then G is being used, and signal T is not driven high until signal G_RDY_IN goes high. Thirdly, if output select signal So is being used by the select multiplexer in the next vertically adjacent logic block, signal T is not driven high until signal S_ACK_IN goes high. Fourthly, once these conditions are satisfied, signal T goes high, and a high value on signal S_ACK_IN causes C-element 6224 to drive signal S_ACDK_OUT high.

Gate mode is similar to the other four modes, except that depending on the value of the control signals (CTRL_F_LO, CTRL_G_LO, CTRL_F_Y, and CTRL_G_Y), the ready signals for LO and Y (LO_RDY_IN and Y_RDY_IN) are used instead of the ready signals for F and G (F_RDY_IN and G_RDY_IN). The reason for this exception is that not every execution of the Gate mode creates an output token, as has already been described. In the cases where no output token is generated, the F and G output tokens clearly cannot be used to generate the select token. Instead, once the input tokens (the LO and Y) tokens have arrived, the token is consumed, as described above.

Examples are now provided of ways in which each of the remaining modes can be implemented and used in the logic block of FIGS. 14 and 19. As previously noted, Feedthru mode has already been demonstrated in FIGS. 20-21 and 36-37, among others. MUX mode is used in FIGS. 41, 44, and 46, for example.

Figure 71:
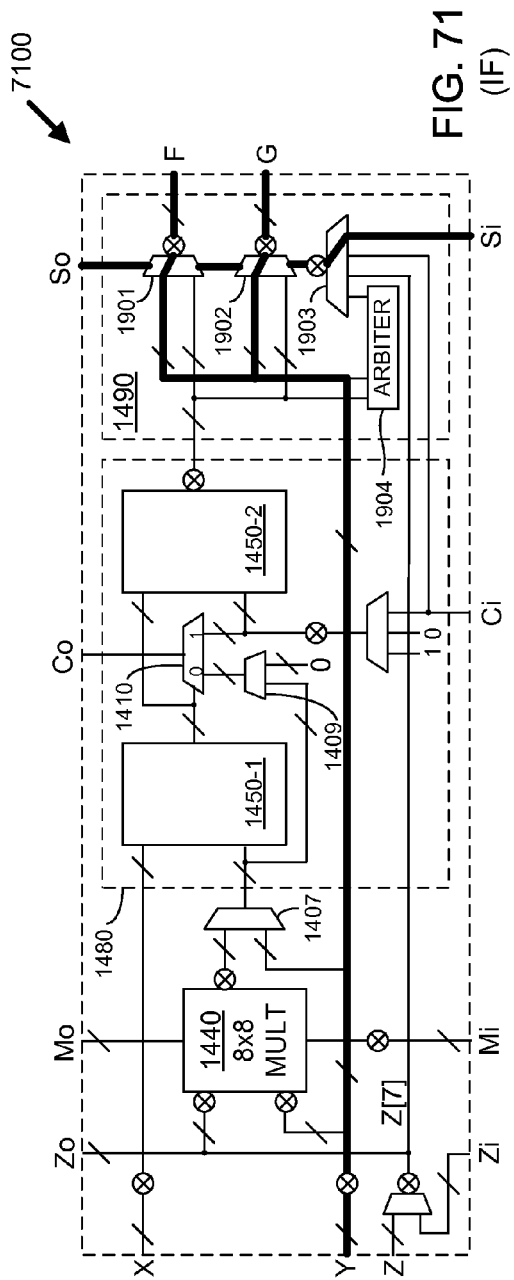
FIG. 71 illustrates how the logic block of FIGS. 14 and 19 can be used to implement an "IF" function using Gate mode.

FIG. 71 illustrates one way in which Gate mode can be used in the logic block of FIGS. 14 and 19. In FIG. 71, the logic block of FIGS. 14 and 19 is used to implement an "IF" function using Gate mode. An "IF" function is a demultiplexing function. In the illustrated logic block 7100, the value on the Y input is only passed to one of the two outputs F and G at any given time, depending on the value of the output select signal S. For example, when S is high, the F output provides a valid output token; when S is low, the G output provides a valid output token. The two outputs are never both valid at any given time.

Note that the lookup tables are unused in logic block 7100. In some embodiments, the available lookup tables are used to implement other logic that precedes an "IF" statement in the implemented function. Note also that while FIG. 71 shows the select input S coming from the Si input, in some embodiments the select input S can be supplied by Ci or Z[7].

Figure 72:
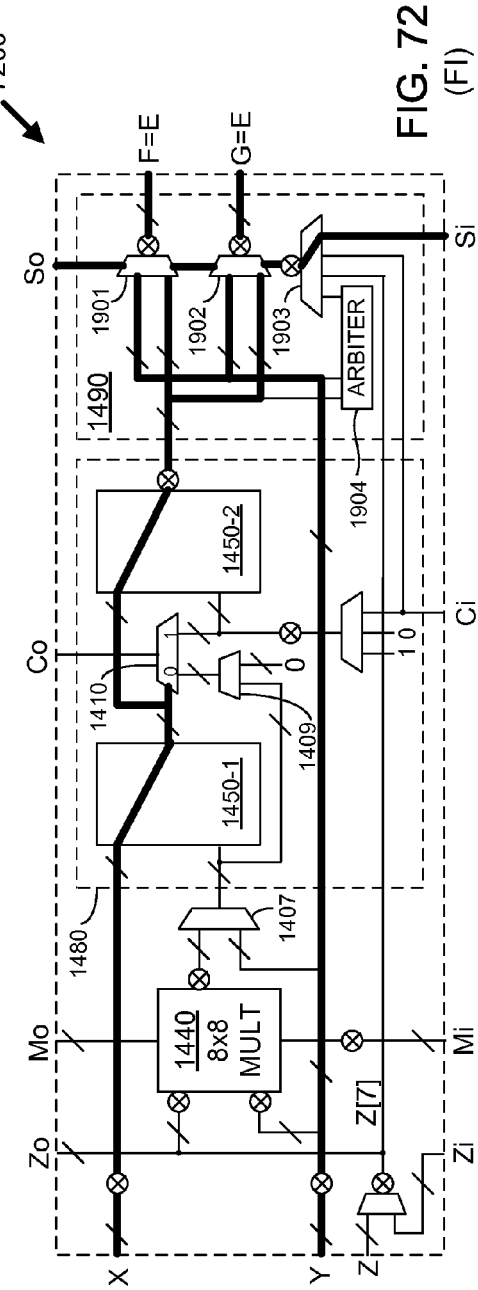
FIG. 72 illustrates how the logic block of FIGS. 14 and 19 can be used to implement a "FI" function using Merge mode.

FIG. 72 illustrates one way in which Merge mode can be used in the logic block of FIGS. 14 and 19. In FIG. 72, the logic block of FIGS. 14 and 19 is used to implement a "FI" function using Merge mode, as a "F I" function is a merge function. In the illustrated logic block 7200, one of the values on the X and Y inputs is passed to both outputs E at any given time, depending on the value of the output select signal S. In the pictured embodiment, when S is high, the X input is passed to both outputs E. When S is low, the Y input is passed to both outputs E. In some embodiments (not shown), the selected X or Y input is passed to only one of the two outputs F or G. However, the pictured embodiment is useful when the output signal drives more than one destination. Clearly, when handshake logic is present, a single output signal cannot be used to drive multiple destinations, as a separate output token is required for each destination. Note that while FIG. 72 shows the select input S coming from the Si input, in some embodiments the select input S can be supplied by Ci or Z[7]. For example, FIG. 73 includes a copy of logic block 7200 (see block 7200-2) in which the select input is supplied by the Z[7] input terminal.

Figure 73:
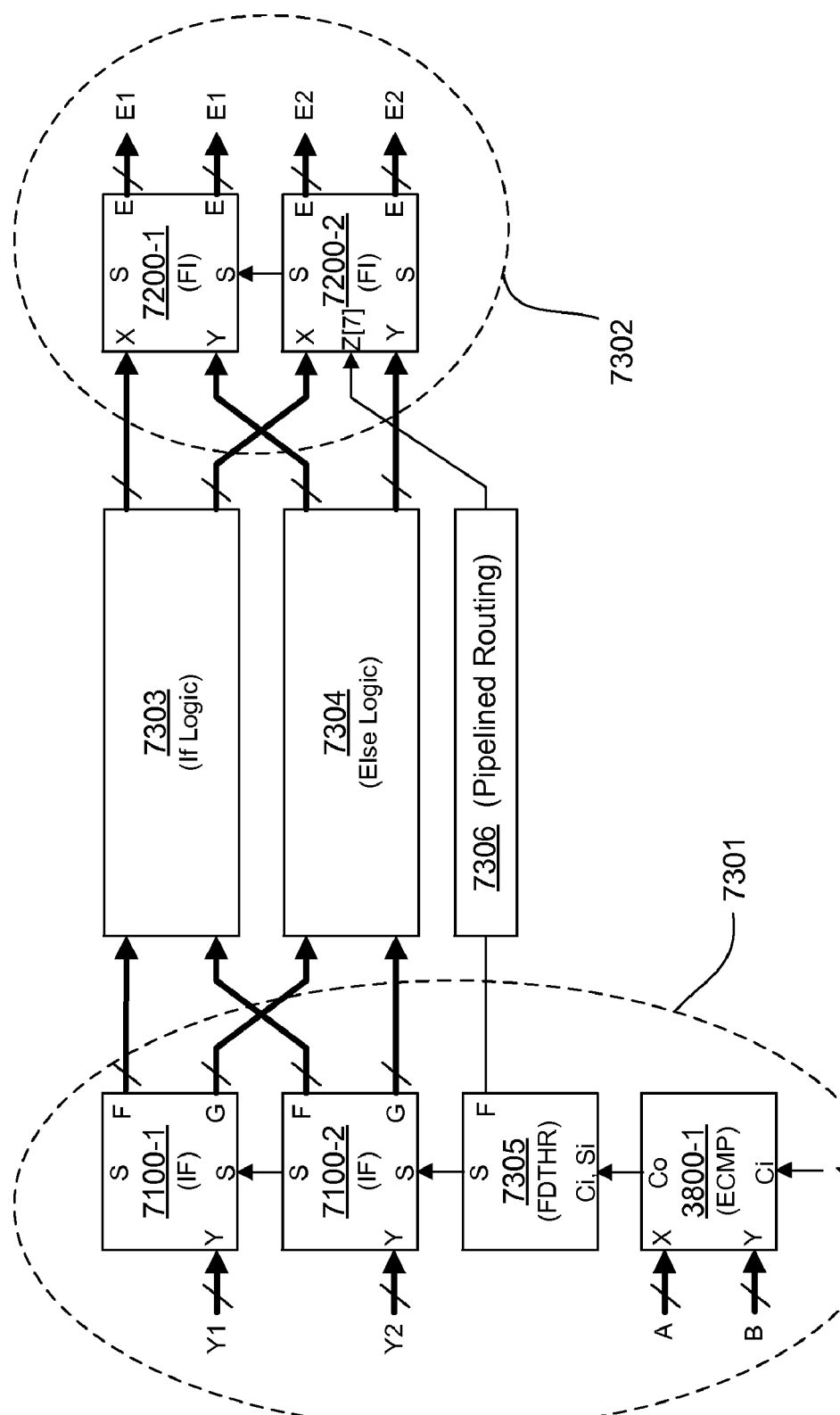
FIG. 73 provides an example of how the IF and FI functions can be used to implement an If/Else statement.

FIG. 73 provides an example of how the IF (Gate mode) and FI (Merge mode) functions of FIGS. 71-72 can be used to implement an If/Else statement. The Input portion of the logic is indicated by dashed line 7301. The output portion of the logic is indicated by dashed line 7302. Block 7303 (the "if logic") indicates functionality performed under a first logic condition; and block 7304 (the "else logic") indicates functionality performed under a second logic condition. The circuit of FIG. 73 implements the following pseudo-code:

If (A==B)
IF LOGIC
else
ELSE LOGIC;

In the exemplary embodiment, logic block 3800-1 is an instance of the equal compare function, ECMP, of FIG. 38. The two 8-bit values A and B are compared. If A and B are the same, then the carry output signal Co of logic block 3800-1 is high. If A and B are not the same, the carry out signal Co is low.

Feedthrough (FDTHR) logic block 7305 can be implemented, for example, using the ADD logic block shown in FIG. 36. (The feedthrough block 7305 should not be confused with the Feedthru mode of the logic block. However, in feedthrough block 7305, the output multiplexer circuit is actually in Feedthru mode. See FIG. 36.) The X input of the feedthrough logic block is set to a binary 127 (e.g., using constant generator circuit 1430 of FIG. 14 to provide a 01111111 value), and the Ci value is added. If Ci is high, then the most significant bit of the output is high (output F, as shown in FIG. 36). If Ci is low, then the most significant bit of the F output is low. The F output is then routed to the Z input of the FI logic block 7200-2 via pipelined routing 7306, where bit 7 is placed on the S-bus via the Z[7] input. This S value passes upward through the X-chain to all logic blocks in the output logic 7302. In addition to the logic shown in FIG. 36, the Feedthrough block also passes the Ci input to the S-bus, as shown in FIG. 73. This S value passes upward through the S-chain to all remaining logic blocks in the input logic 7301. Thus, if A==B, both the input logic and the output logic select the If Logic inputs and outputs. Otherwise, both the input logic and the output logic select the Else Logic inputs and outputs. Therefore, the circuit functions as shown in the example of computer code shown above.

Note that the exemplary logic has two inputs, Y1 and Y2, and two outputs, E1 and E2. The first output, E1, appears on both outputs of logic block 7200-1. The second output, E2, appears on both outputs of logic block 7200-2. Clearly, other If/Else logic circuits can have different numbers of inputs and/or outputs.

FIG. 73 provides a specific example of a circuit for implementing a conditional statement in a self-timed logic circuit, based in this example on the result of a compare function. In other embodiments, a control signal other than the result of a compare function can be used. The circuit of FIG. 73 can be described as including first and second logic circuits (e.g., If and Else logic circuits 7303 and 7304), an input circuit 7301, an output circuit 7302, and a pipelined routing path 7306. The inputs and outputs of the first and second logic circuits 7303, 7304 are self-timed. Input circuit 7301 is coupled to provide a self-timed input signal (F, G of logic block 7100-1 or 7100-2) to the self-timed input of a selected one of the first or second logic circuits based on the value of a control signal (Co from logic block 3800-1 or the S output from logic block 7305), and further coupled to output a self-timed select signal (the F output of logic block 7305). Output circuit 7302 is coupled to receive the self-timed output from the first logic circuit and the self-timed output from the second logic circuit (at the X and Y inputs of logic block 7200-1 or 7200-2), and to output a selected one of the self-timed outputs based on a value of the self-timed select signal (the Z[7] input of logic block 7200-2). Pipelined routing path 7306 routes the self-timed select signal (the F output of logic block 7305) from the input circuit to the output circuit.

Looked at another way, input circuit 7301 provides a token with one of the first or second outputs based on the value of the control signal, and output circuit 7302 provides an output token with one of the first or second outputs based on a value of the self-timed enable signal routed from the input circuit through the pipelined routing path.

In the pictured embodiment, the first and second logic circuits, the input circuit, and the output circuit are all implemented using the programmable logic block of FIGS. 14 and 19, e.g., in an array of the logic blocks included in an integrated circuit such as a programmable integrated circuit (PLD). The pipelined routing path is implemented in an interconnect structure interconnecting the logic blocks.

In a synchronous circuit, the number of pipeline stages in the pipelined routing path would be the same as the number of pipeline stages in each of the first and second logic circuits. In the pictured embodiment, this restriction does not apply. In order to achieve maximum operating frequency, the number of pipeline stages in the routing path is preferably greater than the larger of the delays through the first and second logic circuits, divided by the cycle time of the slowest element on the corresponding logic path. However, this is not necessary for the circuit to function correctly.

Figure 74:
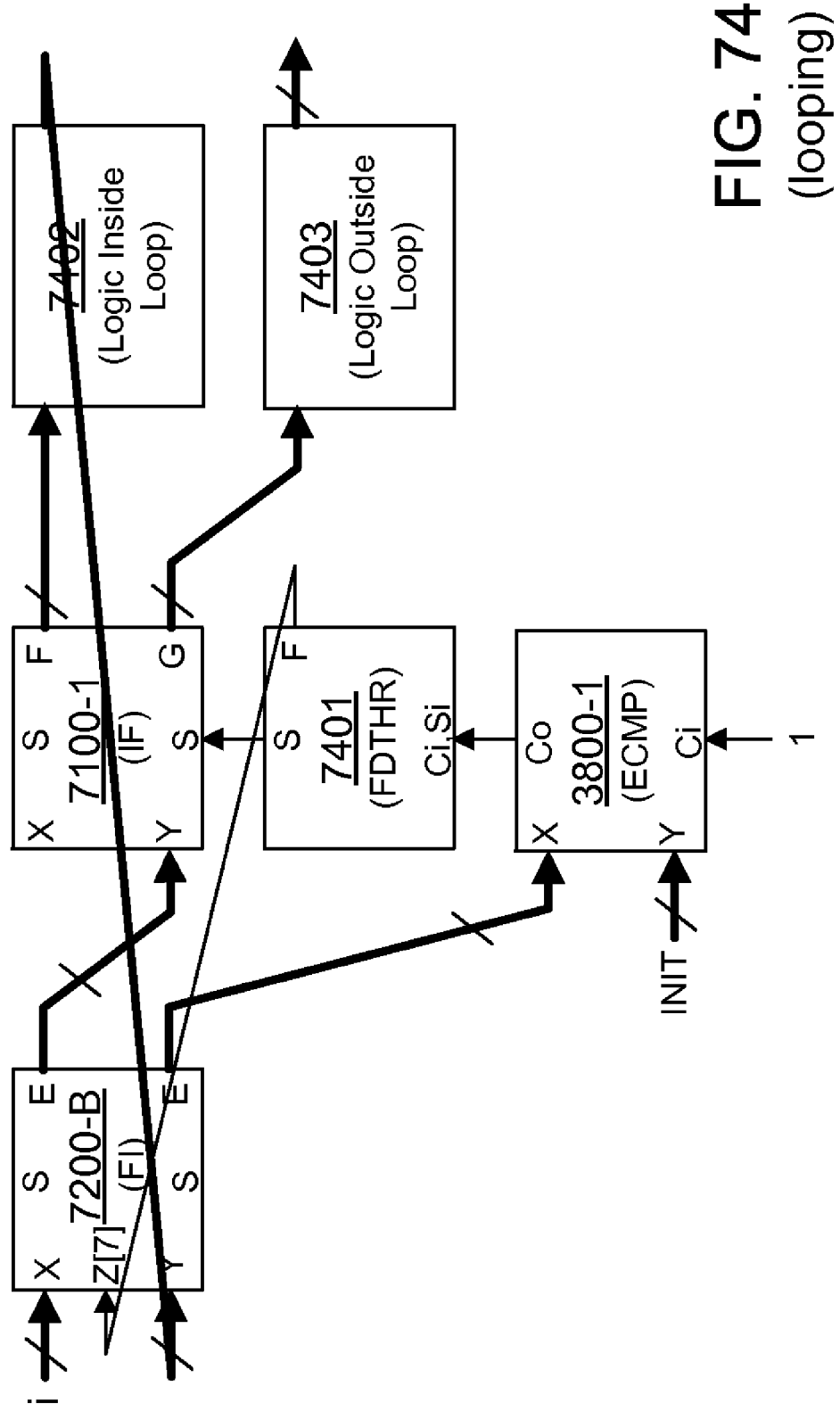
FIG. 74 provides an example of how the IF and FI functions can be used to implement a looping function.

FIG. 74 provides an example implementation of another common type of computer code: looping. The illustrated implementation uses the IF (Gate mode) and FI (Merge mode) functions to implement the looping function. The implemented code is as follows:

i=INIT;
do{
LOGIC INSIDE LOOP
} while (i==INIT);
LOGIC OUTSIDE LOOP;

Clearly, the logic inside the loop must be able to modify the value of the loop variable "i", or the loop will be an endless loop.

The FI block 7200-B is configured to select the X input as the initial input, and the Y input as the input when the select input S is high. However, the IF block 7100-1 is configured to provide an output token to the F output when the select input S is high, and to the G output when the select input S is low. The select inputs S are provided by feedthrough block 7401, as in the embodiments of FIGS. 72 and 73, based on results of the comparison performed by equal compare block 3800-1.

During initialization of the circuit, the initial value of the loop variable "i", which drives the X input of the FI block 7200-B, is INIT, as shown in the above code. The value of the select input to both FI and IF blocks is high. The loop through the 7100-1 and 7402 blocks provides a potentially new value of the loop variable back to the Y input of the FI block. After the initialization, the FI block selects the output of the loop (the Y input) to pass back to the loop, while the IF block continues to pass output tokens through the F output to the logic 7402 inside the loop. Note that an initial token must be present on the select input of the output multiplexer in the FI block 7200-B for the loop to begin operation, because the comparator block 3800-1 cannot generate a token until it receives a first value from the FI block. After the first iteration of the loop, there is always a token present on the FI select input. Therefore, the circuit continues to function properly through the subsequent iterations.

At some point, the value of "I" is changed by logic 7402 so it is no longer equal to the initial value INIT. This change is detected by the equal compare block 3800-1, which drives the carry output Co low. The select inputs S of both the FI block and the IF block go low. The FI block ceases to select the Y input and selects the X input again, reinitializing the loop. The IF block stops providing output tokens to the logic 7402 inside the loop through the F output, and instead provides output tokens to the logic 7403 outside the loop, through the G output, until the circuit is reinitialized.

FIG. 75 illustrates another way in which Gate mode can be used in the logic block of FIGS. 14 and 19. In FIG. 75, the logic block 7500 of FIGS. 14 and 19 is used to implement a TOGGLE function using Gate mode. The toggle function can be used to feed data alternately to two copies of a given portion of the logic. This functionality can be useful, for example, when the given portion of the logic is a bottleneck slowing down the throughput of the overall circuit.

The arbiter plays a role in this logical implementation. The toggle function feeds data from the Y input alternately to the two outputs F and G. The two output multiplexers 1901 and 1902 are configured with opposite polarities; that is, one is enabled by a high value of S, and the other is enabled by a low value of S. Thus, only one of the two output multiplexers is enabled at any given time. Further, because the logic block is in Gate mode, an output token is only provided by the enable output multiplexer when an input token arrives at the Y input. The arbiter 1904 arbitrates between the Y input and a constant token source on the X input (i.e., the X input repeatedly provides input tokens with the same data value). The arbiter passes the continuously provided data value until an input token arrives on the Y input. The Y value is then passed to the selected output, and the arbiter output changes the value of S to the opposite value, selecting the other output. Thus, the incoming values of Y are passed alternately to the F and G outputs.

FIG. 76 provides an example of how the TOGGLE function (Gate mode) can be used to replicate logic. A bottleneck portion of logic is replicated (first and second logic copies 7601 and 7602). The replicated logic in this example has two inputs, Y1 and Y2. Toggle block 7500-1 responds to an input token on Y2 by alternately providing the Y2 input signal to the first and second copies of the logic. IF block 7100-1 provides the Y1 input to the same copy of the logic, under control of the S signal from the toggle block 7500-1. The feedthrough block 7603 can be implemented in the same fashion as feedthrough logic block 7305, for example, passing the S value from IF block 7100-1 to the most significant bit of the F output, and hence to the Z[7] input of the FI logic block 7200-2. FI logic blocks 7200-1 and 7200-2 both select the output of the first or second copies of the logic, and provide the outputs on circuit outputs E1 or E2, respectively.

FIG. 76 provides a specific example of a circuit for implementing logic replication in a self-timed logic circuit. A designer may want to replicate logic in order to increase the performance of a circuit, for example, by using multiple copies of the replicated logic to simultaneously process data. The circuit of FIG. 76 can be described as including first and second copies (7601 and 7602) of the replicated logic circuit, an input circuit (logic blocks 7500-1, 7100-1, and 7603), an output circuit (logic blocks 7200-1 and 7200-2), and a pipelined routing path (7604). The inputs and outputs of the first and second copies 7601, 7602 are self-timed. The input circuit provides a self-timed input signal alternately to the self-timed inputs of the first and second copies (X, Y of logic block 7100-1 or 7500-1). The output circuit receives the self-timed output from the first copy and the self-timed output from the second copy (at the X and Y inputs of logic block 7200-1 or 7200-2), and outputs a selected one of the self-timed outputs (E1, E2) based on a value of a self-timed select signal (the Z[7] input of logic block 7200-2). Pipelined routing path 7604 routes the self-timed select signal from the input circuit (the F output of logic block 7603) to the output circuit (the Z[7] input of logic block 7200-2).

Looked at another way, the input circuit (logic blocks 7500-1, 7100-1, and 7603) provides a token alternately with the first and second outputs (F, G of logic block 7100-1 or 7500-1) of the input circuit, and the output circuit (logic blocks 7200-1 and 7200-2) provides an output token with one of the first or second outputs (E1, E2) of the output circuit based on a value of the self-timed select signal received at the select input (the Z[7] input of logic block 7200-2) of the output circuit.

In the pictured embodiment, the first and second copies of the replicated logic circuit, the input circuit, and the output circuit are all implemented using the programmable logic block of FIGS. 14 and 19, e.g., in an array of the logic blocks included in an integrated circuit such as a programmable integrated circuit (PLD). The pipelined routing path is implemented in an interconnect structure interconnecting the logic blocks.

In a synchronous circuit, the number of pipeline stages in the pipelined routing path would be the same as the number of pipeline stages in each of the first and second copies of the replicated logic circuit. In the pictured embodiment, this restriction does not apply. In order to achieve maximum operating frequency, the number of pipeline stages in the routing path is preferably greater than the delay of the replicated path divided by the cycle time of the slowest element on the replicated path. However, this is not necessary for the circuit to function correctly.

FIG. 77 illustrates another way in which Merge mode can be used in the logic block of FIGS. 14 and 19. In FIG. 77, the logic block of FIGS. 14 and 19 is used to implement an ARBIT (arbitration) function using Merge mode. The arbitration function can be used to share common logic between two or more data paths. For example, this functionality can be useful when a function call is too expensive (e.g., too large) to expand inline. The ARBIT function is the same as the FI function (see FIG. 72), except that the output multiplexers 1901 and 1902 are controlled by the arbiter. The output multiplexers are both in Merge mode.

FIG. 78 provides an example of how the ARBIT function (Merge mode) can be used to share logic between two data paths.

The arbiter also plays a role in this logical implementation, in which the shared logic 7801 has two inputs In1 and In2, and two outputs Out1 and Out2. The ARBIT logic block 7700-1 controls the inputs of the shared logic 7801 such that the inputs come from either a first data path or a second data path. Similarly, the ARBIT logic block 7700-1 controls the outputs of the shared logic 7801 such that the outputs are provided to either the first data path or the second data path.

The FI block 7200-1 and the ARBIT block 7700-1 both feed input data from the selected data path to the shared logic 7801. The Merge mode of the ARBIT block permits whichever of the data paths has an available input to use the logic first. The select signal from the arbiter is passed through FI block 7200-1 to feedthrough block 7603, and hence to IF blocks 7100-2 and 7200-1, via the Z[7] input of block 7100-2.

Potentially, a deadlock could occur in this embodiment if one data stream fills the shared logic pipeline, preventing the other data stream from passing tokens through the shared logic. Such a deadlock can be avoided, for example, by including a built-in relationship between the data streams that prevents one stream from overfilling the pipe. Another method of avoiding such a deadlock is to keep a count of the number of tokens in the pipeline, and to control the number of tokens so as not to exceed the amount of storage available after the shared logic.

FIG. 78 provides a specific example of a circuit for implementing shared logic in a self-timed logic circuit. A designer may want to share logic in order to reduce the size of a circuit, for example, to reduce the number of logic blocks required to implement a design by using the same logic blocks in two different logic paths through the design. The circuit of FIG. 78 can be described as including a shared logic circuit 7801, an input circuit (logic blocks 7700-1, 7200-1, and 7603), an output circuit (logic blocks 7100-1 and 7100-2), and a pipelined routing path (7802). The inputs and outputs of the shared logic circuit are self-timed. The input circuit outputs a selected one of the first or second self-timed inputs (E of logic block 7200-1 or A of logic block 7700-1) to the shared logic circuit 7801, the selected one of the first or second inputs being determined by an arbitration circuit (arbiter 1904 of FIG. 77) within the input circuit (in logic block 7700-1), and further outputs a self-timed select signal (the F output of logic block 7603). The output circuit receives the first and second self-timed outputs from the shared logic circuit (the Y input of logic block 7100-1 and the Y input of logic block 7100-2) and provides a selected one of the first or second outputs (Out1-F and Out1-G, or Out2-F and Out2-G), the selected one of the first or second outputs being determined by the self-timed select signal (received at input Z[7] of logic block 7100-2). Pipelined routing path 7802 routes the self-timed select signal from the input circuit (the F output of logic block 7603) to the output circuit (the Z[7] input of logic block 7100-2).

Looked at another way, the input circuit (logic blocks 7700-1, 7200-1, and 7603) provides a token with one of the first or second outputs (the E output of logic block 7200-1 or the A output of logic block 7700-1) based on a value (the S output of logic block 7700-1) output by an arbitration circuit (1904 of FIG. 77, in logic block 7700-1) within the input circuit.

In the pictured embodiment, the shared logic circuit, the input circuit, and the output circuit are all implemented using the programmable logic block of FIGS. 14 and 19, e.g., in an array of the logic blocks included in an integrated circuit such as a programmable integrated circuit (PLD). The pipelined routing path is implemented in an interconnect structure interconnecting the logic blocks.

In a synchronous circuit, the number of pipeline stages in the pipelined routing path would be the same as the number of pipeline stages in the shared logic circuit. In the pictured embodiment, this restriction does not apply. In order to achieve maximum operating frequency, the number of pipeline stages in the routing path is preferably greater than the delay of the shared path divided by the cycle time of the slowest element on the shared path. However, this is not necessary for the circuit to function correctly.

FIG. 78 illustrates an exemplary circuit in which logic is shared between two different data paths. However, it will be clear to those of skill in the art that this technique can also be applied in a hierarchical fashion to circuits in which logic is shared between more than two data paths.

FIG. 79 illustrates one way in which Feedback mode can be used in the logic block of FIGS. 14 and 19. In FIG. 79, logic block 7900 implements a COUNTER function using Feedback mode. As noted above, Feedback mode is used when the F or G output of a logic block is fed back to the lookup table, and the lookup table output LO feeds the F or G datapath in the output multiplexer circuit, as in the embodiment of FIG. 79. In the pictured embodiment, the F output is fed back to the X input via an interconnect structure external to the logic block. In other embodiments, the F or G output is fed back to the X input via a dedicated feedback path included in the logic block.

The counter of FIG. 79 has an initial value INIT_VAL and an increment value INCR_VAL. The initial value is loaded into the counter by providing an input token with a data high value on the select input Si. The value in the counter is incremented by increment value INCR_VAL whenever an input token with a low data value is placed on the select input Si. The G output provides the sum. The lookup tables 1450-1 and 1450-2 implement the add function (see FIG. 36).

FIG. 80 illustrates another way in which Feedback mode can be used in the logic block of FIGS. 14 and 19. In FIG. 80, logic block 8000 implements a MEMORY function using Feedback mode. In the pictured embodiment, the F output of the logic block is fed back to the X input via an interconnect structure external to the logic block. In other embodiments, the F or G output is fed back to the X input via a dedicated feedback path included in the logic block.

The memory of FIG. 80 can be written with a write value WR_VAL, and the read value RD_VAL appears on the G output. The write value is loaded into the memory by providing an input token with a data high value on the select input Si. The read value can be read from the memory output by providing an input token with a data low value on the select input Si.

Figure 81:
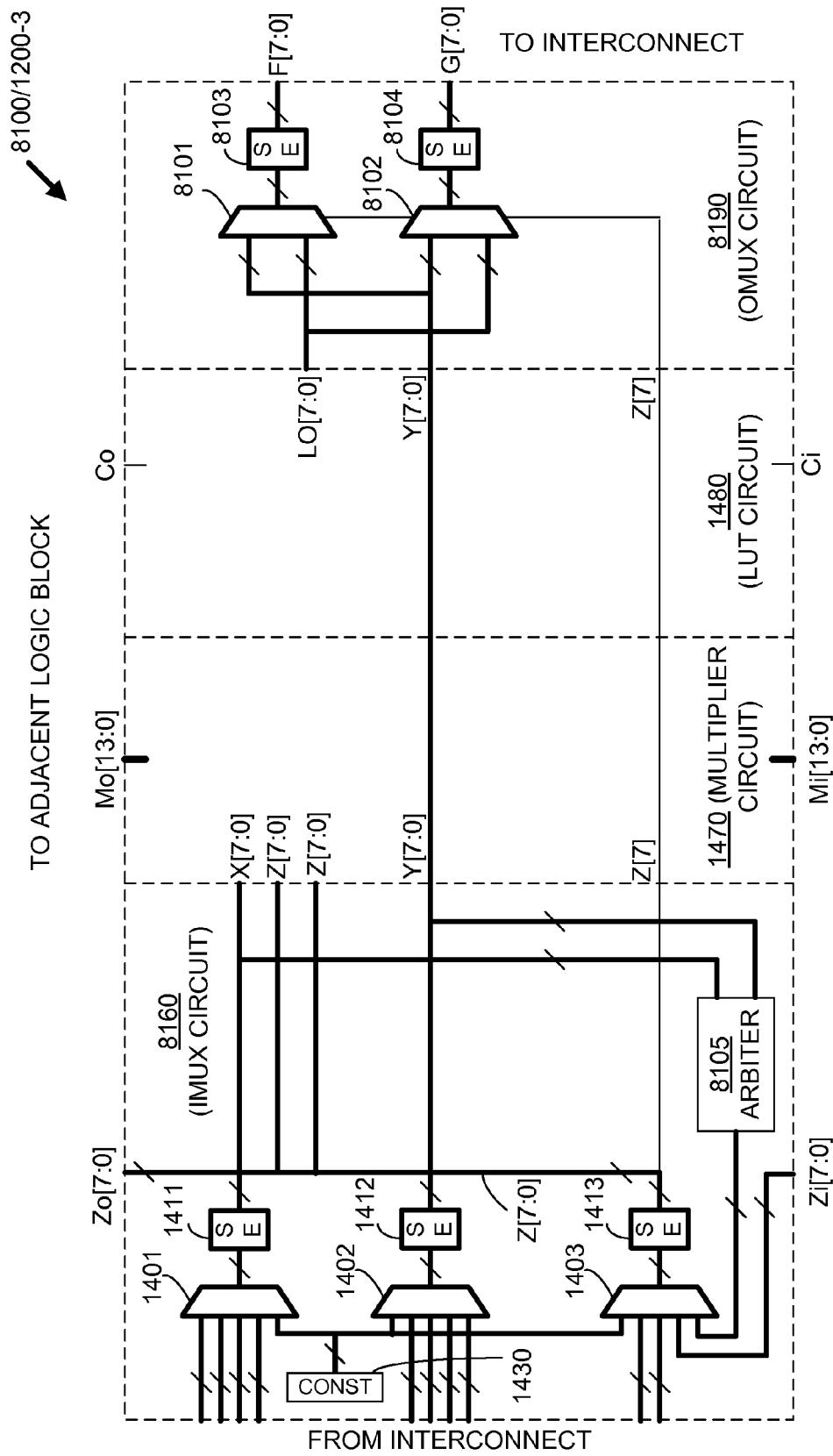
FIG. 81 illustrates an alternative bus-based logic block that can be used to build an IC having highly flexible multiplier capability in a fashion similar to the examples shown above.

FIG. 81 illustrates an alternative bus-based logic block 8100/1200-3 that can be used to build an IC having highly flexible multiplier capability in a fashion similar to the examples shown above. The logic block of FIG. 81, for example, can be an alternative embodiment of the logic block of FIG. 14, and can be used, for example, in the integrated circuits of FIGS. 12 and/or 15. Logic block 8100 is similar to logic blocks 1400 and 1900 of FIGS. 14 and 19, except that input multiplexer circuit 8160 differs from input multiplexer circuit 1460, and output multiplexer circuit 8190 differs from output multiplexer circuit 1490. In the embodiment of FIG. 81, output multiplexers 8101 and 8102 (which drive storage elements 8103 and 8104, respectively, to produce the F and G outputs) are not driven by an S-chain. Instead, the S-chain is omitted, and the functions previously included in the S-chain are included in the Z-bus. Output multiplexers 8101 and 8102 are controlled by the Z[7] bit of the Z-bus, which can now include the output of arbiter 8105.

Another alteration that can optionally be made to the output multiplexer circuit (not shown in FIG. 81) is to provide the arbiter the ready signal from the X input X_RDY_IN instead of the ready signal from the lookup table output LO_RDY_IN.

It will be apparent to one skilled in the art after studying the present specification and diagrams that the present invention can be practiced within these and other architectural variations.

Those having skill in the relevant arts of the invention will now perceive various modifications and additions that can be made as a result of the disclosure herein. For example, the above text describes the circuits and methods of the invention in the context of programmable ICs such as PLDs. However, the circuits and methods of the invention can also be implemented in other integrated circuits, including, in some cases, non-programmable circuits. Further, operating modes other than the five exemplary modes illustrated herein can be included in addition to, or instead of, one or more of the five exemplary operating modes. Yet further, some embodiments may include only one, two, three, or four of the illustrated modes in the logic block.

Further, multiplier circuits, multiply blocks, lookup tables, full adders, half adders, logical AND gates, exclusive-NOR gates, storage elements, flip-flops, latches, memory cells, multiplexers, C-elements, arbiters, constant generator circuits, one-hot circuits, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance, the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents. Note that claims listing steps do not imply any order of the steps. Trademarks are the property of their respective owners.

What is claimed is:

1. An integrated circuit, comprising:
   an array of interconnected logic blocks, each of the logic blocks comprising:
   a logic circuit having at least one input coupled to a an input of the logic block and further having first and second outputs;
   a first output multiplexer having first and second data inputs respectively coupled to the first and second outputs of the logic circuit, a select input, and an output coupled to a first output of the logic block; and a select multiplexer having a first data input coupled to a cascade select input of the logic block, a second data input, and an output coupled to the select input of the first output multiplexer, the output of the select multiplexer being further coupled to a cascade select output of the logic block, wherein the cascade select input of the logic block is coupled to the cascade select output of an adjacent logic block in the array.

2. The integrated circuit of claim 1, wherein each logic block further comprises an arbiter having inputs coupled to receive ready signals provided with the first and second outputs of the logic circuit, the arbiter further having an output coupled to the second data input of the select multiplexer.

3. The integrated circuit of claim 1, wherein each logic block further comprises a memory element coupled between the output of the select multiplexer and the select input of the first output multiplexer, and further coupled between the output of the select multiplexer and the cascade select output of the logic block.

4. The integrated circuit of claim 3, wherein in each logic block the memory element comprises a latch.

5. The integrated circuit of claim 1, wherein each logic block further comprises a second output multiplexer having first and second data inputs respectively coupled to the first and second outputs of the logic circuit, a select input coupled to the output of the select multiplexer, and an output coupled to a second output of the logic block.

6. The integrated circuit of claim 1, wherein the logic blocks in the array are substantially similar one to another.

7. The integrated circuit of claim 1, wherein the integrated circuit comprises a programmable integrated circuit.

8. The integrated circuit of claim 7, wherein the programmable integrated circuit comprises a programmable logic device (PLD).

9. The integrated circuit of claim 6, wherein in each logic block the select multiplexer is programmable to select the cascade select input of the logic block as the output of the select multiplexer, wherein a cascade chain is formed such that a select signal applied to the first output multiplexer in a first of the logic blocks is cascaded through a column of the first output multiplexers in a subsequent plurality of the logic blocks.

10. An integrated circuit, comprising:
an interconnect structure;
a plurality of substantially similar logic circuits arrayed to form a column of the logic circuits, each of the logic circuits having at least one input coupled to the interconnect structure and further having first and second outputs; and
a vertical cascade chain having a plurality of first inputs coupled to the first outputs of the logic circuits, a plurality of second inputs coupled to the second outputs of the logic circuits, and a plurality of outputs coupled to the interconnect structure.

11. The integrated circuit of claim 10, wherein the cascade chain comprises:
a plurality of select multiplexers, each of the select multiplexers having first and second inputs, and further having an output coupled to an input of a subsequent select multiplexer in the vertical cascade chain; and a plurality of first output multiplexers, each of the first output multiplexers having a first input coupled to one of the first inputs of the vertical cascade chain, a second input coupled to one of the second inputs of the vertical cascade chain, a select input coupled to the output of an associated one of the select multiplexers, and an output coupled to one of the outputs of the vertical cascade chain.

12. The integrated circuit of claim 11, wherein each of the select multiplexers is programmable to select one of an output from a preceding first select multiplexer or another input to place onto the cascade chain.

13. The integrated circuit of claim 11, wherein the cascade chain further comprises:
a plurality of second output multiplexers, each of the second output multiplexers having a first input coupled to one of the first inputs of the vertical cascade chain, a second input coupled to one of the second inputs of the vertical cascade chain, a select input coupled to the output of a corresponding one of the select multiplexers, and an output coupled to one of the outputs of the vertical cascade chain.

14. The integrated circuit of claim 10, wherein the integrated circuit comprises a programmable integrated circuit.

15. The integrated circuit of claim 14, wherein the programmable integrated circuit comprises a programmable logic device (PLD).

16. A method of placing data from a plurality of logic circuits onto an interconnect structure in a programmable integrated circuit, the method comprising:
programming each of the logic circuits to apply the data from the logic circuit to a corresponding data input of a corresponding first output multiplexer;
programmably coupling an initial select line to a data input of a first select multiplexer in a cascade chain of select multiplexers, each of the select multiplexers driving a select input of an associated first output multiplexer having an output coupled to the interconnect structure;
programming the first select multiplexer to pass a value on the initial select line to an output of the first select multiplexer; and
programming subsequent select multiplexers in the cascade chain to pass values received from preceding select multiplexers in the cascade chain to the outputs of the subsequent select multiplexers.

17. The method of claim 16, wherein each of the select multiplexers in the cascade chain further drives a select input of an associated second output multiplexer having an output coupled to the interconnect structure.

18. The method of claim 16, further comprising:
programming each of the first output multiplexers to select a polarity for each of the first output multiplexers.

19. The method of claim 18, wherein programming each of the first output multiplexers comprises storing configuration data into configuration memory cells coupled to the first output multiplexers.

20. The method of claim 16, wherein the programmable IC comprises a programmable logic device (PLD).

* * * * *